United States Patent
Mizohata et al.

(10) Patent No.: US 7,279,079 B2
(45) Date of Patent: Oct. 9, 2007

(54) PLATING APPARATUS, CARTRIDGE AND COPPER DISSOLUTION TANK FOR USE IN THE PLATING APPARATUS, AND PLATING METHOD

(75) Inventors: Yasuhiro Mizohata, Kyoto (JP); Hideaki Matsubara, Kyoto (JP); Yoshihiro Koyama, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 298 days.

(21) Appl. No.: 10/620,728

(22) Filed: Jul. 16, 2003

(65) Prior Publication Data

US 2004/0069647 A1 Apr. 15, 2004

(30) Foreign Application Priority Data

Jul. 17, 2002 (JP) .............................. 2002-208774
Dec. 25, 2002 (JP) .............................. 2002-374790

(51) Int. Cl.
*C25D 17/00* (2006.01)
*C25D 21/18* (2006.01)

(52) U.S. Cl. ....................................... 204/234; 204/237
(58) Field of Classification Search ..................... None
See application file for complete search history.

(56) References Cited

U.S. PATENT DOCUMENTS

| | | | | |
|---|---|---|---|---|
| 4,324,623 A | * | 4/1982 | Schaer | 205/101 |
| 4,796,782 A | * | 1/1989 | Wales et al. | 222/57 |
| 5,100,517 A | * | 3/1992 | Starinshak et al. | 205/138 |
| 5,336,406 A | * | 8/1994 | Stanford et al. | 210/235 |
| 5,352,350 A | * | 10/1994 | Andricacos et al. | 205/101 |
| 5,976,341 A | | 11/1999 | Schumacher et al. | 205/101 |
| 5,997,712 A | * | 12/1999 | Ting et al. | 205/101 |
| 6,258,220 B1 | | 7/2001 | Dordi et al. | 204/198 |
| 6,527,934 B1 | * | 3/2003 | Steward | 205/101 |
| 6,958,113 B2 | * | 10/2005 | Mizohata et al. | 204/224 R |

FOREIGN PATENT DOCUMENTS

| | | |
|---|---|---|
| JP | 4-74898 | 3/1992 |
| JP | 5-214598 | 8/1993 |
| JP | 2000-160400 | 6/2000 |
| JP | 2001-520315 | 10/2001 |
| JP | 2002-45802 | 2/2002 |
| JP | 2002-206199 | 9/2002 |

\* cited by examiner

*Primary Examiner*—Harry D Wilkins, III
(74) *Attorney, Agent, or Firm*—Ostrolenk, Faber, Gerb & Soffen, LLP

(57) ABSTRACT

A plating apparatus provided with: three copper dissolution tanks connected to a plating liquid circulation path for supplying copper ions to a plating liquid; a buffer container for supplying a replacement liquid into some of the copper dissolution tanks not in use; and an undiluted replacement liquid supplying section for supplying an undiluted replacement liquid as a source of the replacement liquid into the buffer container. Copper mesh members each prepared by weaving a copper wire, straight copper pipes or copper plates are accommodated as a copper source in each of the copper dissolution tanks. The copper dissolution tanks each include a detachable cartridge, in which the copper mesh members or the like are disposed.

9 Claims, 19 Drawing Sheets

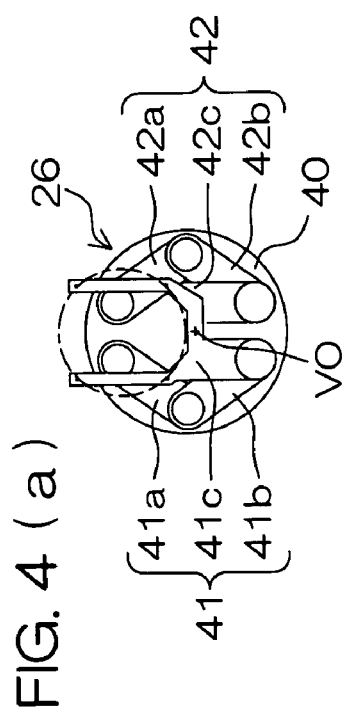
FIG. 4 ( a )
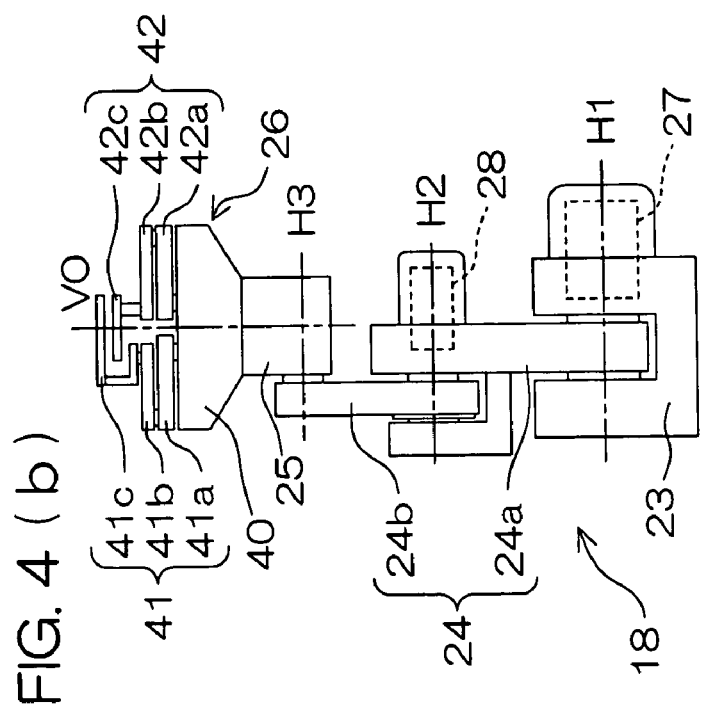
FIG. 4 ( b )
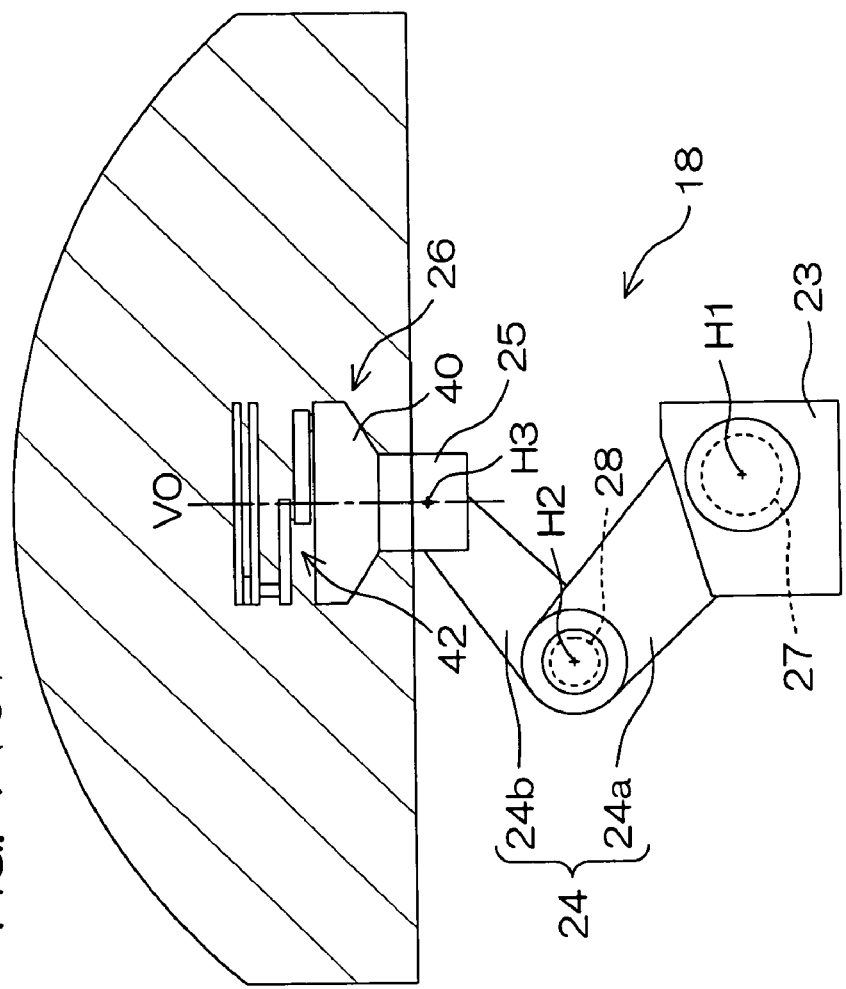
FIG. 4 ( c )

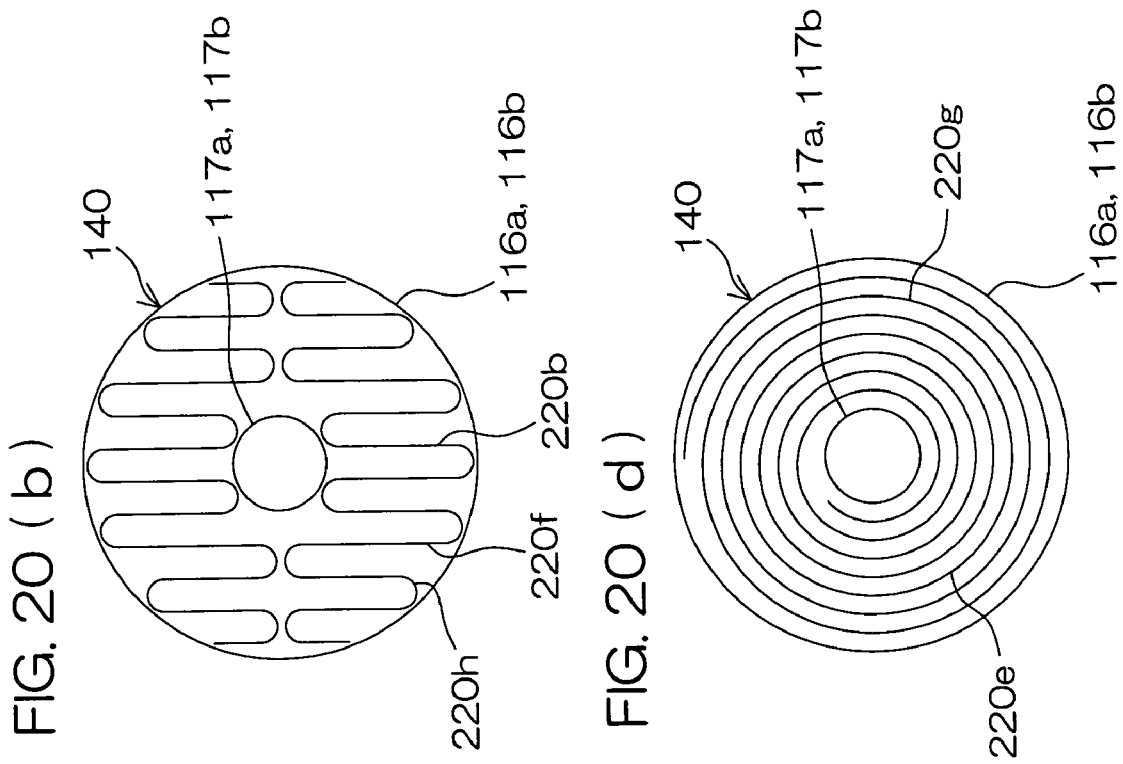
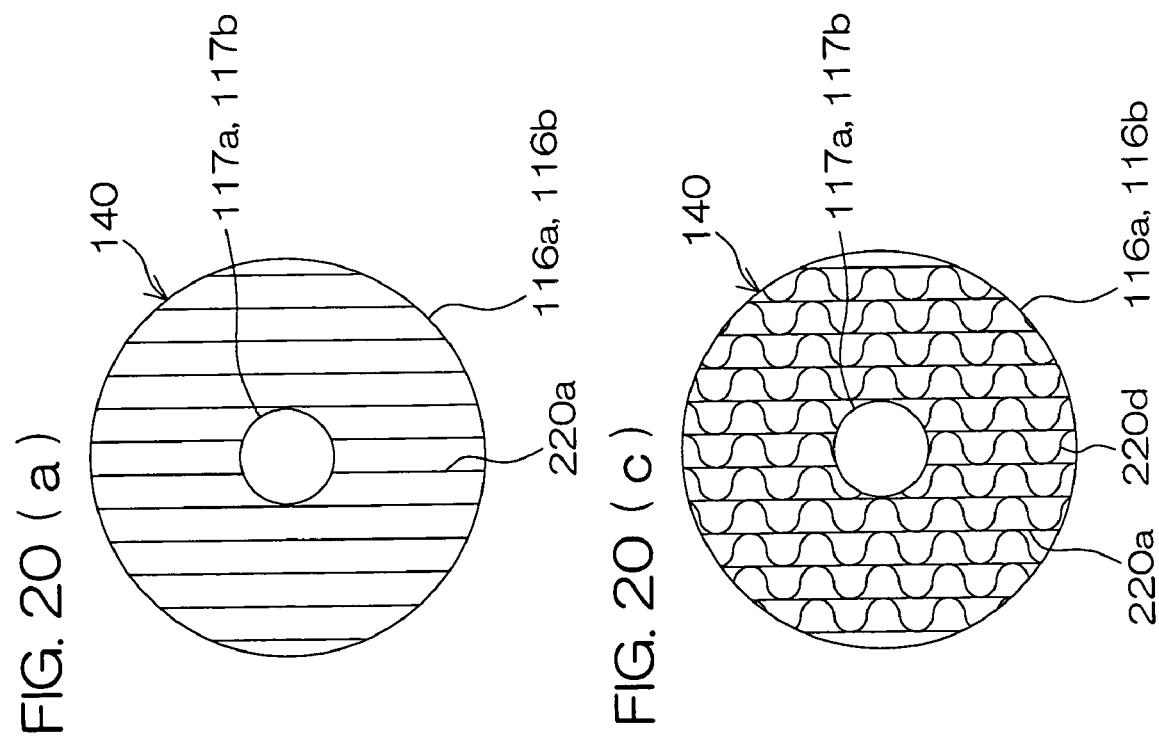

PLATING APPARATUS, CARTRIDGE AND COPPER DISSOLUTION TANK FOR USE IN THE PLATING APPARATUS, AND PLATING METHOD

BACKGROUND OF THE INVENTION

1. Field of the Invention

The present invention relates to a plating apparatus for plating a substrate such as a semiconductor wafer with copper, a copper dissolution tank and a cartridge for use in the plating apparatus, and a plating method.

2. Description of Related Art

In the production of a semiconductor device, a plating process is often performed for plating one surface of a semiconductor wafer (hereinafter referred to simply as "wafer"). A typical plating apparatus for plating a wafer with copper includes a plating vessel which contains a copper-ion-containing plating liquid to be brought into contact with one surface of the wafer, a dissolvable copper anode disposed in the plating vessel, and a cathode to be brought into contact with the wafer. Such a plating apparatus is disclosed in U.S. Pat. No. 6,258,220B1.

For the plating, the cathode is kept in contact with the wafer, and one surface (lower surface) of the wafer is kept in contact with the plating liquid filled in the plating vessel. In this state, the anode and the cathode are electrically energized. Thus, electrons are donated to copper ions in the plating liquid in an interface between the plating liquid and the wafer, so that copper atoms are deposited on the surface of the wafer. On the other hand, copper atoms of the anode are deprived of electrons to leach in the form of copper ions into the plating liquid in an interface between the anode and the plating liquid. The anode functions as a copper supply source for supplying copper ions to the plating liquid.

Thus, copper ions are consumed in the plating liquid to be deposited in the form of copper atoms on the wafer, while being supplied in the corresponding amount from the anode. Therefore, the amount of copper ions in the plating liquid is kept virtually constant.

However, the anode of the plating apparatus is consumed during the repetitive plating process, requiring replacement. The plating vessel has a small size, which is determined according to the size (diameter) of the wafer to be treated. Further, the anode has a relatively great weight. Therefore, the replacement of the anode disposed at a great depth in the plating vessel is laborious.

The plating apparatus is generally disposed in a clean room. Therefore, the clean room is likely to be contaminated with copper due to the scattering of the plating liquid when the anode is replaced. Unintended contamination with copper in other process steps results in deterioration of the characteristics of the device (product). Particularly, a plating liquid containing copper sulfate is liable to cause contamination when it is dried to form powder dust.

When the anode is replaced, the inside of the plating apparatus is exposed to the atmosphere in the clean room. Therefore, the inside of the plating apparatus is also contaminated. Particularly, where the cleanliness of the inside of the cleaning apparatus is set higher than the cleanliness of the clean room, the quality of the product is remarkably deteriorated by the contamination of the inside of the plating apparatus.

The plating process is stably performed only with the surface of the copper anode being covered with a so-called black film. However, the formation of the black film requires preliminary electrical energization after the replacement of the anode. This prolongs the downtime of the apparatus, thereby reducing the capacity utilization rate of the apparatus.

Further, the state of the black film is stabilized only when the anode is electrically energized in the same cycle. However, the plating apparatus is rarely operated in a constant cycle, but is sometimes out of operation. The black film is deteriorated when the plating apparatus is out of operation. Therefore, when the operation of the plating apparatus is thereafter resumed, the plating process cannot properly be performed, reducing a product yield.

Further, slime is often generated from the black film on the surface of the anode. The black film and the slime are liable to be separated from the anode to contaminate the plating liquid. This may adversely affect the plating process. A conceivable approach to the prevention of the adverse effect is to cover the anode with a filter. However, it is difficult to completely cover the anode with the filter, because the anode has a connector for connection to a power source. Where the anode is covered with the filter, the replacement of the anode is more difficult.

SUMMARY OF THE INVENTION

It is an object of the present invention to provide a plating apparatus which features easier replacement of a copper supply source.

It is another object of the present invention to provide a plating apparatus which ensures that a copper supply source is replaced without contamination of the surroundings.

It is further another object of the present invention to provide a plating apparatus which ensures proper plating.

It is still another object of the present invention to provide a plating apparatus which features a higher capacity utilization rate.

It is further another object of the present invention to provide a cartridge which features easier replacement of a copper supply source for use in a plating apparatus.

It is still another object of the present invention to provide a cartridge which ensures that a copper supply source is replaced for use in a plating apparatus without contamination of the surroundings.

It is further another object of the present invention to provide a copper dissolution tank which ensures proper plating in a plating apparatus.

It is still another object of the present invention to provide a copper dissolution tank which ensures that a plating apparatus is operated at an increased capacity utilization rate for plating.

It is further another object of the present invention to provide a plating method which ensures proper plating.

It is still another object of the present invention to provide a plating method which ensures that a plating apparatus is operated at an increased capacity utilization rate.

A plating apparatus (10) according to a first aspect of the present invention comprises: a plating section (12) for performing a plating process with the use of a plating liquid for plating a substrate (W) with copper, the plating section having an insoluble anode (76); a copper dissolution tank (110a to 110c) connected to the plating section for communication of the plating liquid with the plating section and accommodating therein a copper supply source (146) composed of a copper wire; and a first circulation mechanism (P5) for circulating the plating liquid through the plating section and the copper dissolution tank. The components represented by the parenthesized alphanumeric characters are equivalent to those to be described in the following embodiments. However, the present invention is not intended to be limited to the embodiments. This definition is also applied to the following description.

According to this inventive aspect, copper ions are supplied to the plating liquid from the copper supply source provided separately from the anode. Thus, copper ions consumed in the plating liquid by the plating can be replenished. In this case, the use of the insoluble anode obviates the need for the formation of the black film unlike the case where a dissolvable anode is employed.

Therefore, the time required for the formation of the black film can be saved, thereby increasing the capacity utilization rate of the plating apparatus. Since there is no possibility that the plating liquid is contaminated with the black film and slime, the plating process can properly be performed. The plating apparatus does not suffer from the inconvenience associated with the black film when the plating process is resumed after the plating apparatus is out of operation.

Where the plating liquid contains an oxidizing/reducing agent, the aforesaid reaction can continuously be caused by transferring electrons via the oxidizing/reducing agent.

Since the copper supply source is composed of the copper wire, the copper supply source has a light weight and a greater surface area (in contact with the plating liquid). With the greater surface area of the copper supply source, the rate of copper ion supply from the copper supply source to the plating liquid can be increased. The copper wire of the copper supply source is preferably three-dimensionally configured. In this case, the copper supply source has a greater void ratio as compared with a case where the copper supply source is an aggregate of copper granules. Thus, a pressure loss of the plating liquid flowing through the copper dissolution tank can be reduced.

The copper wire may be configured, for example, in a wool-like crimped shape, a helical spring shape or a spiral shape. Alternatively, the copper wire may be configured in a three-dimensional structure, which includes a plurality of stacked mesh members each prepared by weaving copper wires.

The plating apparatus may be a substrate treating apparatus which includes a post-treatment section for etching a peripheral edge of the substrate and cleaning a surface of the substrate.

In the inventive plating apparatus, the plating section may comprise: a plating vessel (61a to 61d) for containing the plating liquid to be brought into contact with the substrate; a plating liquid container (55) capable of containing the plating liquid in a greater amount than the plating vessel; and a second circulation mechanism (P1 to P4) for circulating the plating liquid through the plating vessel and the plating liquid container. In this case, the copper dissolution tank may be connected to the plating section via the plating liquid container.

With the provision of the plating liquid container, the total amount of the plating liquid to be used in the plating section can be increased, so that variations in the composition (e.g., copper ion concentration) of the plating liquid can be reduced. The plating liquid container has a volume of, for example, not smaller than 1 liter to not greater than 1000 liters.

In the inventive plating apparatus, the copper supply source may comprise a plurality of mesh members (146) each prepared by weaving a copper wire. In this case, the mesh members may be stacked one on another along a flow path of the plating liquid in the copper dissolution tank.

With the use of such a copper supply source, an initial void ratio can easily be controlled, and a change in the void ratio due to the dissolution of the copper supply source can be reduced.

In the inventive plating apparatus, the copper dissolution tank may comprise a cartridge (140) accommodating therein the copper supply source, and having a plating liquid inlet port (117E) for introducing the plating liquid and a plating liquid outlet port (116E) for discharging the plating liquid, the cartridge being detachable from the plating apparatus.

Since the cartridge is detachable from the plating apparatus, the replacement of the copper supply source is facilitated. That is, there placement of the copper supply source can be achieved by replacing a cartridge containing a consumed copper supply source with a cartridge containing a new copper supply source without the need for directly handling the copper supply source. Therefore, the copper supply source (cartridge) can be replaced without contamination of the surroundings.

A plating apparatus (10) according to a second aspect of the present invention comprises: a plating section (12) for performing a plating process with the use of a plating liquid for plating a substrate (W) with copper, the plating section having an insoluble anode (76); a copper dissolution tank (110a to 110c) connected to the plating section for communication of the plating liquid with the plating section and accommodating therein a copper supply source (146); a circulation mechanism (P5) for circulating the plating liquid through the plating section and the copper dissolution tank; a replacement liquid supplying section (111, 112, 124, 135, 137, P5) for supplying a replacement liquid into the copper dissolution tank for prevention of deterioration of a surface of the copper supply source; and a control section (155) which performs a control operation to circulate the plating liquid through the plating section and the copper dissolution tank when the plating process is performed in the plating section and to stop the circulation of the plating liquid and replace the plating liquid in the copper dissolution tank with the replacement liquid supplied from the replacement liquid supplying section after completion of the plating process in the plating section.

If the copper supply source is left immersed in the plating liquid when the plating process is not performed in the plating section, the concentration of copper ions in the plating liquid is increased above a proper concentration range, and the surface of the copper supply source is irreversibly deteriorated. Therefore, the plating process cannot properly be performed when resumed. This problem can be eliminated by immersing the copper supply source in the replacement liquid to separate the copper supply source from the plating liquid when the plating process is not performed.

The deterioration of the surface of the copper supply source occurs after a lapse of several hours from the completion of the plating process in the plating section. The completion of the plating process may herein be defined, for example, as a case where the plating process is not resumed within several hours. In this case, the plating liquid in the copper dissolution tank may be replaced with the replacement liquid immediately after the completion of the plating process in the plating section.

Due to a change in a production plan, the plating process is often resumed immediately after the plating process is once finished in the plating section. If the plating liquid in the copper dissolution tank is already replaced with the replacement liquid in this case, the replacement liquid in the copper dissolution tank should be replaced again with the plating liquid, so that the productivity is reduced. Therefore, the plating liquid in the copper dissolution tank is replaced with the replacement liquid after a lapse of a 2- to 3-hour standby period from the finish of the plating process in the plating section.

The replacement of the plating liquid with the replacement liquid in the copper dissolution tank may be achieved, for example, by expelling the plating liquid from the copper dissolution tank to empty the copper dissolution tank (and then introducing gas into the copper dissolution tank), and introducing the replacement liquid into the copper dissolution tank.

The plating apparatus may be constructed so that the replacement liquid can be drained from the copper dissolution tank so as not to be mixed in the plating liquid. In this case, when the plating process is to be resumed, the replacement liquid is drained from the copper dissolution tank, and then the plating liquid is introduced into the copper dissolution tank and circulated through the copper dissolution tank and the plating section.

The replacement liquid may be deionized water or an acidic aqueous solution (e.g., a sulfuric acid aqueous solution).

The inventive plating apparatus may further comprise a deionized water supplying section (111, 135, P5) for supplying deionized water into the copper dissolution tank. In this case, the control section may perform a control operation so as to replace the plating liquid in the copper dissolution tank with deionized water and then replace the deionized water with the replacement liquid after the completion of the plating process in the plating section.

With this arrangement, the plating liquid is once replaced with deionized water in the copper dissolution tank, and then the deionized water is replaced with the replacement liquid. Therefore, the amount of the plating liquid mixed in the replacement liquid can be reduced. Thus, the copper supply source can be kept in a proper surface state.

In the inventive plating apparatus, the copper supply source may comprise a plurality of mesh members (146) each prepared by weaving a copper wire. In this case, the mesh members are stacked one on another along a flow path of the plating liquid in the copper dissolution tank.

In the inventive plating apparatus, the copper dissolution tank may comprise a cartridge (140) accommodating therein the copper supply source, and having a plating liquid inlet port (117E) for introducing the plating liquid and a plating liquid outlet port (116E) for discharging the plating liquid, the cartridge being detachable from the plating apparatus.

A plating apparatus (10) according to a third aspect of the present invention comprises: a plating section (12) for performing a plating process with the use of a plating liquid for plating a substrate (W) with copper, the plating section having an insoluble anode (76); a plurality of copper dissolution tanks (110a to 110c) connected to the plating section for communication of the plating liquid with the plating section and each accommodating therein a copper supply source (146); a circulation mechanism (P5) for circulating the plating liquid through the plating section and the copper dissolution tanks; a weight measuring section (154a to 154c) for individually measuring weights of the copper dissolution tanks; and a control section (155) which performs a control operation so as to select at least one of the copper dissolution tanks for use in the plating process on the basis of the result of the measurement performed by the weight measuring section and circulate the plating liquid through the selected copper dissolution tank and the plating section.

Since the plurality of copper dissolution tanks are provided, at least one (e.g., one) of the copper dissolution tanks is used in the plating process, and the other copper dissolution tanks are reserved as spares on standby. When the copper supply source in the copper dissolution tank currently in use is consumed to be incapable of supplying a sufficient amount of copper ions, the copper dissolution tank is immediately switched to the spare copper dissolution tanks.

In the inventive plating apparatus, the control section may be adapted to calculate weights of the copper supply sources in the respective copper dissolution tanks on the basis of the result of the measurement performed by the weight measuring section, and select one of the copper dissolution tanks having the lightest copper supply source for use in the plating process.

With this arrangement, one of the copper dissolution tanks having the lightest copper supply source is employed for the plating process. Therefore, the other spare copper dissolution tanks each contain a copper supply source having a sufficiently great weight, so that ample time is left for replacing the used copper dissolution tank with a new one.

The control section may be adapted to select two or more of the copper dissolution tanks having lighter copper supply sources for use in the plating process. These two or more copper dissolution tanks may be used simultaneously.

In the inventive plating apparatus, the copper supply source may comprise a plurality of mesh members (146) each prepared by weaving a copper wire. In this case, the mesh members are stacked one on another along a flow path of the plating liquid in each of the copper dissolution tanks.

In the inventive plating apparatus, the copper dissolution tanks may each comprise a cartridge (140) accommodating therein the copper supply source, and having a plating liquid inlet port (117E) for introducing the plating liquid and a plating liquid outlet port (116E) for discharging the plating liquid, the cartridge being detachable from the plating apparatus.

A cartridge (140) according to the present invention is removably attachable to a plating apparatus (10) having an insoluble anode (76) for copper plating, and is adapted to supply copper ions to a plating liquid for use in the plating apparatus. The cartridge comprises a plating liquid inlet port (117E) for introducing the plating liquid, a plating liquid outlet port (116E) for discharging the plating liquid, and a copper supply source (146) composed of a copper wire accommodated therein.

The cartridge can be used as any of the cartridges of the aforesaid plating apparatuses.

In the inventive cartridge, the copper supply source is disposed across a flow path of the plating liquid.

With this arrangement, the plating liquid cannot bypass the copper supply source, but flows through voids in the copper supply source. Therefore, the copper supply source is efficiently dissolved into the plating liquid.

In the inventive cartridge, the copper supply source may comprise a plurality of mesh members (146) each prepared by weaving a copper wire. In this case, the mesh members are stacked one on another along the flow path of the plating liquid in the cartridge.

In order to minimize a pressure loss of the plating liquid flowing through the cartridge, the copper supply source preferably has a void ratio of not smaller than 30%.

A plating method according to a first aspect of the present invention comprises the steps of: plating a surface of a substrate (W) with the surface thereof coming in contact with a plating liquid in a plating section (12) having an insoluble anode (76); and circulating the plating liquid through the plating section and a copper dissolution tank (110a to 110c) accommodating therein a copper supply source (146) composed of a copper wire.

The plating section may comprise a plating vessel (61a to 61d) which contains the plating liquid to be brought into contact with the substrate, and a plating liquid container (55) capable of containing the plating liquid in a greater amount than the plating vessel. In this case, the plating step may comprise the step of performing the plating process with the substrate in contact with the plating liquid contained in the plating vessel, and the plating liquid circulating step may comprise the steps of circulating the plating liquid through the plating vessel and the plating liquid container, and circulating the plating liquid through the plating liquid container and the copper dissolution tank.

A plating method according to a second aspect of the present invention comprises the steps of: plating a surface of a substrate (W) with the surface thereof coming in contact with a plating liquid in a plating section (12) having an insoluble anode (76); circulating the plating liquid through the plating section and a copper dissolution tank (110a to 110c) accommodating therein a copper supply source (146) in the plating step; and replacing the plating liquid in the copper dissolution tank with a replacement liquid for prevention of deterioration of a surface of the copper supply source.

In the inventive plating method, the replacing step may comprise the deionized water replacement step of replacing the plating liquid in the copper dissolution tank with deionized water, and the step of replacing the deionized water in the copper dissolution tank with the replacement liquid after the deionized water replacement step.

A plating method according to a third aspect of the present invention comprises: the plating step of plating a surface of a substrate (W) with the surface thereof coming in contact with a plating liquid in a plating section (12) having an insoluble anode (76); the weight measuring step of individually measuring weights of plural copper dissolution tanks (110a to 110c) each accommodating therein a copper supply source (146); the tank selecting step of selecting at least one of the copper dissolution tanks for use in the plating step on the basis of the result of the measurement performed in the weight measuring step; and the step of circulating the plating liquid through the plating section and the copper dissolution tank selected in the tank selecting step.

In the inventive plating method, the tank selecting step may comprise the copper weight calculating step of calculating weights of the copper supply sources in the respective copper dissolution tanks on the basis of the result of the measurement performed in the weight measuring step, and the step of selecting one of the copper dissolution tanks having the lightest copper supply source for use in the plating step on the basis of the weights of the copper supply sources calculated in the copper weight calculating step.

A copper dissolution tank (210a, 210b) according to a first aspect of the present invention is connectable to a plating section (12) for performing a plating process with the use of a plating liquid containing an oxidizing/reducing agent and copper ions for plating a substrate with copper, and comprises a copper supply source (203, 219, 220a to 220e) accommodated therein for supplying copper ions to the plating liquid for use in the plating section, wherein the copper supply source is generally uniformly dissolvable over the entire surface thereof at a constant dissolution rate in the plating liquid, and is configured so that the surface area thereof is changed by a percentage of not greater than 25% as observed from the start of the dissolution of the copper supply source in the plating liquid till the copper supply source is dissolved to have a shape which is no longer generally conformable to an initial shape thereof.

The copper ion supplying capability of the copper supply source for supplying copper ions to the plating liquid is proportional to the surface area of the copper supply source. Therefore, the copper ion supplying capability of the copper supply source is reduced, as the surface area of the copper supply source is reduced by the dissolution of the copper supply source in the plating liquid. When the rate of the copper ion supply from the copper supply source to the plating liquid is reduced below the rate of the copper ion supply from the plating liquid to the to-be-treated substrate, the concentration of copper ions in the plating liquid is reduced below a proper concentration range, making it impossible to properly perform the plating process. In this case, the rate of the copper ion supply to the plating liquid should be kept constant, for example, by adjusting the flow rate of the plating liquid flowing through the copper supply source.

According to this inventive aspect, the copper supply source is generally uniformly dissolvable over the entire surface thereof at a constant dissolution rate in the plating liquid, and the surface area thereof is changed by a small percentage (not greater than 25%) as observed from the start of the dissolution of the cupper supply source in the plating liquid until the copper supply source is dissolved to have a shape which is no longer generally conformable to the initial shape. Therefore, the surface area of the copper supply source can be kept virtually constant by replacing the copper supply source with a new one before the copper supply source is dissolved to have a shape which is no longer generally conformable to the initial shape.

Thus, the copper supply source has a virtually constant capability of supplying copper ions to the plating liquid, so that the concentration of cupper ions in the plating liquid can easily be kept virtually constant. That is, the copper ion concentration of the plating liquid can easily be kept virtually constant simply by configuring the copper supply source in the aforesaid manner. Thus, the substrate can properly be plated.

The expression "the copper supply source is dissolved to have a shape which is no longer generally conformable to the initial shape" means, for example, that the dissolution of the copper supply source extremely proceeds to form a through-hole in the copper supply source.

The inventive copper dissolution tank may be constructed so that the plating liquid flows along a predetermined flow path in the copper dissolution tank. In this case, the copper supply source (203, 219, 220a to 220e) which is generally uniformly dissolvable over the entire surface thereof at the constant dissolution rate in the plating liquid may be configured so that the area of a surface thereof along the flow path is kept virtually constant from the start of the dissolution of the copper supply source in the plating liquid till the copper supply source is dissolved to have a shape which is no longer generally conformable to the initial shape thereof.

With this arrangement, copper ions can be leached at a virtually constant rate from the surface of the copper supply source exposed to the flow path. Where the copper supply source is configured as extending along the flow path, the area of the surface of the copper supply source exposed to the flow path accounts for a major percentage of the total surface area of the copper supply source. In this case, the copper supply source as a whole can supply copper ions at a generally constant rate to the plating liquid.

The flow path of the plating liquid herein means a flow path through which the plating liquid flows in the copper dissolution tank when no copper supply source is disposed in the copper dissolution tank. Therefore, the flow path extends along an interior wall surface of a plating liquid communication space in the copper dissolution tank. That is, it is herein assumed that the plating liquid is not deflected in the presence of the copper supply source.

A copper dissolution tank (210a, 210b) according to a second aspect of the present invention is connectable to a plating section (12) for performing a plating process with the use of a plating liquid containing an oxidizing/reducing agent and copper ions for plating a substrate with copper. The copper dissolution tank comprises a copper supply source (203, 219) accommodated therein for supplying copper ions to the plating liquid for use in the plating section, and is constructed so that the plating liquid flows along a predetermined flow path, wherein the copper supply source comprises a copper supply source pipe disposed generally parallel to the flow path and having a pipe interior wall surface and a pipe exterior wall surface generally parallel to the flow path.

The wall thickness and length of the copper supply source pipe are reduced, as the dissolution of the copper supply source pipe in the plating liquid proceeds. However, where the copper supply source pipe has a sufficiently great length, the percentage of a change in the length is negligible as compared with the percentage of a change in the wall thickness. The end face areas of the pipe are steeply reduced along with the wall thickness, as the dissolution proceeds. However, the exterior and interior wall surface areas of the pipe are each changed by a small percentage.

Where the copper supply source pipe has a sufficiently small wall thickness, the end face areas of the pipe account for a small percentage of the total surface area of the pipe. Therefore, the copper supply source pipe is generally uniformly dissolved over the entire surface thereof in the plating liquid, and the surface area of the copper supply source pipe is changed by a small percentage as observed from the start of the dissolution of the copper supply source pipe in the plating liquid until the copper supply source pipe is dissolved to have a shape which is no longer conformable to an initial shape thereof.

Since the copper supply source pipe is disposed generally parallel to the flow path, the copper supply source pipe is generally uniformly dissolved in the plating liquid. Therefore, the copper supply source pipe is kept generally conformable to the initial shape and has a virtually constant surface area, until the copper supply source pipe is generally completely dissolved in the plating liquid. Thus, the copper supply source pipe is capable of supplying copper ions to the plating liquid at a virtually constant rate.

Since the copper supply source pipe is disposed generally parallel to the flow path, the pressure loss of the plating liquid due to the copper supply source pipe can be reduced. Therefore, where the plating liquid is circulated through the plating section and the copper dissolution tank by a pump, for example, a load exerted on the pump can be reduced.

The copper supply source pipe may include a plurality of copper supply source pipes. In this case, the plurality of copper supply source pipes may be arranged in the copper dissolution tank so that lengths of peripheral surfaces thereof in contact with the plating liquid as measured per unit area in a cross section intersecting the fluid path are virtually constant.

With the provision of the plurality of copper supply source pipes, the copper supply source has a greater surface area in the copper dissolution tank having a predetermined volume and, hence, has an increased copper ion supplying capability. Since the plurality of copper supply source pipes are arranged in the copper dissolution tank so that lengths of peripheral surfaces thereof in contact with the plating liquid as measured per unit area in a cross section intersecting the fluid path are virtually constant, the copper supply source pipes can generally uniformly be dissolved in the plating liquid.

A copper dissolution tank (210a, 210b) according to a third aspect of the present invention is connectable to a plating section (12) for performing a plating process with the use of a plating liquid containing an oxidizing/reducing agent and copper ions for plating a substrate with copper. The copper dissolution tank comprises a copper supply source (220a to 220e) accommodated therein for supplying copper ions to the plating liquid for use in the plating section, and is constructed so that the plating liquid flows along a predetermined flow path in the copper dissolution tank, wherein the copper supply source comprises a copper supply source plate (220a to 220e) disposed generally parallel to the flow path and having a pair of surfaces generally parallel to the flow path.

According to this inventive aspect, the length and width of the copper supply source plate are each changed by a smaller percentage than the thickness of the plate by the dissolution of the copper supply source plate in the plating liquid, as in the case of the copper supply source pipe. The end face areas of the copper supply source plate account for a small percentage of the total surface area of the copper supply source plate. Therefore, the total surface area of the copper supply source plate is virtually unchanged, even if the copper supply source plate is dissolved in the plating liquid thereby to have a reduced thickness. Hence, the surface area of the copper supply source plate is kept virtually constant, until the copper supply source plate is dissolved to have a shape which is no longer generally conformable to an initial shape thereof (e.g., a through-hole is formed in the copper supply source plate). Thus, the copper supply source plate is capable of supplying copper ions to the plating liquid at a virtually constant rate.

In the inventive copper dissolution tank, the copper supply source plate (220b, 220e) may be configured so as to have a plurality of parallel plate portions (220f, 220g) which are arranged parallel to each other and generally parallel to the flow path. In this case, the parallel plate portions may be generally equidistantly arranged with opposed surfaces thereof being spaced a predetermined distance.

With this arrangement, the plating liquid can evenly flow through spaces defined between the parallel plate portions arranged in generally equidistantly spaced relation, so that the parallel plate portions of the copper supply source plate are generally uniformly dissolved at a virtually constant dissolution rate in the plating liquid. Therefore, the copper supply source plate can easily be kept generally conformable to the initial shape.

The copper supply source plate may be alternately folded along a plurality of bent portions (220h) each having a ridge extending generally parallel to the flow path to configure the plurality of parallel plate portions (220f). Alternatively, the copper supply source plate may be formed in a spiral shape as seen in cross section intersecting the flow path to configure the plurality of parallel plate portions (220g).

With this arrangement, the copper supply source plate includes the bent portions or has a spiral shape and, hence, has a greater surface area in the copper dissolution tank having a predetermined volume. Thus, the copper supply source plate has a greater copper ion supplying capacity.

In the inventive copper dissolution tank, the copper supply source plate (220a) may include a plurality of copper supply source plates. In this case, the copper supply source plates may be arranged in generally equidistantly spaced relation in the thickness direction of the copper supply source plates.

Even in this case, the plating liquid evenly flows through spaces defined between the copper supply source plates, so that the copper supply source plates are generally uniformly dissolved in the plating liquid.

In the inventive copper dissolution tank, the copper supply source plate may include a plurality of planar copper supply source plates (220a) arranged generally parallel to each other, and corrugated copper supply source plates (220d) disposed between the planar copper supply source plates and each having a wavy cross section intersecting the flow path. In this case, the corrugated copper supply source plates may each have ridges extending along the flow path.

Since the corrugated copper supply source plates are provided between the planar copper supply source plates, the copper supply source has an increased surface area in the copper dissolution tank having a predetermined volume.

In the inventive copper dissolution tank, the copper supply source has a surface area of 2000 $cm^2$ to 20000 $cm^2$ per kilogram before the dissolution of the copper supply source in the plating liquid is started.

With this arrangement, the copper supply source has an increased surface area per unit weight (an increased specific surface area). Hence, the copper supply source has an increased capability of supplying copper ions to the plating liquid, while allowing for weight reduction of the copper dissolution tank. Therefore, where the copper dissolution tank comprises a cartridge removably attached to the plating apparatus and accommodating therein the copper supply source, for example, the replacement of the cartridge can easily be achieved for the replenishment of the copper supply source.

A plating apparatus according to a fourth aspect of the present invention comprises: a plating section (12) comprising a plating vessel (56a to 56d) for containing a plating liquid to be brought into contact with a to-be-treated substrate (W), the plating vessel having an insoluble anode (76) disposed therein for electrical energization of the plating liquid, and a plating liquid container (55) capable of containing the plating liquid in a greater amount than the plating vessel for circulating the plating liquid through the plating vessel and the plating liquid container; and any of the copper dissolution tanks (210a, 210b) described above for supplying copper ions to the plating liquid for use in the plating section.

According to this inventive aspect, the copper supply source is capable of replenishing copper ions consumed in the plating liquid by the plating of the to-be-treated substrate. Since copper ions are supplied to the plating liquid from the copper dissolution tank at a virtually constant rate, the concentration of copper ions in the plating liquid can easily be kept virtually constant, allowing for proper plating of the substrate. Further, the plating liquid container is capable of containing the plating liquid in a greater amount than the volume of the plating vessel, so that variations in the composition of the plating liquid caused by the plating can be reduced. In addition, the insoluble anode is barely consumed and, hence, does not require replacement.

The plating apparatus may further comprise a first circulation mechanism for circulating the plating liquid through the plating liquid container and the copper dissolution tank, and a second circulation mechanism for circulating the plating liquid through the plating liquid container and the plating vessel.

The foregoing and other objects, features and effects of the present invention will become more apparent from the following description of the preferred embodiments with reference to the attached drawings.

BRIEF DESCRIPTION OF THE DRAWINGS

FIG. 4(a) is a schematic plan view for explaining the construction of a robot body;

FIG. 4(b) is a schematic side view for explaining the construction of the robot body;

FIG. 4(c) is a schematic front view for explaining the construction of the robot body;

FIG. 20(a) is a schematic sectional view taken perpendicularly to the length of a cartridge in which copper plates are accommodated;

FIG. 20(b) is a schematic sectional view taken perpendicularly to the length of a cartridge in which copper plates are accommodated;

FIG. 20(c) is a schematic sectional view taken perpendicularly to the length of a cartridge in which copper plates are accommodated; and FIG. 20(d) is a schematic sectional view taken perpendicularly to the length of a cartridge in which copper plates are accommodated.

DESCRIPTION OF THE PREFERRED EMBODIMENTS

Figure 1:
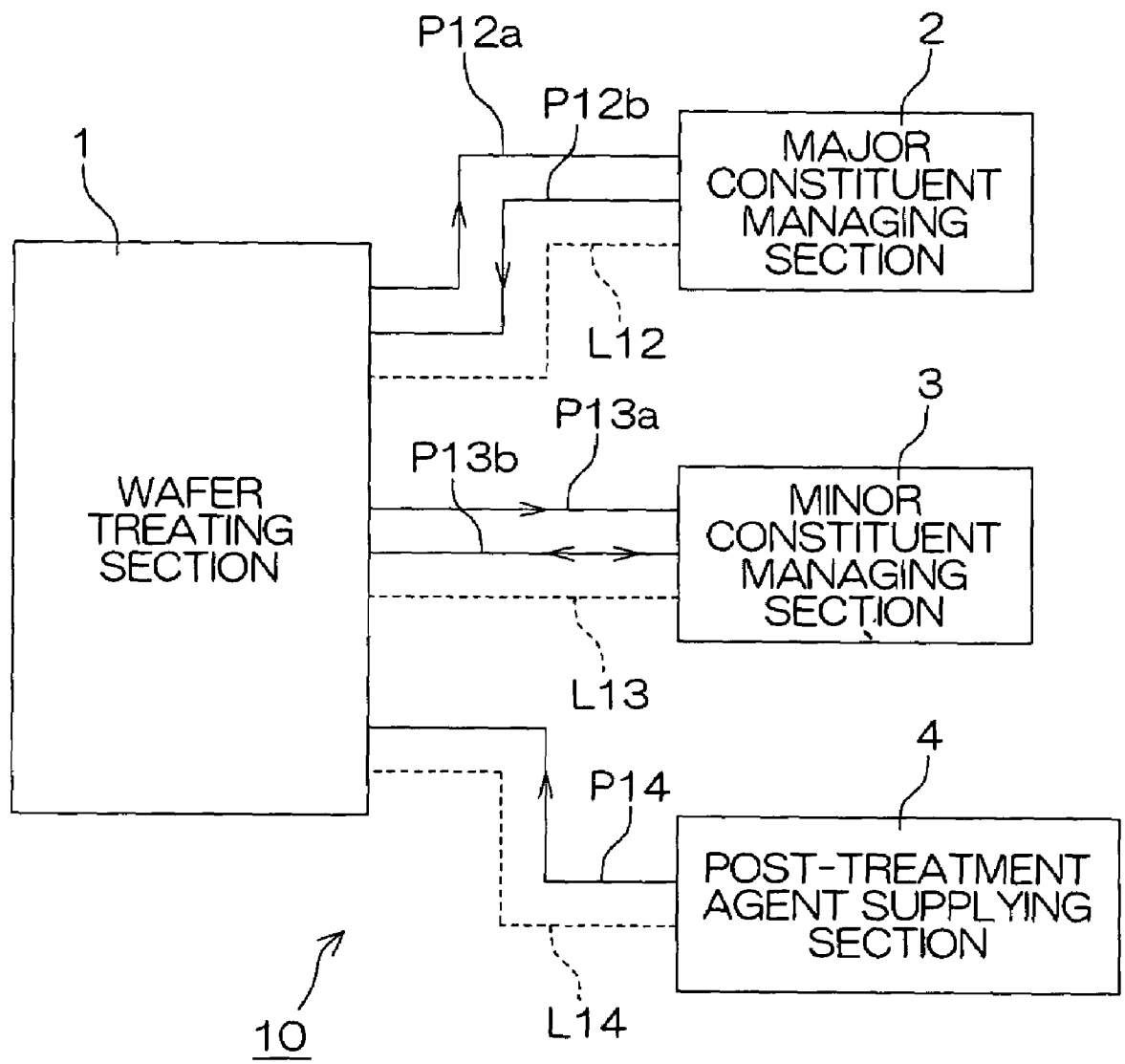
FIG. 1 is a block diagram illustrating the construction of a substrate treating apparatus according to a first embodiment of the present invention.

FIG. 1 is a block diagram illustrating the construction of a substrate treating apparatus 10 according to a first embodiment of the present invention.

The substrate treating apparatus 10 includes a wafer treating section 1 for plating a surface of a semiconductor wafer (hereinafter referred to simply as "wafer") with the use of a plating liquid and etching (bevel-etching) a peripheral edge of the wafer after the plating, a major constituent managing section 2 having a copper supply source for supplying copper ions to the plating liquid for management of the concentrations of major constituents of the plating liquid, a minor constituent managing section 3 for managing minor constituents of the plating liquid, and a post-treatment agent supplying section 4 for supplying a post-treatment agent to the wafer treating section 1 for post-treatment of the wafer after the plating. The substrate treating apparatus 10 is disposed in a clean room.

The plating liquid for use in the wafer treating section 1 contains sulfuric acid (supporting electrolyte), copper ions (target metal), iron (oxidizing/reducing agent) and water as major constituents thereof. The plating liquid further contains chlorine, a plating retarding additive and a plating accelerating additive as minor constituents thereof.

Two plating liquid transport pipes P12a, P12b extend between the wafer treating section 1 and the major constituent managing section 2 for transporting the plating liquid between these sections in opposite directions. Similarly, two plating liquid transport pipes P13a, P13b extend between the wafer treating section 1 and the minor constituent managing section 3 for transporting the plating liquid between these sections in opposite directions. Further, a post-treatment agent pipe P14 extends between the wafer treating section 1 and the post-treatment agent supplying section 4 for supplying the post-treatment agent from the post-treatment agent supplying section 4 to the wafer treating section 1.

The wafer treating section 1 includes a system controller for controlling the entire substrate treating apparatus 10. The wafer treating section 1 is connected to the major constituent managing section 2, the minor constituent managing section 3 and the post-treatment agent supplying section 4 via signal lines L12, L13 and L14, respectively. The operations of the major constituent managing section 2, the minor constituent managing section 3 and the post-treatment agent supplying section 4 are controlled by the system controller provided in the wafer treating section 1.

The plating liquid being used in the wafer treating section 1 is transported (sampled) into the minor constituent managing section 3 through the plating liquid transport pipe P13a. The minor constituent managing section 3 is capable of analyzing at least one of the minor constituents through a CVS (cyclic voltammetric stripping) analysis. Further, the minor constituent managing section 3 is capable of calculating the amounts of the minor constituents to be added to the plating liquid in the wafer treating section 1 on the basis of the result of the analysis so as to adjust the concentrations of the minor constituents of the plating liquid within predetermined concentration ranges, and supplying the minor constituents in the amounts thus calculated to the plating liquid in the wafer treating section 1 through the plating liquid transport pipe P13b.

Examples of the post-treatment agent to be supplied by the post-treatment liquid supplying section 4 include an etching liquid to be used for the bevel etching and a cleaning liquid.

Figure 2:
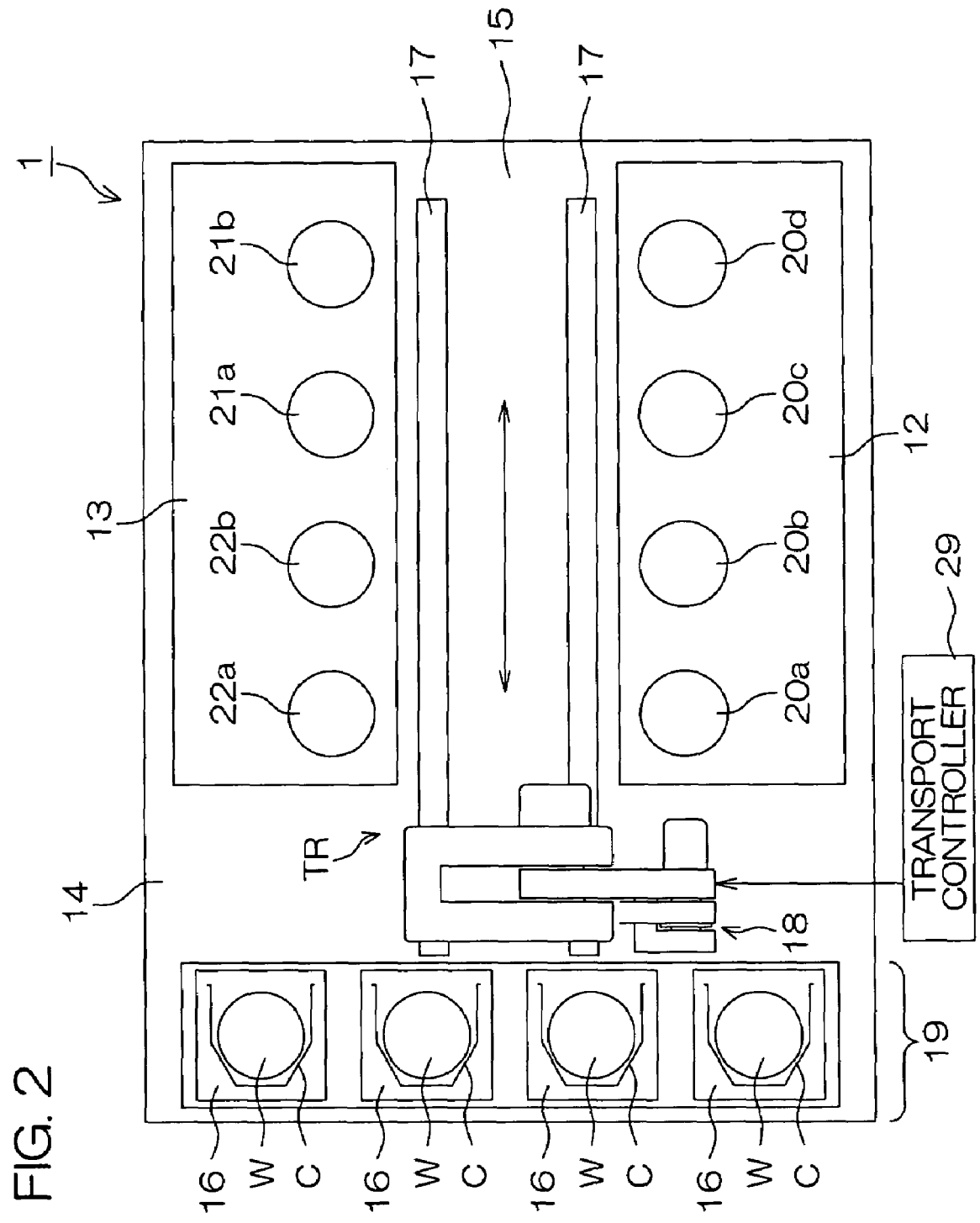
FIG. 2 is a schematic plan view of a wafer treating section.

FIG. 2 is a schematic plan view of the wafer treating section 1.

The wafer treating section 1 is adapted to perform a plating process for forming a thin copper film on the surface of the wafer W, then perform an etching process for etching the peripheral edge of the wafer W, and perform a cleaning process for cleaning the entire surfaces of the wafer W.

A wafer loading/unloading section 19 is disposed along a first transport path 14 extending linearly horizontally. In the wafer loading/unloading section 19, a plurality of cassette stages 16 (four cassette stages in this embodiment) which are each adapted to receive thereon one cassette C capable of accommodating a wafer W are arranged along the first transport path 14.

A second linear transport path 15 is provided horizontally and perpendicularly to the first transport path 14. In this embodiment, the second transport path 15 extends from a middle portion of the first transport path 14. A plating section 12 including four plating units 20a to 20d arranged along the second transport path 15 is provided on one side of the second transport path 15. The plating units 20a to 20d are each adapted to plate the surface of the wafer W with copper.

A post-treatment section 13 including two bevel etching units 21a, 21b and two cleaning units 22a, 22b arranged along the second transport path 15 is provided on the other side of the second transport path 15. The bevel etching units 21a, 21b are each adapted to etch the peripheral edge of the wafer W, while the cleaning units 22a, 22b are each adapted to clean the surfaces of the wafer W.

The first transport path 14 and the second transport path 15 constitute a T-shaped transport path, and a single transport robot TR is provided on the T-shaped transport path. The transport robot TR includes transport guide rails 17 disposed along the second transport path 15, and a robot body 18 movable along the transport guide rails 17. The operation of the transport robot TR is controlled by a transport controller 29.

The robot body 18 is capable of transporting the wafer W along the first transport path 14 and along the second transport path 15. Therefore, the robot body 18 can access any of the cassettes C placed on the cassette stages 16 to load and unload a wafer W, and access any of the plating units 20a to 20d, the bevel etching units 21a, 21b and the cleaning units 22a, 22b to load and unload the wafer W.

After taking out an untreated wafer W from one of the cassettes C, the robot body 18 moves to the front of one of the plating units 20a to 20d, and unloads a treated wafer W from the plating unit 20a to 20d. Then, the robot body 18 loads the untreated wafer W into the plating unit 20a to 20d.

Further, the robot body 18 loads the wafer W unloaded from the plating unit 20a to 20d into one of the bevel etching units 21a, 21b. Before the loading of the wafer W, the robot body 18 unloads a wafer W subjected to the bevel etching process from the bevel etching unit 21a, 21b. The robot body 18 holding the unloaded wafer W travels along the second transport path 15, and then loads the wafer W into one of the cleaning units 22a, 22b. Before the loading of the wafer W, the robot body 18 unloads a wafer W subjected to the cleaning process from the cleaning unit 22a, 22b.

Thereafter, the robot body 18 holding the treated wafer W travels along the second transport path 15 toward the first transport path 14. Upon reaching the first transport path 14, the robot body 18 starts moving along the transport path 14 to the front of a cassette C placed on one of the cassette stages 16, and loads the wafer W into the cassette C. Thus, the robot body 18 transports the wafer W along the aforesaid basic transport route, but may transport the wafer W in any other transport sequence.

The wafer treating section 1 is enclosed in an enclosure so as not to be influenced by an external environment.

Figure 3:
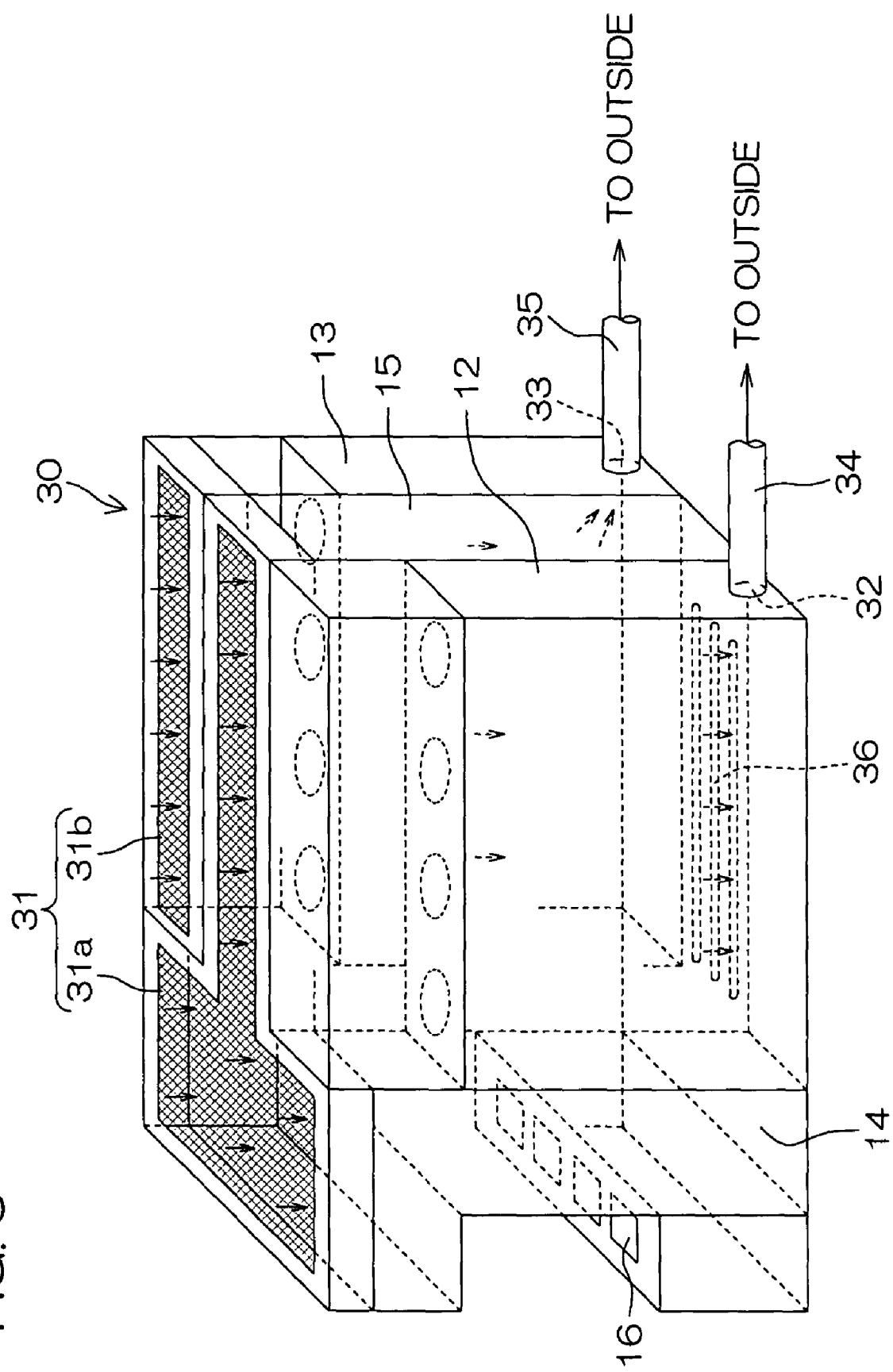
FIG. 3 is a schematic perspective view illustrating the construction of an enclosure of the wafer treating section.

FIG. 3 is a schematic perspective view illustrating the construction of the enclosure 30 of the wafer treating section 1.

The enclosure 30 has a generally rectangular box-like outer shape defined by a plurality of walls. In the enclosure 30, partition walls are provided between the second transport path 15 and the plating section 12 and between the second transport path 15 and the post-treatment section 13. The space of the second transport path 15 is isolated from the space of the plating section 12 and from the space of the post-treatment section 13, except when the wafer W is loaded and unloaded with respect to these sections.

A filter 31 for filtering off contaminants in air is provided in a top wall of the enclosure 30. The filter 31 includes a first filter 31a disposed above the cassette stages 16, the first transport path 14 and the second transport path 15, and a second filter 31b disposed above the post-treatment section 13. Fans not shown are provided above the first filter 31a for forcibly introducing external air into the enclosure 30.

A plurality of slit-like openings 36 are provided in a portion of the enclosure 30 below the second transport path 15 as extending longitudinally of the second transport path 15. Since the space of the second transport path 15 is isolated by the enclosure 30 and the internal partitions, the space of the second transport path 15 is kept at a positive pressure when air is forcibly introduced into the enclosure 30 through the first filter 31a. Therefore, internal air is exhausted from the enclosure 30 through the openings 36. Thus, air flows from the upper side toward the lower side (the down-flow of air occurs) in the space of the second transport path 15.

Since no reagent is used in the space of the second transport path 15, the air flowing through this space is not contaminated. Therefore, the air flowing through the space of the second transport path 15 is exhausted through the openings 36 around the enclosure 30.

Air outlet ports 32, 33 are respectively provided in a lower portion of a wall defining the plating section 12 and a lower portion of a wall defining the post-treatment section 13 on a side of the enclosure 30 opposite from the cassette stages 16. The air outlet port 32 is connected to one end of an air outlet duct 34, while the air outlet port 33 is connected to one end of an air outlet duct 35. The other ends of the air outlet ducts 34, 35 are connected to an in-plant exhauster system line. Thus, air possibly exposed to the plating liquid and the post-treatment agent in the plating section 12 and the post-treatment section 13 can forcibly be exhausted outside the clean room.

By forcibly exhausting the air from the post-treatment section 13 through the air outlet port 33, the internal pressure of the post-treatment section 13 is kept at a negative pressure, so that external air is sucked into the post-treatment section 13 through the second filter 31b. Thus, air flows downward in the space of the post-treatment section 13.

FIGS. 4(a), 4(b) and 4(c) are a schematic plan view, a schematic side view and a schematic front view, respectively, for explaining the construction of the robot body 18.

The robot body 18 includes a base 23, a vertical articulated arm 24 attached to the base 23, a pivotal driving mechanism 25 attached to the vertical articulated arm 24, and a substrate holder 26 to be driven pivotally about a vertical pivot axis V0 by the pivotal driving mechanism 25 (only the substrate holder 26 is shown in FIG. 4(a)).

The substrate holder 26 includes a body 40 having a flat top, and a pair of retractable arms 41, 42 provided on the flat top of the body 40. A retractable driving mechanism (not shown) for horizontally advancing and retracting the pair of retractable arms 41, 42 is incorporated in the body 40.

The retractable arms 41 and 42 respectively include first arm portions 41a and 42a, second arm portions 41b and 42b, and substrate holder hands (effecters) 41c and 42c. The body 40 has a generally round shape as seen in plan, and the first arm portions 41a, 42a are attached to a peripheral edge portion of the body 40 pivotally about vertical pivot axes thereof. The first arm portions 41a, 42a are driven pivotally about the pivot axes by the retractable driving mechanism provided in the body 40.

The retractable arms 41, 42 each constitute a so-called scholar robot, which is operative so that the second arm portion 41b, 42b is pivoted about a vertical pivot axis thereof in synchronization with the pivoting of the first arm portion 41a, 42a. Thus, the first arm portion 41a, 42a and the second arm portion 41b, 42b of the retractable arm 41, 42 are stretched and unstretched so as to advance and retract the substrate holder hand 41c, 42c.

When the retractable arms 41, 42 are in an unstretched state, the substrate holder hands 41c, 42c are kept in vertically overlapped relation (FIG. 4(a)). Therefore, the substrate holder hand 41c of the retractable arm 41 has a bent shape for prevention of interference with the substrate holder hand 42c of the retractable arm 42 (FIG. 4(b)).

A first arm 24a is attached to the base 23 pivotally about a horizontal pivot axis H1 at one end thereof. A second arm 24b is attached to the other end of the first arm 24a pivotally about a horizontal pivot axis H2 at one end thereof. The pivotal driving mechanism 25 is attached to the other end of the second arm 24b pivotally about a horizontal pivot axis H3. The pivot axes H1, H2 and H3 are parallel to each other.

A motor 27 for pivoting the first arm 24a is provided in the base 23, and a motor 28 for pivotally driving the second arm 24b is provided in a coupling between the first arm 24a and the second arm 24b. The motor 28 is rotatable in synchronization with the motor 27. A driving force transmission mechanism (not shown) for transmitting a driving force from the motor 28 to the pivotal driving mechanism 25 is incorporated in the second arm 24b. Thus, the pivotal driving mechanism 25 can constantly hold the substrate holder 26 in the same attitude (e.g., in such an attitude as to hold the wafer W horizontally), even if the first arm 24a and the second arm 24b are pivoted.

A motor (not shown) is incorporated in the pivotal driving mechanism 25. The pivotal driving mechanism 25 receives a driving force from this motor to pivotally drive the substrate holder 26 about the vertical pivot axis V0.

With this arrangement, the transport robot TR can move the substrate holder hands 41c, 42c horizontally and vertically within a range hatched in FIG. 4(c).

When the robot body 18 accesses the cassette C placed on the cassette stage 16 (see FIG. 2), the robot body 18 is guided to the first transport path 14 by a movement mechanism not shown. In this state, the substrate holder 26 is brought into opposed relation to the cassette C on the cassette stage 16 by the operation of the vertical articulated arm 24. Then, the retractable arm 41, 42 is brought into opposed relation to the cassette C by the operation of the pivotal driving mechanism 25, and caused to access the cassette C by the retractable driving mechanism not shown for loading and unloading the wafer W with respect to the cassette C. When the wafer W is transferred between the cassette C and the retractable arm 41, 42, the substrate holder 26 is slightly moved up or down by the operation of the vertical articulated arm 24.

When the robot body 18 accesses any of the plating units 20a to 20d, the bevel etching units 21a, 21b and the cleaning units 22a, 22b (see FIG. 2), the robot body 18 is moved to the front of the corresponding unit on the transport guide rails 17 by the movement mechanism not shown. In this state, the substrate holder 26 is moved up or down to the height of a substrate loading/unloading port of the unit by the operation of the vertical articulated arm 24, and the retractable arm 41, 42 is brought into opposed relation to the unit by pivoting the substrate holder 26 by means of the pivotal driving mechanism 25.

In this state, the retractable arm 41, 42 is caused to access the unit by the retractable driving mechanism for the loading and unloading of the wafer W. When the wafer W is transferred between the unit and the retractable arm 41, 42, the substrate holder 26 is slightly moved up or down by the operation of the vertical articulated arm 24.

Figure 5:
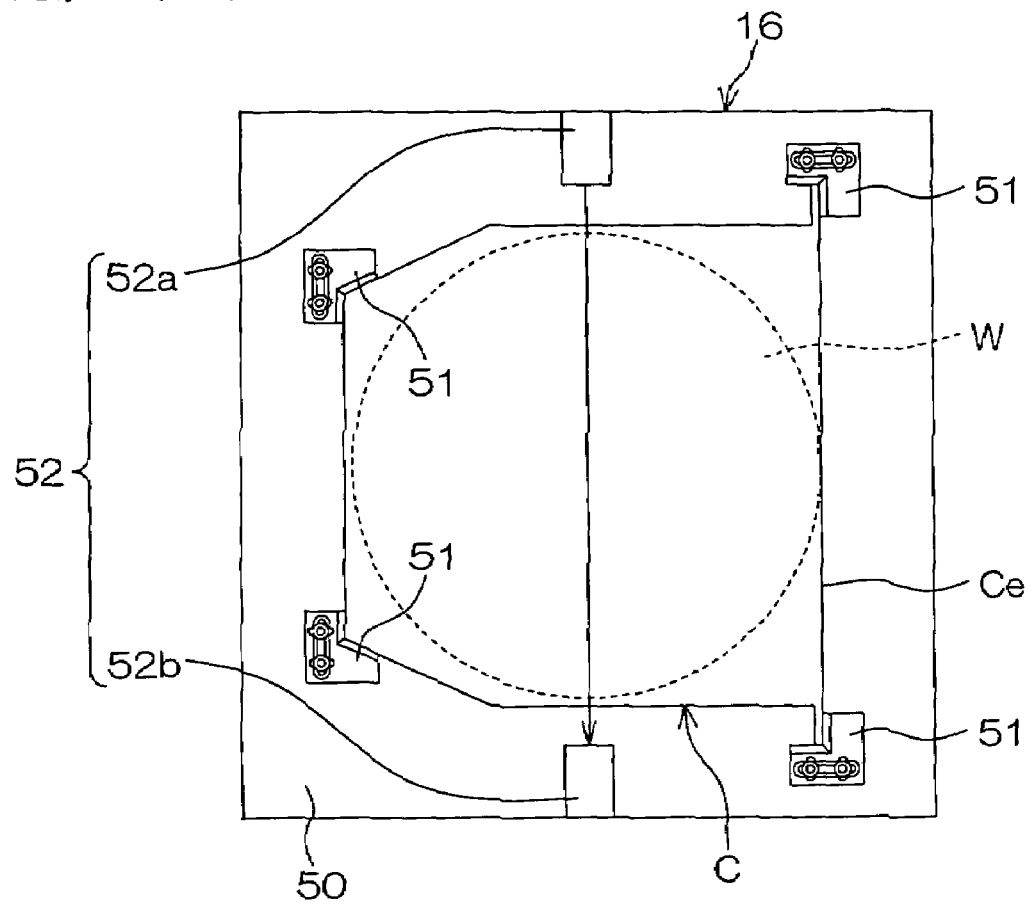
FIG. 5(a) is a schematic plan view of a cassette stage on which a cassette is placed.
FIG. 5(b) is a schematic side view of the cassette stage on which the cassette is placed.
Figure 5:
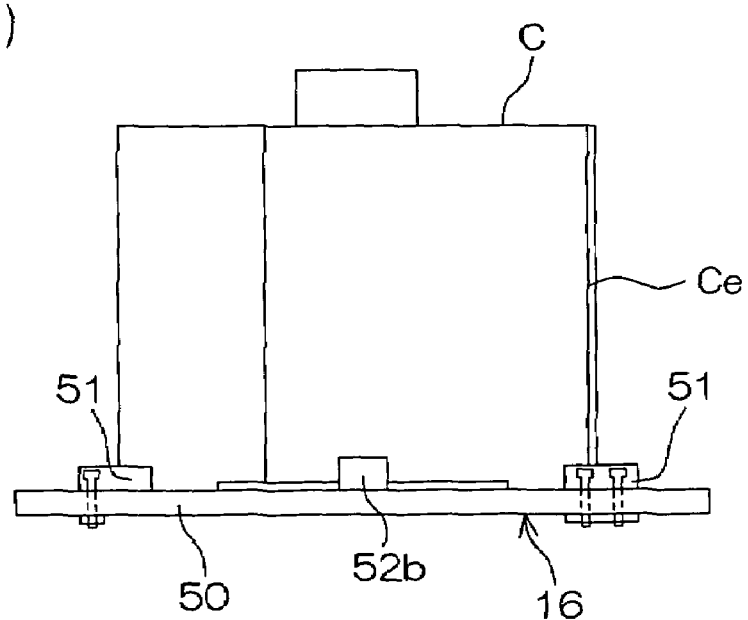

FIGS. 5(a) and 5(b) are a schematic plan view and a schematic side view, respectively, of the cassette stage 16 on which the cassette C is placed.

The cassette stage 16 includes a planar cassette base 50 for receiving thereon the cassette C. The cassette base 50 has a generally square shape as seen in plan. The cassette C has a generally square shape having a smaller size than the cassette base 50 as seen in plan, and has a wafer loading/unloading opening Ce provided on one lateral side thereof.

The cassette base 50 has cassette guides 51 provided on one surface thereof in association with four corners of the cassette C as seen in plan. Therefore, the cassette C can be located in position on the cassette base 50 with its corners in contact with the cassette guides 51.

A light emitting element 52a and a light receiving element 52b are respectively provided at generally middle points on opposite edges of the cassette base 50 (excluding an edge having the wafer loading/unloading opening Ce) on the surface of the cassette base 50. The light emitting element 52a and the light receiving element 52b constitute a transmissive photosensor 52. When no cassette C is present on the cassette base 50, light emitted from the light emitting element 52a is received by the light receiving element 52b. When the cassette C is present on the cassette base 50, the light emitted from the light emitting element 52a is blocked by the cassette C and does not reach the light receiving element 52b. Thus, a judgment can be made on the presence or absence of the cassette C on the cassette base 50.

Figure 6:
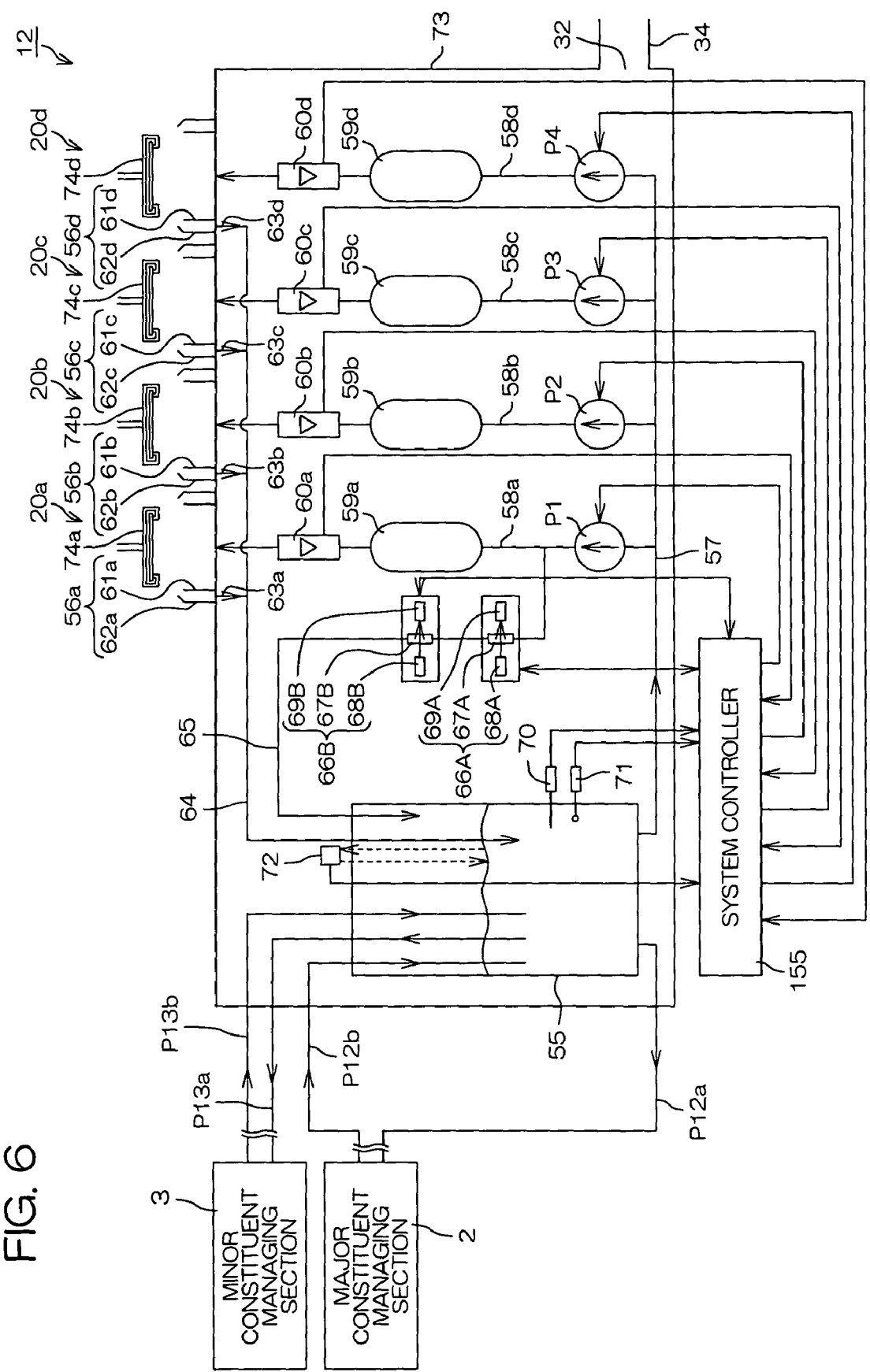
FIG. 6 is a schematic front view illustrating the construction of a plating section.

FIG. 6 is a schematic front view illustrating the construction of the plating section 12.

The plating section 12 includes a plurality of plating units (the four plating units 20a to 20d in this embodiment) for the plating of the wafer W, and a plating liquid container 55 for containing the plating liquid. The plating units 20a to 20d respectively include plating cups 56a to 56d for containing the plating liquid, and wafer holding/rotating mechanisms 74a to 74d to be located above the plating cups 56a to 56d.

The plating liquid container 55 is capable of containing the plating liquid in a much greater amount than the plating cups 56a to 56d (e.g., 20 times the total volume of the plating cups 56a to 56d). Since a great amount of the plating liquid can be stored in the plating liquid container 55, the total amount of the plating liquid to be used in the plating section 12 can be increased. Thus, variations in the composition of the plating liquid can be reduced during the plating process.

The plating liquid transport pipe P12a for transporting the plating liquid to the major constituent managing section 2 is connected to the bottom of the plating liquid container 55 in communication with the plating liquid container 55. The plating liquid transport pipe P12b for introducing the plating liquid transported from the major constituent managing section 2 into the plating liquid container 55, the plating liquid transport pipe P13a for transporting the plating liquid to the minor constituent managing section 3, and the plating liquid transport pipe P13b for introducing the plating liquid transported from the minor constituent managing section 3 into the plating liquid container 55 are introduced into the plating liquid container 55 from the top of the plating liquid container 55. The plating liquid transport pipes P12b, P13a, P13b extend to a depth at which open ends thereof are submerged in the plating liquid in the plating liquid container 55.

The plating cups 56a to 56d are located at a higher position than the plating liquid container 55. A liquid supply pipe 57 extends from the bottom of the plating liquid container 55, and is branched into four branch liquid supply pipes 58a to 58d. The branch liquid supply pipes 58a to 58d extend upward to be respectively connected to bottom center portions of the plating cups 56a to 56d in communication with the plating cups 56a to 56d.

Pumps P1 to P4, filters 59a to 59d and flow meters 60a to 60d are provided in this order from a lower side to an upper side in the respective branch liquid supply pipes 58a to 58d. The pumps P1 to P4 are respectively capable of pumping the plating liquid from the plating liquid container 55 to the plating cups 56a to 56d. The operations of the pumps P1 to P4 are controlled by the system controller 155. The filters 59a to 59d are capable of removing particles (contaminants) and bubbles from the plating liquid. Signals indicative of the flow rates of the plating liquid are outputted from the flow meters 60a to 60d, and inputted to the system controller 155.

The plating cups 56a to 56d respectively include cylindrical plating vessels 61a to 61d provided inwardly thereof, and recovery vessels 62a to 62d surrounding the plating vessels 61a to 61d. The branch liquid supply pipes 58a to 58d are connected in communication with the plating vessels 61a to 61d. Branch return pipes 63a to 63d respectively extend from bottom portions of the recovery vessels 62a to 62d. The branch return pipes 63a to 63d are connected in communication with a return pipe 64, which extends into the plating liquid container 55.

With the aforesaid arrangement, the plating liquid is supplied, for example, to the plating vessel 61a from the plating liquid container 55 through the liquid supply pipe 57 and the branch liquid supply pipe 58a by operating the pump P1. The plating liquid overflows from the top of the plating vessel 61a, and is fed back into the plating liquid container 55 from the recovery vessel 62a through the branch return pipe 63a and the return pipe 64 by gravity. That is, the plating liquid is circulated through the plating liquid container 55 and the plating cup 56a.

Similarly, the plating liquid is circulated through the plating liquid container 55 and the plating cup 56b, 56c or 56d by operating the pump P2, P3 or P4. When the plating process is performed in any of the plating units 20a to 20d, the plating liquid is circulated through the plating cup 56*a* to 56*d* of the corresponding plating unit 20*a* to 20*d* and the plating liquid container 55.

One end of a bypass pipe 65 is connected to the branch liquid supply pipe 58*a* between the pump P1 and the filter 59*a*. The other end of the bypass pipe 65 is introduced into the plating liquid container 55. Absorptiometers 66A, 66B for measuring absorbances of the plating liquid at specific wavelengths of light are provided in the bypass pipe 65. The absorptiometer 66A is provided for determining the concentration of copper in the plating liquid, while the absorptiometer 66B is provided for determining the concentration of iron in the plating liquid.

When the pump P1 is operated to circulate the plating liquid through the plating liquid container 55 and the plating cup 56*a*, apart of the plating liquid flowing through the branch liquid supply pipe 58*a* flows into the bypass pipe 65 due to a pressure loss by the filter 59*a*. That is, the plating liquid can be introduced into the bypass pipe 65 without provision of a dedicated pump in the bypass pipe 65.

The absorptiometers 66A, 66B each include a cell 67A, 67B composed of a transparent material, and a light emitting section 68A, 68B and a light receiving section 69A, 69B disposed in opposed relation with the cell 67A, 67B interposed therebetween. The light emitting sections 68A and 68B are respectively capable of emitting light beams having specific wavelengths corresponding to absorption spectra of copper and iron (e.g., 780 nm for copper). The light receiving sections 69A and 69B are respectively capable of measuring the intensities of the light beams emitted from the light emitting sections 68A and 68B and transmitted through the plating liquid in the cells 67A and 67B. The absorbances of the plating liquid are determined on the basis of the light intensities. Signals indicative of the absorbances are outputted from the absorptiometers 66A, 66B, and inputted to the system controller 155.

A temperature sensor 70 and an electromagnetic conductivity meter 71 are attached to a side wall of the plating liquid container 55. The temperature sensor 70 and the electromagnetic conductivity meter 71 are located at a height lower than the surface level of the plating liquid contained in the plating liquid container 55. Detectors of the temperature sensor 70 and the electromagnetic conductivity meter 71 project into the plating liquid container 55, and are respectively adapted to measure the temperature and electrical conductivity of the plating liquid. Output signals of the temperature sensor 70 and the electromagnetic conductivity meter 71 are inputted to the system controller 155.

The concentrations of copper and iron in the plating liquid can be determined by measuring the absorbances of the plating liquid at the specific wavelengths of light. An explanation will be given to how to determine the copper concentration on the basis of the absorbance of the plating liquid.

Figure 7:
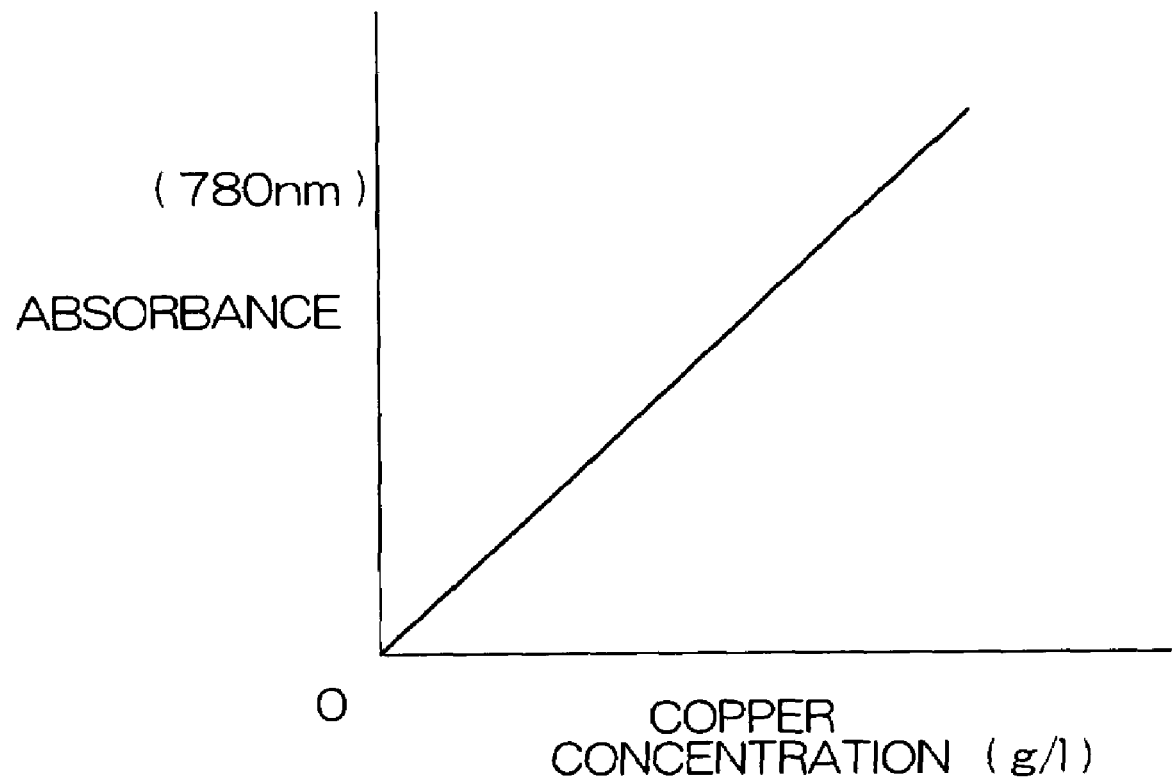
FIG. 7 is a diagram illustrating a relationship between the concentrations of copper in plating liquid samples and measured absorbances.

For the determination of the copper concentration of the plating liquid, a relationship between the copper concentration and the absorbance is preliminarily determined. First, plural plating liquid samples having different copper concentrations are prepared. Copper sulfate is added as a copper source for the preparation of the plating liquid samples. The plating liquid samples each have substantially the same composition as the plating liquid actually used for the plating process, except that the copper concentrations thereof are different. The absorbances of the plating liquid samples are measured by the absorptiometer 66A. Thus, the relationship between the copper concentration and the absorbance (copper calibration line) is determined on the basis of the known copper concentrations and the measured absorbances of the plating liquid samples as shown in FIG. 7.

For the determination of an unknown copper concentration of the plating liquid, the absorbance of the plating liquid is measured by the absorptiometer 66A. Then, the copper concentration is determined on the basis of the measured absorbance and the copper calibration line.

Similarly, a relationship between the iron concentration and the absorbance (iron calibration line) is preliminarily determined on the basis of known iron concentrations and measured absorbances of plating liquid samples, and the concentration of iron in the plating liquid is determined on the basis of the absorbance of the plating liquid measured by the absorptiometer 66B and the iron calibration line.

The system controller 155 includes a storage device storing therein data of the copper calibration line and the iron calibration line. The system controller 155 is capable of determining the copper concentration on the basis of the output signal of the absorptiometer 66A and the data of the copper calibration line, and determining the iron concentration on the basis of the output signal of the absorptiometer 66B and the data of the iron calibration line.

An ultrasonic level meter 72 is provided above the plating liquid container 55. The ultrasonic level meter 72 is capable of detecting the surface level of the plating liquid in the plating liquid container 55. An output signal of the ultrasonic level meter 72 is inputted to the system controller 155.

The plating liquid container 55, the liquid supply pipe 57, the branch liquid supply pipes 58*a* to 58*d*, the branch return pipes 63*a* to 63*d* and the return pipe 64 are disposed in a pipe chamber 73 enclosed by the enclosure 30 and the partition walls. The pipe chamber 73 is provided with the air outlet port 32 (see FIG. 3), and the internal pressure of the pipe chamber 73 is kept at a negative pressure.

Figure 8:
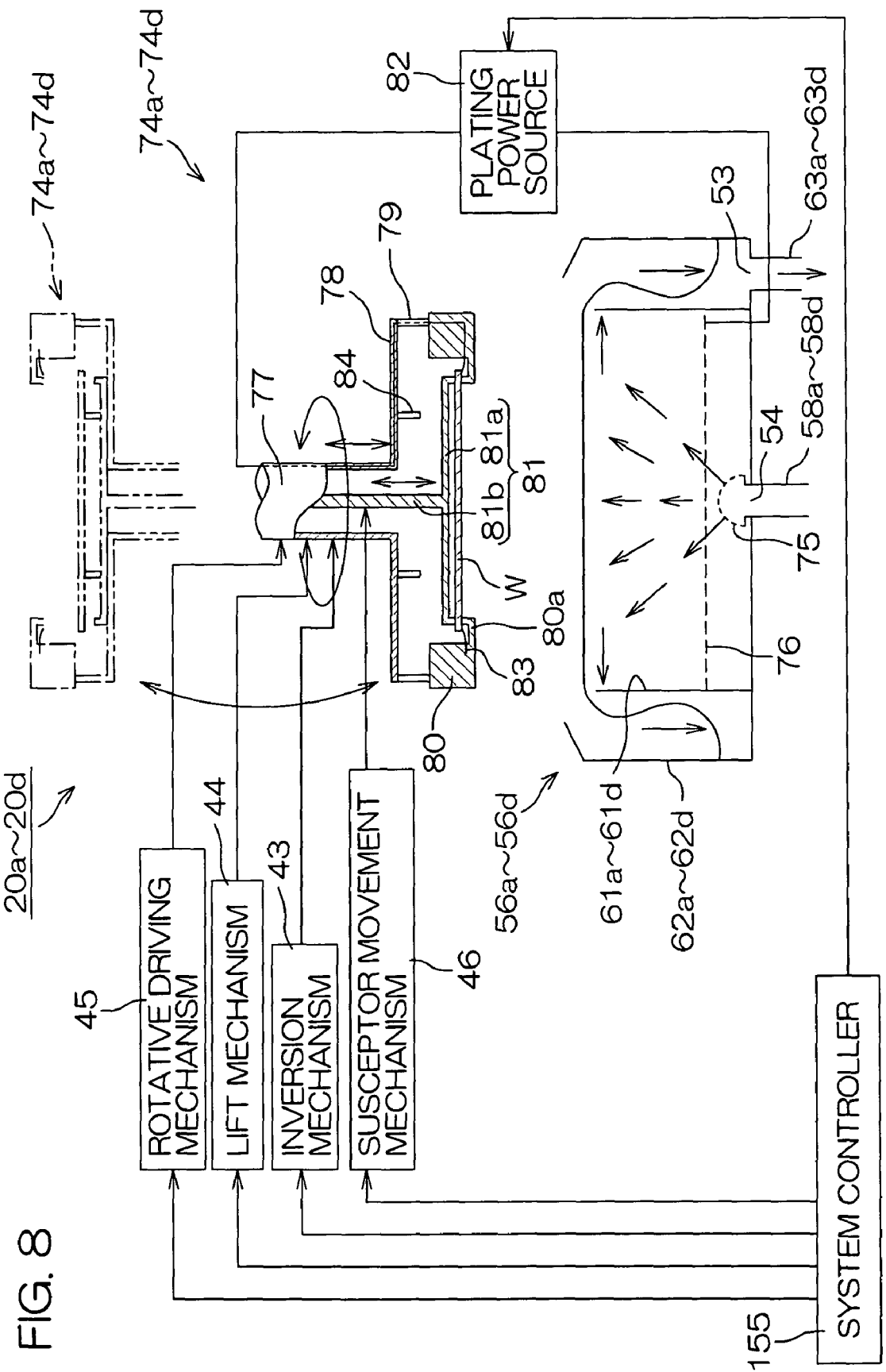
FIG. 8 is a schematic sectional view illustrating the construction of a plating unit.

FIG. 8 is a schematic sectional view illustrating the common construction of the plating units 20*a* to 20*d*.

A plating liquid supply port 54 is provided in a bottom center portion of the plating vessel 61*a* to 61*d*. The branch liquid supply pipe 58*a* to 58*d* is connected to the plating liquid supply port 54 in communication with the plating vessel 61*a* to 61*d*. A semispherical shower head 75 having a multiplicity of holes is attached to the branch liquid supply port 54. The plating liquid is diffusively introduced into the plating vessel 61*a* to 61*d* through the shower head 75.

A mesh anode 76 is provided at a level about one third the depth of the plating vessel 61*a* to 61*d* in the plating vessel 61*a* to 61*d*. The surface of the anode 76 is composed of iridium oxide, and is in soluble in the plating liquid. The anode 76 is connected to a plating power source 82.

A plating liquid outlet port 53 is provided in the bottom of the recovery vessel 62*a* to 62*d*. The branch return pipe 63*a* to 63*d* is connected to the plating liquid outlet port 53 in communication with the recovery vessel 62*a* to 62*d*.

The wafer holding/rotating mechanism 74*a* to 74*d* includes a rotary pipe 77, a disk-shaped support plate 78 attached to one end of the rotary pipe 77 perpendicularly to the rotary pipe 77, a plurality of wafer transfer pins 84 extending from a surface portion of the support plate 78 between the center and the peripheral edge of the support plate 78 opposite from the rotary pipe 77, a plurality of support posts 79 extending from a peripheral edge portion of the support plate 78 opposite from the rotary pipe 77, and an annular cathode ring 80 attached to distal ends of the support posts 79. The cathode ring 80 has an abutment portion 80*a* projecting inwardly of the cathode ring 80. The abutment portion 80*a* has an inner diameter slightly smaller than the diameter of the wafer W.

A susceptor 81 is provided within the rotary pipe 77. The susceptor 81 includes a support shaft 81b and a disk-shaped placement base 81a attached to a lower end of the support shaft 81b perpendicularly to the support shaft 81b. The placement base 81a is surrounded by the plurality of support posts 79. The susceptor 81 is coupled to a susceptor movement mechanism 46 so as to be movable along the axis of the rotary pipe 77. The placement base 81a is formed with holes in association with the wafer transfer pins 84. Thus, the wafer transfer pins 84 are inserted into the holes of the placement base 81a as the susceptor 81 is moved with respect to the rotary pipe 77.

The cathode ring 80 includes a cathode 83 connected to the plating power source 82. The cathode 83 projects inwardly of the cathode ring 80 so as to be brought into contact with a peripheral edge portion of the wafer W held between the placement base 81a and the abutment portion 80a on the side of the abutment portion 80a. The abutment portion 80a is kept into intimate contact with the peripheral edge portion of the wafer W, so that the wafer W and the cathode 83 can be protected from the plating liquid.

The wafer holding/rotating mechanism 74a to 74d is coupled to an inversion mechanism 43 and a lift mechanism 44. The inversion mechanism 43 is adapted to pivot the wafer holding/rotating mechanism 74a to 74d about a horizontal axis (generally perpendicular to the rotary pipe 77) to vertically invert the wafer holding/rotating mechanism 74a to 74d. The lift mechanism 44 is adapted to generally vertically move up and down the wafer holding/rotating mechanism 74a to 74d.

A rotative driving mechanism 45 is coupled to the rotary pipe 77 for rotating the rotary pipe 77 about the axis thereof. The rotation of the rotary pipe 77 is transmitted to the susceptor 81, while the susceptor 81 is permitted to move axially of the rotary pipe 77. Thus, the rotary pipe 77 and the susceptor 81 can be rotated together.

The operations of the plating power source 82, the inversion mechanism 43, the lift mechanism 44, the rotative driving mechanism 45 and the susceptor movement mechanism 46 are controlled by the system controller 155.

When the plating process is performed in the plating section 12, the system controller 155 first controls the inversion mechanism 43 to invert any of the wafer holding/rotating mechanisms 74a to 74d (herein assumed to be the wafer holding/rotating mechanism 74a) with the placement base 81a thereof facing upward. Further, the system controller 155 controls the susceptor movement mechanism 46 to move the placement base 81a toward the rotary pipe 77, so that the wafer transfer pins 84 project out through the placement base 81a.

In this state, an untreated wafer W taken out of the cassette C is loaded onto the wafer transfer pins 84 through a space between the support posts 79 with the center of the wafer W coinciding with the center axis of the rotary pipe 77 by means of the retractable arm 41 or the retractable arm 42 (see FIGS. 4(a) to 4(c)) of the transport robot TR (the wafer holding/rotating mechanism 74a to 74d in this state is shown by a two-dot-and-dash line in FIG. 8).

Then, the system controller 155 controls the susceptor movement mechanism 46 to move the placement base 81a apart from the rotary pipe 77. Thus, the wafer W is held between the placement base 81a and the abutment portion 80a of the cathode ring 80. The wafer W has a generally round shape, for example, and has a multiplicity of fine holes or grooves formed on the to-be-treated surface thereof, and a barrier layer and a seed layer formed on the surface.

The pump P1 is actuated under the control of the system controller 155 to supply the plating liquid into the plating vessel 61a at a flow rate of 5 l/min (see FIG. 6). Thus, the plating liquid is slightly raised from the edge of the plating vessel 61a to overflow into the recovery vessel 62a. Then, the system controller 155 controls the inversion mechanism 43 to invert the wafer holding/rotating mechanism 74a so that the wafer W faces downward. Further, the system controller 155 controls the lift mechanism 44 to lower the wafer holding/rotating mechanism 74a so that the lower surface of the wafer W is brought into contact with the surface of the plating liquid filled in the plating vessel 61a.

Subsequently, the system controller 155 controls the rotative driving mechanism 45 to rotate the wafer W at a predetermined rotation speed (e.g., 100 rpm), and controls the plating power source 82 to electrically energize the anode 76 and the cathode 83 for several minutes. Thus, electrons are donated to copper ions in the plating liquid in the interface between the plating liquid and the lower surface of the wafer W connected to the cathode 83, so that copper atoms are deposited on the lower surface of the wafer W. Thus, the lower surface of the wafer W is plated with copper.

Iron ions as an oxidizing/reducing agent are present in the form of divalent and trivalent iron ions in the plating liquid. The divalent iron ions in the plating liquid donate electrons to the anode 76 thereby to be turned into trivalent iron ions. Thus, the iron ions cyclically experience oxidization and reduction, so that the amount of electrons transferred between the plating liquid and the anode 76 is virtually balanced with the amount of electrons transferred between the cathode 83 and the plating liquid.

Therefore, the plating process is free from bubbles of active oxygen, which may otherwise be generated when the oxidizing/reducing agent is not used. Thus, oxidative decomposition of the additives contained in the plating liquid can be retarded. Further, it is possible to eliminate the possibility that the oxygen bubbles adhere on the lower surface of the wafer W and fill the fine holes or grooves formed in the surface (lower surface) of the wafer W to hinder the plating.

Thereafter, the system controller 155 controls the lift mechanism 44 to lift the wafer W so that the lower surface of the wafer W is spaced several millimeters apart from the surface of the plating liquid filled in the plating vessel 61a. Further, the system controller 155 controls the rotative driving mechanism 45 to rotate the wafer W, for example, at 500 rpm for several tens seconds. Thus, the plating liquid is laterally spun off from the lower surface of the wafer W.

In turn, the system controller 155 controls the rotative driving mechanism 45 to stop the rotation of the wafer W, and controls the lift mechanism 44 to lift the wafer holding/rotating mechanism 74a. Then, the system controller 155 controls the inversion mechanism 43 to invert the wafer holding/rotating mechanism 74a so that the wafer W faces upward.

Thereafter, the system controller 155 controls the susceptor movement mechanism 46 to move the placement base 81a toward the rotary pipe 77, whereby the wafer W is disengaged from the placement base 81a. Then, the treated wafer W is unloaded by the retractable arm 42 or the retractable arm 41 of the transport robot TR. Thus, the plating process on the single wafer W is completed.

The plating process maybe performed simultaneously in the plating cups 56a to 56d by simultaneously actuating the four pumps P1 to P4, or in some of the plating cups 56a to 56d by actuating corresponding ones of the pumps P1 to P4.

Figure 9:
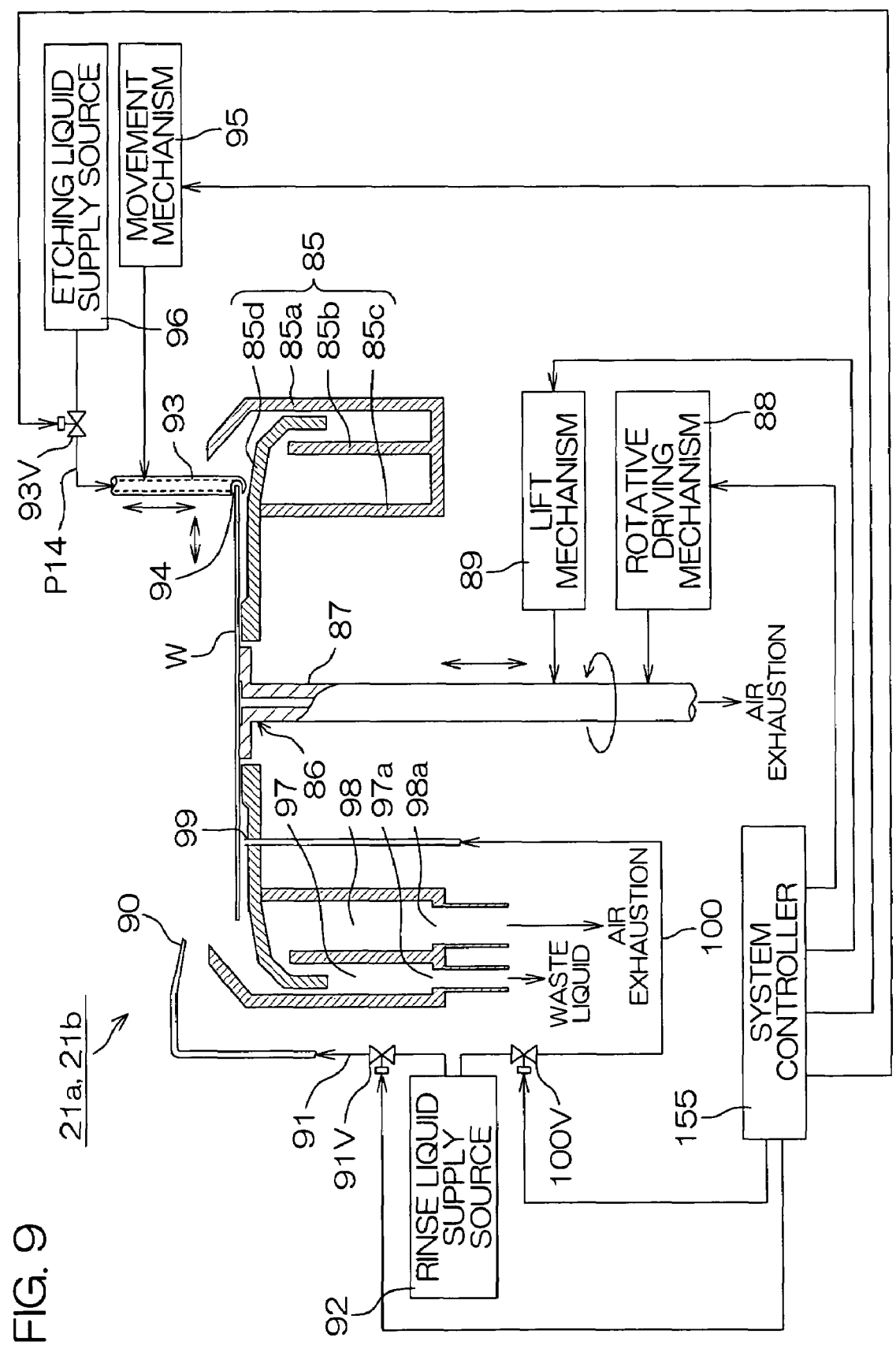
FIG. 9 is a schematic sectional view illustrating the construction of a bevel etching unit.

FIG. 9 is a schematic sectional view illustrating the common construction of the bevel etching units 21a, 21b.

A spin chuck 86 for generally horizontally holding and rotating the wafer W is provided in a generally cylindrical cup 85. The spin chuck 86 is adapted to hold the wafer W by sucking a center portion of the lower surface of the wafer W without contacting the peripheral edge of the wafer W. The spin chuck 86 has a vertical rotation shaft 87, and a rotative driving force is transmitted from a rotative driving mechanism 88 to the rotation shaft 87. A lift mechanism 89 for moving up and down the spin chuck 86 is coupled to the spin chuck 86, so that the spin chuck 86 can be brought into a state where its upper portion is accommodated in the cup 85 and into a state where its upper portion is located above an upper edge of the cup 85.

The cup 85 includes three cups 85a to 85c coaxially arranged. The outermost one of the cups 85a to 85c has an upper edge located at the highest position, and the middle cup 85b has an upper edge located at the lowest position. An annular treatment liquid guide plate 85d as seen in plan is coupled to an upper edge of the innermost cup 85c. An outer edge of the treatment liquid guide plate 85d is bent to be inserted into a space between the cup 85a and the cup 85b.

A treatment liquid collection vessel 97 is defined between the cup 85a and the cup 85b, and an air outlet vessel 98 is defined between the cup 85b and the cup 85c. A liquid drain port 97a is provided in the bottom of the treatment liquid collection vessel 97, and an air outlet port 98a is provided in the bottom of the air outlet vessel 98.

A nozzle 90 is provided above the cup 85. A rinse liquid pipe 91 is connected in communication with the nozzle 90, and a rinse liquid supply source 92 is connected to the rinse liquid pipe 91. A valve 91V is provided in the rinse liquid pipe 91. With the valve 91V being open, the rinse liquid can be discharged through the nozzle 90 to be supplied to the upper surface of the wafer W held by the spin chuck 86. The rinse liquid may be, for example, deionized water.

Another nozzle 99 extends through the treatment liquid guide plate 85d from the lower side. A rinse liquid pipe 100 is connected in communication with the nozzle 99, and the rinse liquid supply source 92 is connected to the rinse liquid pipe 100. A valve 100V is provided in the rinse liquid pipe 100. With the valve 100V being open, the rinse liquid can be discharged through the nozzle 99 to be supplied to the lower surface of the wafer W held by the spin chuck 86.

An etching pipe 93 is provided generally vertically above the cup 85. The etching pipe 93 has a groove 94 provided in a lower end portion thereof as opening horizontally toward the center of the cup 85 in association with the surface of the wafer W held by the spin chuck 86. The peripheral edge of the wafer W can be inserted in the groove 94. The inner space of the groove 94 and the inner space of the etching pipe 93 communicate with each other.

A movement mechanism 95 is coupled to the etching pipe 93. The movement mechanism 95 is adapted to move the etching pipe 93 between a treatment position at which the peripheral edge of the wafer W is inserted in the groove 94 and a retracted position at which the etching pipe 93 is retracted from the treatment position apart from the wafer W. The movement mechanism 95 can vertically move the etching pipe 93, and retract the etching pipe 93 laterally beyond the cup 85.

The etching pipe 93 is connected via the post-treatment agent pipe P14 to an etching liquid supply source 96 disposed in the post-treatment agent supplying section 4 (see FIG. 1) and containing the etching liquid. A valve 93V is provided in the post-treatment agent pipe P14. With the valve 93V being open, the etching liquid can be supplied to the inner space of the groove 94. The flow rate of the etching liquid can also be adjusted by the valve 93V. The etching liquid may be, for example, a mixture of sulfuric acid, hydrogen peroxide and water.

The operations of the rotative driving mechanism 88, the lift mechanism 89 and the movement mechanism 95, and the opening and closing of the valves 91V, 100V, 93V are controlled by the system controller 155.

When the peripheral edge of the wafer W is to be etched by the bevel etching unit 21a, 21b, the system controller 155 first controls the movement mechanism 95 to retract the etching pipe 93 at the retracted position.

In turn, the system controller 155 controls the lift mechanism 89 to move up the spin chuck 86 so that the upper portion of the spin chuck 86 is located above the upper edge of the cup 85. The wafer W subjected to the plating process in the plating section 12 is loaded into the bevel etching unit by the retractable arm 41 or the retractable arm 42 of the transport robot TR (see FIGS. 4(a) to 4(c)), and held by the spin chuck 86 by suction with the center of the wafer W coinciding with the center axis of the rotation shaft 87. The surface of the wafer W subjected to the plating process faces upward.

Thereafter, the system controller 155 controls the lift mechanism 89 to move down the spin chuck 86. Thus, the wafer W held by the spin chuck 86 is surrounded by the cup 85a. Then, the system controller 155 controls the rotative driving mechanism 88 to rotate the wafer W held by the spin chuck 86. The rotation speed of the wafer W is, for example, 500 rpm.

In this state, the valves 91V and 100V are opened under the control of the system controller 155. Thus, the rinse liquid is supplied to the upper and lower surfaces of the wafer W from the nozzles 90 and 99. The rinse liquid spreads toward the peripheral edge of the wafer W by a centrifugal force, and flows over the entire upper surface of the wafer W and the lower surface of the wafer W except a portion thereof in contact with the spin chuck 86. Thus, the wafer W is cleaned.

The rinse liquid is spun off laterally of the wafer W by the centrifugal force, and flows over the interior of the cup 85a and the upper surface of the treatment liquid guide plate 85d down into the treatment liquid collection vessel 97. The rinse liquid is introduced into a collection tank not shown through the liquid drain port 97a. Further, gas is exhausted from the cup 85 through the air outlet port 98a by an air exhauster system not shown. Thus, mist of the rinse liquid and the like are prevented from scattering out of the cup 85.

After the rinsing process is performed for a predetermined period, the valves 91V, 100V are closed under the control of the system controller 155. The wafer W is continuously rotated, whereby the rinse liquid remaining on the wafer W is mostly spun off.

Subsequently, the system controller 155 controls the movement mechanism 95 to move the etching pipe 93 to the treatment position. Thus, the peripheral edge of the wafer W is inserted in the groove 94. At this time, the rotation speed of the wafer W may be, for example, 500 rpm. Then, the valve 93V is opened under the control of the system controller 155. The flow rate of the etching liquid may be, for example, 20 ml/min. Thus, the etching liquid is supplied into the groove 94 from the etching liquid supply source 96. The etching liquid flows out of the groove 94, so that the groove 94 is virtually filled with the etching liquid.

Since the peripheral edge of the wafer W is inserted in the groove 94, a part of the thin copper film formed on the peripheral edge of the wafer W is dissolved by the etching liquid. With the wafer W being rotated, the peripheral edge of the wafer W is moved relative to the etching pipe 93 located at the treatment position. As a result, the entire peripheral edge of the wafer W is etched. An etching width is determined by an insertion depth of the wafer W in the groove 94, so that the etching process can accurately be performed with a desired etching width.

Like the rinse liquid, the etching liquid spun off laterally of the wafer W by a centrifugal force is once collected in the collection vessel 97, and then introduced into the collection tank not shown through the liquid drain port 97a. During this period, gas is continuously exhausted through the air outlet port 98a, so that mist of the etching liquid is prevented from scattering out of the cup 85.

After the etching liquid is continuously supplied for a predetermined period (e.g., several tens seconds) for the etching of the thin copper film on the peripheral edge of the wafer W, the valve 93V is closed under the control of the system controller 155 to stop the supply of the etching liquid to the groove 94. Thus, the etching process for etching the peripheral edge of the wafer W is completed in the absence of the etching liquid in the groove 94.

Thereafter, the valves 91V, 100V are opened again under the control of the system controller 155 to supply the rinse liquid to the surfaces of the wafer W. Thus, the etching liquid remaining on the peripheral edge portion of the wafer W is rinsed away with the rinse liquid. After the rinse liquid is continuously supplied for a predetermined period (e.g., one minute), the valves 91V, 100V are closed under the control of the system controller 155 to stop the supply of the rinse liquid. The system controller 155 controls the rotative driving mechanism 88 to rotate the spin chuck 86 at a high rotation speed (e.g., 1000 rpm) for a predetermined period for spinning off the rinse liquid from the wafer W for drying. Then, the rotation of the spin chuck 86 is stopped.

Thereafter, the system controller 155 controls the movement mechanism 95 to move the etching pipe 93 to the retracted position. Subsequently, the system controller 155 controls the lift mechanism 89 to move up the spin chuck 86 so that the wafer W held by the spin chuck 86 is located above the upper edge of the cup 85. Then, the wafer W is released out of the suction-held state.

In turn, the treated wafer W is unloaded by the retractable arm 42 or the retractable arm 41 of the transport robot TR. Thus, the etching process for the etching of the peripheral edge of the single wafer W is completed. Since no thin copper film is present on the peripheral edge of the treated wafer W, there is no possibility that copper adheres on the substrate holder hand 41c, 42c when the peripheral edge of the wafer W is held by the substrate holder hand 41c, 42c (see FIG. 4(a)) in the subsequent steps.

In this embodiment, the cup 85 is fixed, and the spin chuck 86 is adapted to be moved up and down by the lift mechanism 89. Alternatively, the spin chuck 86 may vertically be fixed, and the cup 85 may be adapted to be moved up and down. Even in this case, the upper portion of the spin chuck 86 can be located above the upper edge of the cup 85, so that the wafer W can be loaded and unloaded by the retractable arm 41 or the retractable arm 42.

Figure 10:
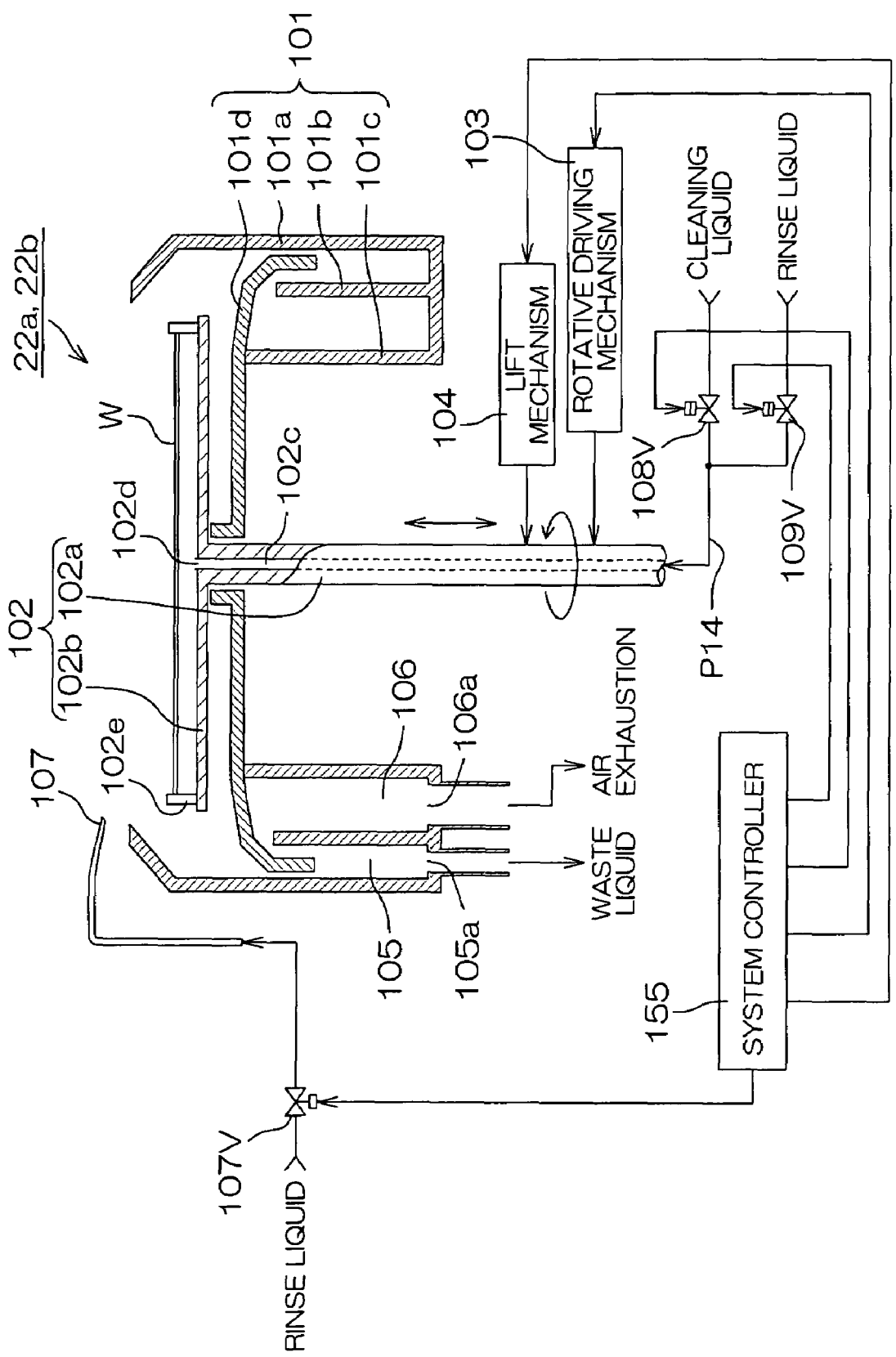
FIG. 10 is a schematic sectional view illustrating the construction of a cleaning unit.

FIG. 10 is a schematic sectional view illustrating the common construction of the cleaning units 22a, 22b.

A spin chuck 102 for generally horizontally holding and rotating the wafer W is provided in a generally cylindrical cup 101. The spin chuck 102 includes a vertical rotation shaft 102a and a disk spin base 102b provided at an upper end of the rotation shaft 102a perpendicularly to the rotation shaft 102a. A plurality of chuck pins 102e are provided upright on a peripheral edge portion of an upper surface of the spin base 102b. The chuck pins 102e support a peripheral edge portion of the lower surface of the wafer W and cooperatively hold the circumferential surface of the wafer W.

A rotative driving force is transmitted to the rotation shaft 102a of the spin chuck 102 from a rotative driving mechanism 103. A lift mechanism 104 for moving up and down the spin chuck 102 is coupled to the spin chuck 102, so that the spin chuck 102 can be brought into a state where its upper portion is accommodated in the cup 101 and into a state where its upper portion is located above an upper edge of the cup 101.

The cup 101 includes three cups 101a to 101c coaxially arranged. The outermost one of the cups 101a to 101c has an upper edge located at the highest position, and the middle cup 101b has an upper edge located at the lowest position. An annular treatment liquid guide plate 101d as seen in plan is coupled to an upper edge of the innermost cup 101c. An outer edge of the treatment liquid guide plate 101d is bent to be inserted into a space between the cup 101a and the cup 101b.

A treatment liquid collection vessel 105 is defined between the cup 101a and the cup 101b, and an air outlet vessel 106 is defined between the cup 101b and the cup 101c. A liquid drain port 105a is provided in the bottom of the treatment liquid collection vessel 105, and an air outlet port 106a is provided in the bottom of the air outlet vessel 106.

A nozzle 107 is provided above the cup 101. The nozzle 107 is connected in communication with the rinse liquid supply source via a valve 107V. By opening the valve 107V, the rinse liquid can be discharged toward the wafer W held by the spin chuck 102 from the nozzle 107.

The rotation shaft 102a has a treatment liquid supply channel 102c extending therethrough axially thereof, and an open upper end serving as a treatment liquid outlet port 102d. The cleaning liquid can be supplied into the treatment liquid supply channel 102c through the post-treatment agent pipe P14 from a cleaning liquid supply source provided in the post-treatment agent supplying section 4 (see FIG. 1). The rinse liquid can also be supplied into the treatment liquid supply channel 102c from the rinse liquid supply source. The cleaning liquid may be, for example, a mixture of sulfuric acid, a hydrogen peroxide and water.

A valve 108V is provided between the treatment liquid supply channel 102c and the cleaning liquid supply source. A valve 109V is provided between the treatment liquid supply channel 102c and the rinse liquid supply source. By closing the valve 109V and opening the valve 108V, the cleaning liquid can be discharged from the treatment liquid outlet port 102d. By closing the valve 108V and opening the valve 109V, the rinse liquid can be discharged from the treatment liquid outlet port 102d. Thus, the cleaning liquid or the rinse liquid can be supplied to the center of the lower surface of the wafer W held by the spin chuck 102.

The operations of the rotative driving mechanism 103 and the lift mechanism 104, and the opening and closing of the valves 107V, 108V, 109V are controlled by the system controller 155.

When the wafer W is to be cleaned in the cleaning unit 22a or 22b, the system controller 155 first controls the lift mechanism 104 to move up the spin chuck 102 so that the upper portion of the spin chuck 102 is located above the upper edge of the cup 101. The wafer W subjected to the bevel etching process in the bevel etching unit 21a or 21b is loaded into the cleaning unit by the retractable arm 41 or the retractable arm 42 of the transport robot TR (see FIGS. 4(a) to 4(c)), and mechanically held by the chuck pins 102e with the center of the wafer W coinciding with the center axis of the rotation shaft 102a.

Thereafter, the system controller 155 controls the lift mechanism 104 to move down the spin chuck 102. Thus, the wafer W held by the spin chuck 102 is surrounded by the cup 101a. Then, the system controller 155 controls the rotative driving mechanism 103 to rotate the wafer W held by the spin chuck 102. The rotation speed of the wafer W is, for example, 500 rpm. Gas is exhausted from the cup 101 through the air outlet port 106a by the exhauster system not shown.

In this state, the valves 107V, 108V are opened under the control of the system controller 155. Thus, the rinse liquid and the cleaning liquid are discharged toward the wafer W from the nozzle 107 and the treatment liquid outlet port 102d, respectively. The rinse liquid and the cleaning liquid supplied to the surfaces of the wafer W spread toward the peripheral edge of the wafer W by a centrifugal force. Thus, the entire lower surface of the wafer W is cleaned.

The rinse liquid and the cleaning liquid are spun off laterally of the wafer W by the centrifugal force, and flows over the interior of the cup 101a and the upper surface of the treatment liquid guide plate 101d down into the treatment liquid collection vessel 105. The rinse liquid and the cleaning liquid are introduced into the collection tank not shown through the liquid drain port 105a. Since gas is exhausted from the cup 101, mist of the cleaning liquid and the like can be expelled through the air outlet port 106a thereby to be prevented from scattering out of the cup 101.

After this process is performed for a predetermined period, the valve 108V is closed and the valve 109V is opened under the control of the system controller 155. Thus, the rinse liquid is discharged toward the lower surface of the wafer W from the treatment liquid outlet port 102d. The supply of the rinse liquid to the upper surface of the wafer W from the nozzle 107 is continued. Thus, the cleaning liquid is rinsed away from the lower surface of the wafer W. After this process is continued for a predetermined period (e.g., one minute), the valves 107V and 109V are closed under the control of the system controller 155 to stop the supply of the rinse liquid to the wafer W.

Subsequently, the system controller 155 controls the rotative driving mechanism 103 to rotate the wafer W held by the spin chuck 102, for example, at about 2000 rpm. Thus, the rinse liquid remaining on the wafer W is mostly spun off for drying. Thereafter, the system controller 155 controls the rotative driving mechanism 103 to stop the rotation of the wafer W.

In turn, the system controller 155 controls the lift mechanism 104 to move up the spin chuck 102 so that the wafer W held by the spin chuck 102 is located above the upper edge of the cup 101. Then, the wafer W is released from the chuck pins 102e.

Subsequently, the treated wafer W is unloaded by the retractable arm 42 or the retractable arm 41 of the transport robot TR. Thus, the cleaning process for the cleaning of the single wafer W is completed.

In this embodiment, the cup 101 is fixed, and the spin chuck 102 is adapted to be moved up and down by the lift mechanism 104. Alternatively, the spin chuck 102 may vertically be fixed, and the cup 101 may be adapted to be moved up and down. Even in this case, the spin base 102b can be located above the upper edge of the cup 101, so that the wafer W can be loaded and unloaded by the retractable arm 41 or the retractable arm 42.

Figure 11:
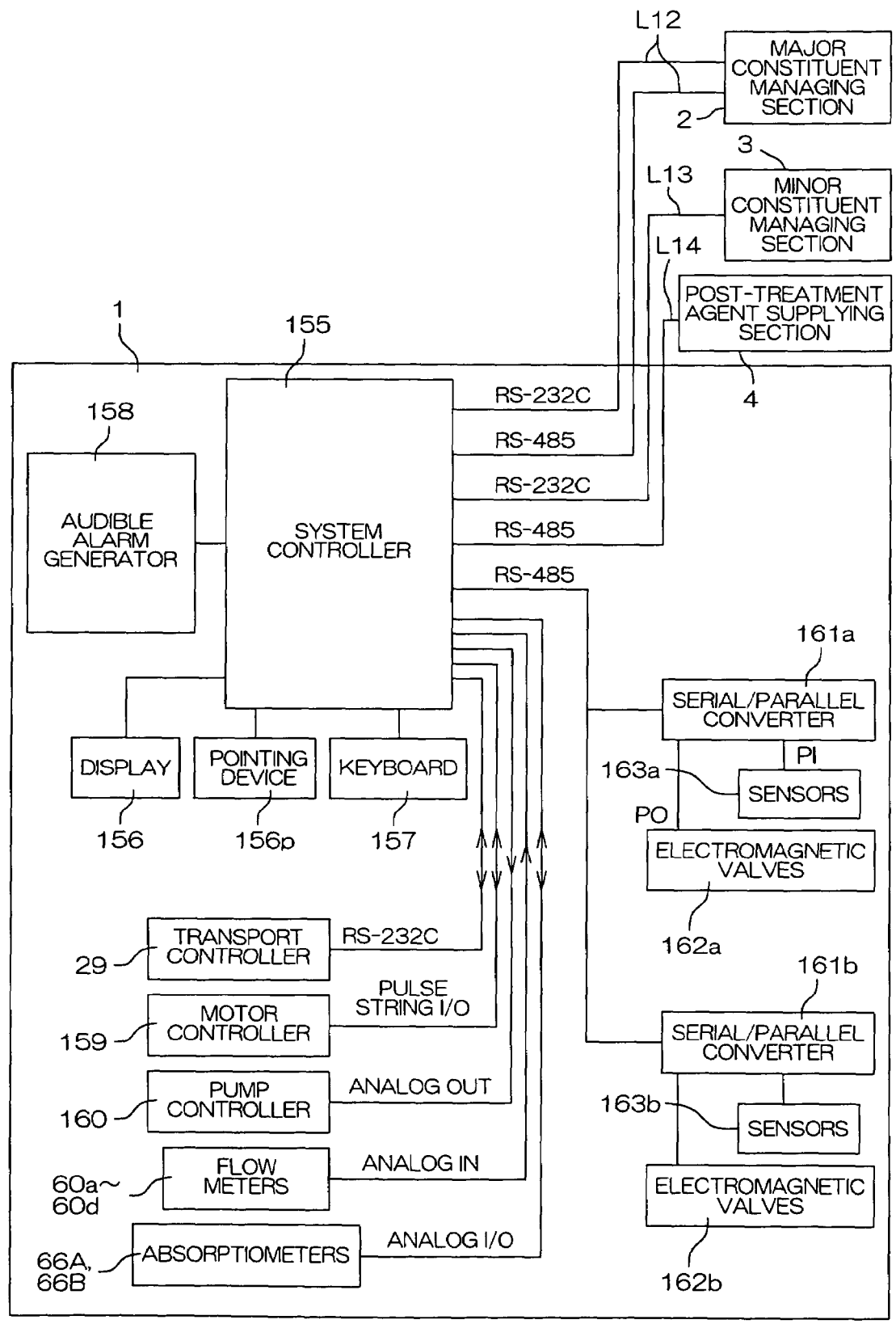
FIG. 11 is a block diagram illustrating the construction of a control system for the wafer treating section.

FIG. 11 is a block diagram illustrating the construction of a control system for the wafer treating section 1.

Hardware of the system controller 155 includes a central processing unit (CPU) having a processing capability of 10 MIPS (million instructions per second) or more, a semiconductor memory having a storage capacity of 10 Mbytes or more, a magnetic memory, RS-232C compatible serial ports, RS-485 compatible serial ports, and a plurality of printed circuit boards. The magnetic memory may be, for example, a hard disk (HD) incorporated in a hard disk drive (HDD), or a flexible disk (FD) to be inserted in a flexible disk drive (FDD).

Software employed in the system controller includes an operating system, and application programs which are at least partly described in a high-level language.

The system controller 155 is connected to a display 156, a keyboard 157, a pointing device (e.g., a mouse) 156p, so that the operator can interact with the system controller 155 for inputting and outputting information. The system controller 155 is further connected to an audible alarm generator 158. When a certain event occurs (e.g., when the residual amount of the copper supply source for supplying copper ions to the plating liquid is reduced below a predetermined level as will be described later), an audible alarm is given, and information on the alarm is displayed on the display 156.

The system controller 155 is connected to the transport controller 29 (see FIG. 2), the major constituent managing section 2 and the minor constituent managing section 3 via the RS-232C compatible serial ports by cables. The system controller 155 is further connected to a motor controller 159 by a pulse-string input/output cable, and connected to a pump controller 160, the flow meters 60a to 60d and the absorptiometers 66A and 66B by analog signal cables.

Thus, the system controller 155 is capable of controlling motors provided in the rotative driving mechanisms 45, 88, 103 (see FIGS. 8 to 10), for example, via the motor controller 159, and controlling the operations of the pumps P1 to P4 (see FIG. 6) in the plating section 12, for example, via the pump controller 160. Signals indicative of the flow rates from the flow meters 60a to 60d (see FIG. 6) are inputted as analog signals to the system controller 155. Further, the system controller 155 controls the operations of the absorptiometers 66A, 66B (e.g., light emission of the light emitting sections 68A, 68B) on an analog signal basis, and receives analog signals outputted from the light receiving sections 69A, 69B.

The system controller 155 is further connected to the major constituent managing section 2, the post-treatment agent supplying section 4 and serial/parallel converters 161a, 161b via the RS-485 compatible serial ports by cables. In FIG. 11, only two serial/parallel converters 161a, 161b are shown, but the system controller 155 may be connected to a greater number of serial/parallel converters (e.g., 48 serial/parallel converters).

Figure 12:
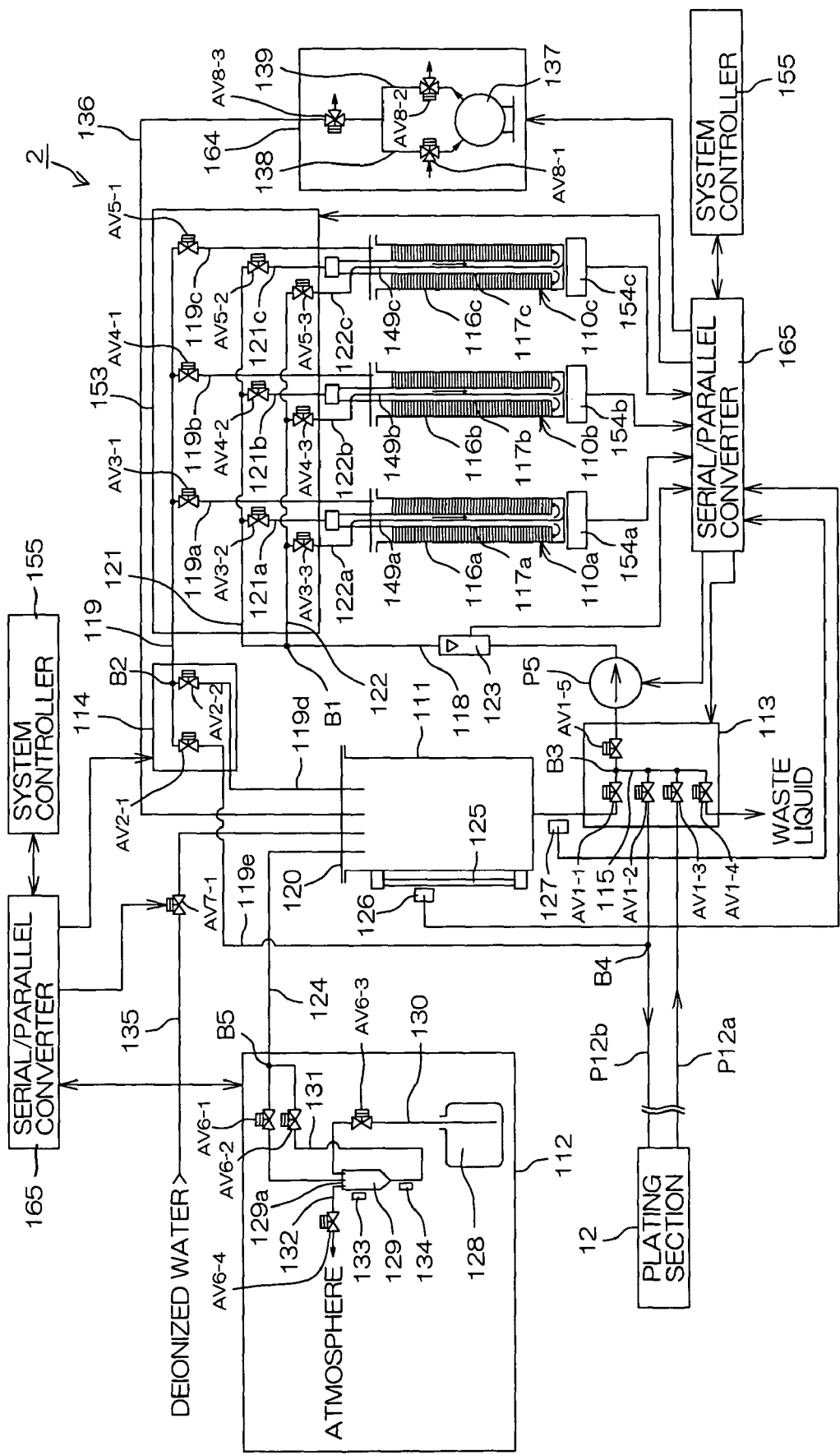
FIG. 12 is a schematic diagram illustrating the construction of a major constituent managing section.

The serial/parallel converters 161a and 161b are respectively connected to electromagnetic valves 162a and 162b, and sensors 163a and 163b (e.g., the temperature sensor 70, the electromagnetic conductivity meter 71, the ultrasonic level meter 72) via parallel cables. The electromagnetic valves 162a, 162b are capable of controlling air valves (e.g., the valves 91V, 100V, 107V). FIG. 12 is a schematic diagram illustrating the construction of the major constituent managing section 2.

The major constituent managing section 2 includes a plurality of copper dissolution tanks 110a to 110c (three copper dissolution tanks in this embodiment) for supplying copper ions to the plating liquid, a buffer container 111 for supplying a replacement liquid to some of the copper dissolution tanks 110a to 110c not in use, and an undiluted replacement liquid supplying section 112 for supplying an undiluted replacement liquid as a source of the replacement liquid to the buffer container 111.

The copper dissolution tanks 110a to 110c each have a cylindrical sealed structure having a closed bottom and a generally vertical axis. The copper dissolution tank 110a to 110c is placed on a weight meter 154a to 154c, which is adapted to measure the total weight of the copper dissolution tank 110a to 110c including its content.

The copper dissolution tank 110a to 110c includes an outer pipe 116a to 116c constituting a side wall thereof, and an inner pipe 117a to 117c provided in the outer pipe 116a to 116c. An inner space of the inner pipe 117a to 117c communicates with a space defined between the outer pipe 116a to 116c and the inner pipe 117a to 117c in a lower portion of the copper dissolution tank 110a to 110c.

The buffer container 111 has a cover 120, and is virtually sealed. Upper and lower portions of the buffer container 111 are connected in communication with each other by a vertically extending bypass pipe 125. A constant volume check sensor 126 is provided at a predetermined height on a lateral side of the bypass pipe 125 for detecting the presence or absence of liquid at this predetermined height within the bypass pipe 125.

The liquid (e.g., the replacement liquid) is allowed to freely flow between the buffer container 111 and the bypass pipe 125, so that a liquid surface level in the buffer container 111 is virtually equal to a liquid surface level in the bypass pipe 125. Thus, the presence or absence of the liquid at the predetermined height in the buffer container 111 can be detected by the constant volume check sensor 126.

One end of a circulation pipe 118 is connected to the bottom of the buffer container 111 for communication between the circulation pipe 118 and the buffer container 111. The other end of the circulation pipe 118 is branched into branch circulation pipes 121, 122 at a branch point B1. The branch circulation pipe 121 is further branched into branch circulation pipes 121a to 121c, while the branch circulation pipe 122 is further branched into branch circulation pipes 122a to 122c.

The branch circulation pipes 121a to 121c are respectively connected to upper portions of the inner pipes 117a to 117c of the copper dissolution tanks 110a to 110c. The branch circulation pipes 122a to 122c are respectively connected to liquid outlet pipes 149a to 149c provided in the copper dissolution tanks 110a to 110c. Valves AV3-2, AV4-2 and AV5-2 are provided in the branch circulation pipes 121a, 121b and 121c, respectively. Valves AV3-3, AV4-3 and AV5-3 are provided in the branch circulation pipes 122a, 122b and 122c, respectively.

Branch circulation pipes 119a to 119c are connected in communication with the spaces between the outer pipes 116a to 116c and the inner pipes 117a to 117c, respectively. Valves AV3-1, AV4-1 and AV5-1 are provided in the branch circulation pipes 119a, 119b and 119c, respectively. The branch circulation pipes 119a to 119c are connected to one end of a circulation pipe 119. The other end of the circulation pipe 119 is branched into branch circulation pipes 119d and 119e at a branch point B2.

The valves AV3-1, AV3-2, AV3-3, AV4-1, AV4-2, AV4-3, AV5-1, AV5-2, AV5-3 are collectively disposed in a copper dissolution tank channel switching section 153.

The branch circulation pipe 119d extends into the buffer container 111 through the cover 120 (through a piping port formed in the cover 120). A valve AV2-2 is provided in the branch circulation pipe 119d.

One end of a channel switching pipe 115 is connected to the circulation pipe 118 at a branch point B3. Liquid can be drained from the other end of the channel switching pipe 115. A valve AV1-4 is provided at the other end of the channel switching pipe 115. The plating liquid transport pipes P12a and P12b are connected to the channel switching pipe 115 via valves AV1-3 and AV1-2, respectively.

A valve AV1-1 is provided in the circulation pipe 118 between the buffer container 111 and the branch point B3. A valve AV1-5, a pump P5 and a flow meter 123 are provided in the circulation pipe 118 between the branch point B3 and the branch point B1 in this order from the branch point B3. An emptiness check sensor 127 is provided on a lateral side of the circulation pipe 118 in the vicinity of the buffer container 111 (between the buffer container 111 and the branch point B3). The emptiness check sensor 127 is capable of detecting the presence or absence of the liquid at the height of the emptiness check sensor 127 in the circulation pipe 118. This makes it possible to determine whether or not the buffer container 111 is empty.

The valves AV1-1, AV1-2, AV1-3, AV1-4, AV1-5 are collectively disposed in an inlet-side main channel switching section 113.

The branch circulation pipe 119e is connected in communication with the plating liquid transport pipe P12b at a branch point B4. A valve AV2-1 is provided in the branch circulation pipe 119e. The valves AV2-1, AV2-2 are collectively disposed in an outlet-side main channel switching section 114.

The undiluted replacement liquid supplying section 112 includes an undiluted replacement liquid tank 128 containing the undiluted replacement liquid, and a measure cup 129 for dispensing a predetermined amount of the undiluted replacement liquid. The undiluted replacement liquid may be, for example, concentrated sulfuric acid. The measure cup 129 has a cover 129a, and is virtually sealed. The measure cup 129 has a bottom having an inverted cone shape. An undiluted replacement liquid transport pipe 130 extends from an upper portion of the measure cup 129 into a bottom portion of the undiluted replacement liquid tank 128. A valve AV6-3 is provided in the undiluted replacement liquid transport pipe 130.

The undiluted replacement liquid supplying section 112 is connected to the buffer container 111 by an undiluted replacement liquid supply pipe 124. The undiluted replacement liquid supply pipe 124 extends to the upper portion of the measure cup 129 through the cover 129a. One end of an undiluted replacement liquid transport pipe 131 is connected to the bottom of the measure cup 129. The other end of the undiluted replacement liquid transport pipe 131 is connected to the undiluted replacement liquid supply pipe 124 at a branch pipe B5. A valve AV6-1 is provided in the undiluted replacement liquid supply pipe 124 between the branch point B5 and the measure cup 129. A valve AV6-2 is provided in the undiluted replacement liquid transport pipe 131.

A leak pipe 132 extends through the cover 129a into the measure cup 129. A valve AV6-4 is provided in the leak pipe 132 outside the measure cup 129. By opening the valve AV6-4, the internal pressure of the measure cup 129 can be set at the atmospheric pressure.

A constant volume check sensor 133 is provided at a predetermined height on a lateral side of the measure cup 129 for detecting the presence or absence of liquid at this predetermined height in the measure cup 129. An emptiness check sensor 134 is provided on a lateral side of the undiluted replacement liquid transport pipe 131 in the vicinity of the measure cup 129. The emptiness check sensor 134 is capable of detecting the presence or absence of liquid at the height of the emptiness check sensor 134 in the undiluted replacement liquid transport pipe 131. This makes it possible to determine whether or not the measure cup 129 is empty.

A deionized water supply pipe 135 extends through the cover 120 to be connected in communication with the buffer container 111. Thus, deionized water can be supplied to the buffer container 111 from a deionized water supply source not shown. A valve AV7-1 is provided in the deionized water supply pipe 135.

An air inlet/outlet pipe 136 is introduced into the buffer container 111 through the cover 120. An air pump 137 is connected to an end of the air inlet/outlet pipe 136 opposite from the buffer container 111. A three-way valve AV8-3 is provided in the air inlet/outlet pipe 136. The three-way valve AV8-3 is adapted to selectively establish air communication between the buffer container 111 and the air pump 137 and between the buffer container 111 and the atmosphere.

The air pump 137 has an air exhaustion pipe 138 and an air supply pipe 139. The air inlet/outlet pipe 136 is connected in communication with the air exhaustion pipe 138 and the air supply pipe 139. A three-way valve AV8-1 is provided in the air exhaustion pipe 138, while a three-way valve AV8-2 is provided in the air supply pipe 139. The three-way valves AV8-1, AV8-2, AV8-3 are collectively disposed in a pressure increasing/reducing section 164.

Air can be supplied into the buffer container 111 by establishing communication between the atmosphere and the air pump 137 by the three-way valve AV8-1 and between the air pump 137 and the air inlet/outlet pipe 136 by the three-way valve AV8-2, and actuating the air pump 137. Gas can be exhausted from the buffer container 111 by establishing communication between the air inlet/outlet pipe 136 and the air pump 137 by the three-way valve AV8-1 and between the air pump 137 and the atmosphere by the three-way valve AV8-2, and actuating the air pump 137.

The opening and closing of the valve AV7-1 and the valves in the inlet-side main channel switching section 113, the outlet-side main channel switching section 114, the copper dissolution tank channel switching section 153, the undiluted replacement liquid supplying section 112 and the pressure increasing/reducing section 164, and the operations of the pump P5 and the air pump 137 are controlled by the system controller 155 of the wafer treating section 1 via the serial/parallel converter 165. Output signals of the constant volume check sensors 126, 133, the emptiness check sensors 127, 134, the flow meter 123 and the weight meters 154a to 154c are inputted to the system controller 155 of the wafer treating section 1 via the serial/parallel converter 165.

Figure 13:
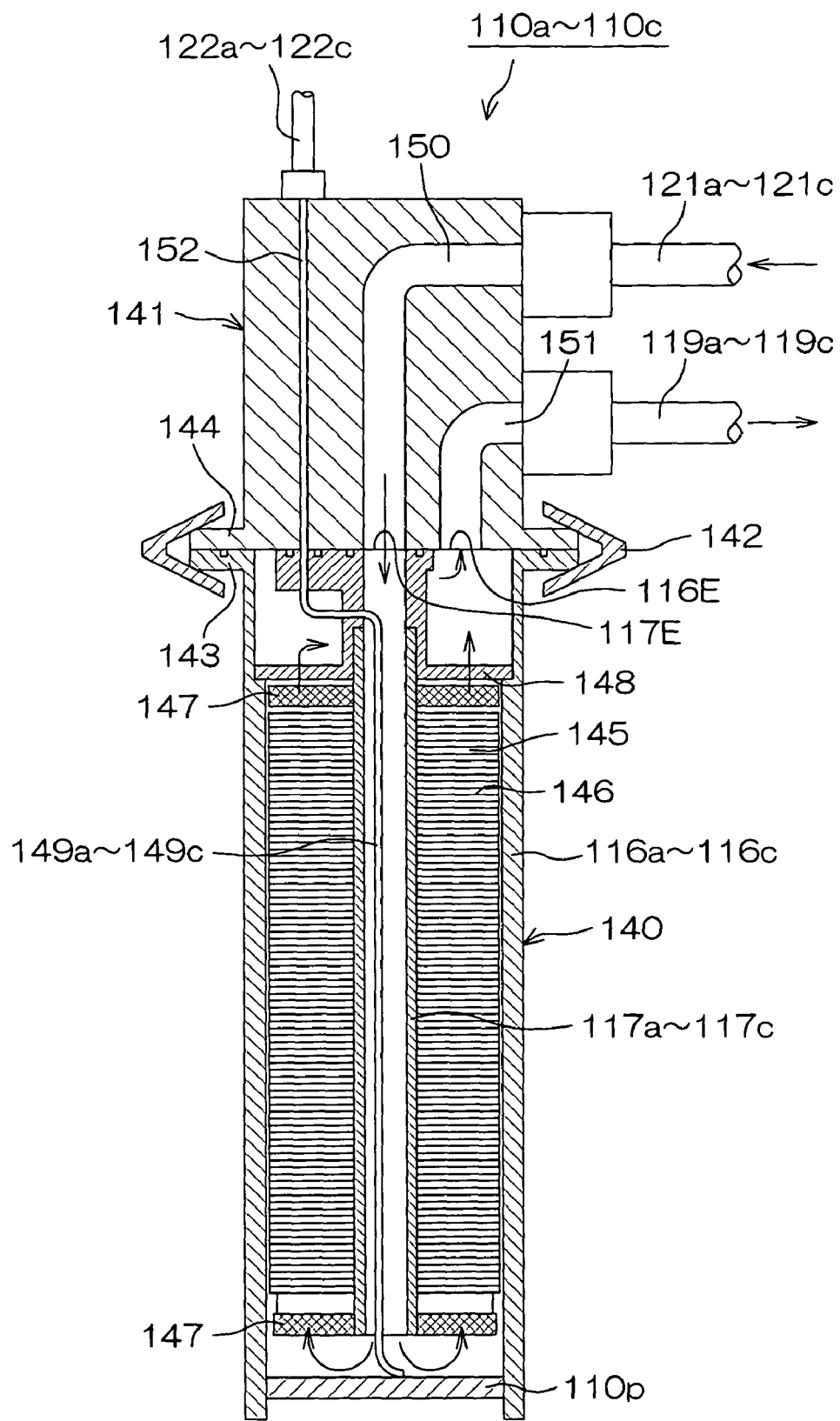
FIG. 13 is a schematic sectional view illustrating the construction of a copper dissolution tank.

FIG. 13 is a schematic sectional view illustrating the common construction of the copper dissolution tanks 110a to 110c.

The copper dissolution tanks 110a to 110c each include a cartridge 140 including the outer pipe 116a to 116c and the inner pipe 117a to 117c, and a connection member 141 for piping the cartridge 140.

One end (a lower end in FIG. 13) of the outer pipe 116a to 116c is closed by a bottom plate 110P. The connection member 141 is connected to an end of the cartridge 140 opposite from the bottom plate 110P. An end of the inner pipe 117a to 117c adjacent to the connection member 141 serves as a plating liquid inlet port 117E. A plating liquid outlet port 116E is provided at an end of a space between the inner pipe 117a to 117c and the outer pipe 116a to 116c adjacent to the connection member 141.

The cartridge 140 and the connection member 141 respectively have flanges 143 and 144. The flanges 143 and 144 are detachably fixed by an annular fixture 142. The cartridge 140 can be replaced by detaching the fixture 142.

A plurality of copper mesh members 146 each prepared by weaving a copper wire into a mesh sheet and having a doughnut shape as seen in plan are stacked longitudinally of the cartridge 140 in the annular space 145 defined between the outer pipe 116a to 116c and the inner pipe 117a to 117c. The plating liquid flows from a lower side to an upper side longitudinally of the cartridge 140 in the annular space 145. That is, a plating liquid flow path extends in the direction of the stack of the copper mesh members 146. The copper mesh members 146 function as a copper ion supply source which is dissolved in the plating liquid for supplying copper ions to the plating liquid.

The copper mesh members 146 each have an outer diameter generally equal to the inner diameter of the outer pipe 116a to 116c, and an inner diameter generally equal to the outer diameter of the inner pipe 117a to 117c. Therefore, the copper mesh members 146 are disposed across the plating liquid flow path in the annular space 145, so that the plating liquid cannot bypass the copper mesh members 146 but flows through voids of the copper mesh members 146. Thus, the copper mesh members 146 are efficiently dissolved in the plating liquid.

Annular filters 147 are respectively provided at an inlet (lower end) and an outlet (upper end) of the annular space 145 so as to hold the stacked copper mesh members therebetween. The filters 147 are capable of removing contaminants from the liquid flowing through the annular space 145. A filter press 148 for spacing the filter 147 a predetermined distance from the end of the cartridge 140 adjacent to the connection member 141 is provided in an end portion of the annular space 145 adjacent to the connection member 141. The liquid in the annular space 145 can freely flow through through-holes formed in the filter press 148.

A liquid outlet pipe 149a to 149c is disposed longitudinally of the cartridge 140 in the cartridge 140. The liquid outlet pipe 149a to 149c is introduced into the inner pipe 117a to 117c through a space defined by the filter press 148 so as to bypass the copper mesh members 146.

The branch circulation pipe 121a to 121c, the branch circulation pipe 119a to 119c and the branch circulation pipe 122a to 122c are connected to the connection member 141. Communication channels 150, 151, 152 are provided in the connection member 141. The branch circulation pipe 121a to 121c is connected in communication with the inner pipe 117a to 117c through the communication channel 150 and the plating liquid inlet port 117E. The branch circulation pipe 119a to 119c is connected in communication with the annular space 145 through the communication channel 151 and the plating liquid outlet port 116E. The branch circulation pipe 122a to 122c is connected in communication with the liquid outlet pipe 149a to 149c through the communication channel 152.

Figure 14:
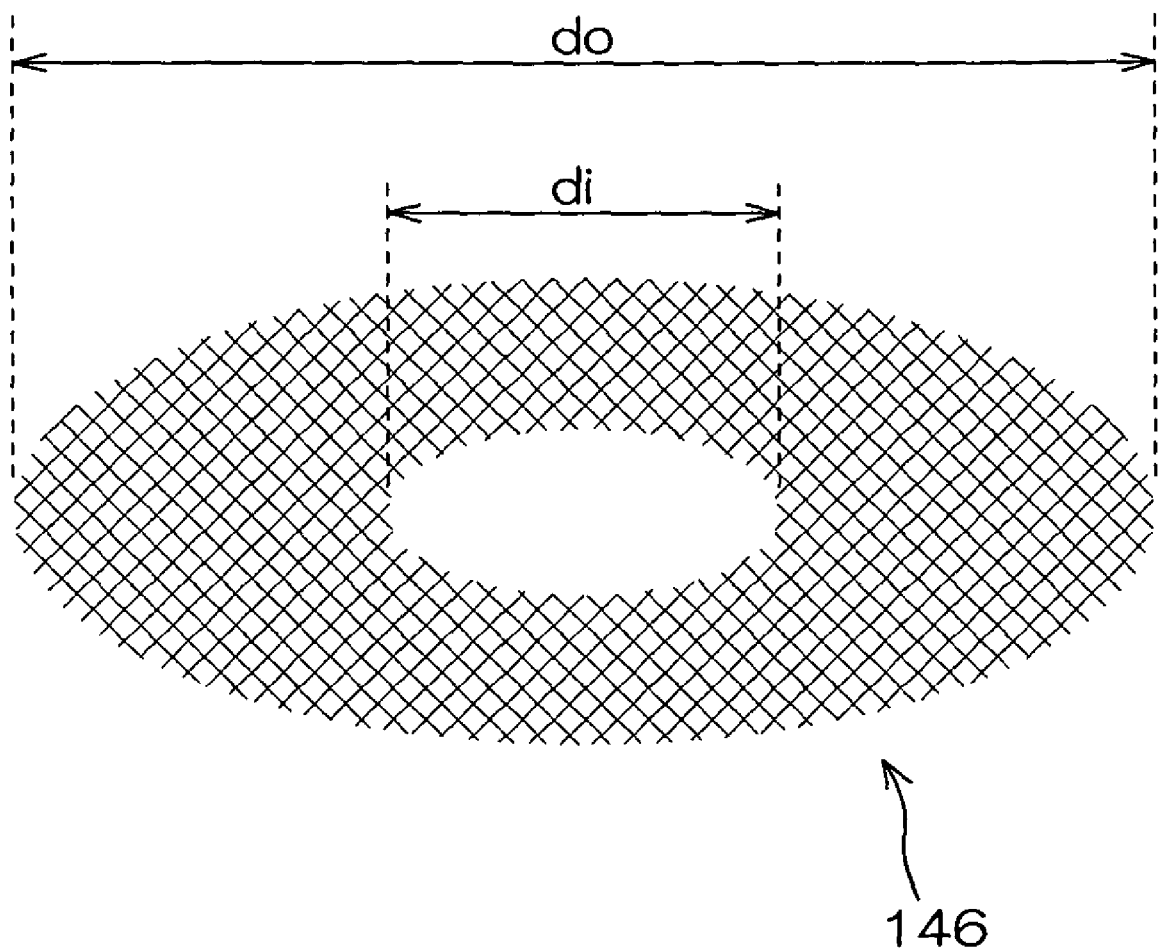
FIG. 14 is a schematic perspective view of a copper mesh member.

FIG. 14 is a schematic perspective view of the copper mesh member 146.

The copper mesh member 146 has, for example, an outer diameter $d_0$ of 120 mm, and an inner diameter $d_i$ of 30 mm.

Where the copper mesh member 146 is regarded as a sheet, the copper mesh member 146 has an area of about 100 cm². The copper mesh member 146 has, for example, a mesh number of 5, i.e., has five copper wires per inch. Before use (before the dissolution in the plating liquid is started), the copper mesh member 146 has, for example, a total copper wire surface area of about 120 cm², and a weight of about 27 g.

The single cartridge 140 includes, for example, 225 copper mesh members 146 stacked one on another in the annular space 145. Before use, the total weight of the copper mesh members 146 is, for example, about 6 kg.

The feature of the copper mesh members 146 will be explained in comparison with a case where an aggregate of spherical copper granules is employed as the copper ion supply source.

Where the spherical copper granules (hereinafter referred to simply as "granules") each have a radius $r_1$, the granules each have a surface area $s_1$ of $4\pi r_1^2$ and a volume $v_1$ of $4/3 \pi r_1^3$. Where the granules each have a radius $r_2=r_1/2$, the granules each have a surface area $s_2$ of $4\pi r_2^2=4\pi(r_1/2)^2=s_1/4$ and a volume $v_2$ of $4/3\pi r_2^3=4/3\pi(r_1/2)^3=v_1/8$.

Next, the number of granules per unit volume is calculated on the assumption that the granules are closely arranged along the respective coordinate axes in the Cartesian coordinate system. Where the granules each have the radius $r_1$, the number $n_1$ of granules per unit length of each coordinate axis is $1/r_1$, and the number $N_1$ of granules per unit volume is $n_1^3$. Further, the total surface area $S_1$ of the granules per unit volume is $n_1^3 \times s_1$, and the net volume $V_1$ of the granules per unit volume is $n_1^3 \times v_1$.

On the other hand, where the granules each have the radius $r_2=r_1/2$, the number $n_2$ of granules per unit length of each coordinate axis is $1/r_2$, and the number $N_2$ of granules per unit volume is $n_2^3=1/r_2^3=1/(r_1/2)^3=8/r_1^3=8N_1$. Similarly, the total surface area $S_2$ of the granules per unit volume is $n_2^3 \times s_2 = 2n_1^3 s_1 = 2S_1$, and the net volume $V_2$ of the granules per unit volume is $n_2^3 \times v_2 = n_1^3 v_1 = V_1$.

That is, if the radius of the granules is reduced to one half, the number of the granules per unit volume is increased to eight times, and the total surface area of the granules per unit volume is doubled. However, the net volume of the granules per unit volume is unchanged. Therefore, even if the radius of the granules is reduced to one half to reduce the total weight to one half, the total surface area of the granules is unchanged. Since the rate of the leaching of copper ions into the plating liquid (the copper ion supplying capability) depends on the total surface area of the granules, the weight reduction can be achieved without changing the copper ion supplying capability by the reduction of the radius of the granules. This is also true where the copper granules are in a chip form such as of a rectangular cuboid shape.

Next, a pressure loss caused by the granules when the granules are present in the copper dissolution tank 110a to 110c will be discussed. Provided that the liquid (e.g., plating liquid) flowing through the copper dissolution tank is a non-compressive fluid, a pressure loss $\Delta P_1$ of the plating liquid flowing at a constant liquid flow rate is represented by $kL/SR^2$, wherein k is a constant, L is the length of the flow path in the space in which the granules are present, S is a cross sectional area, and R is the radius of the granules.

Where the radius of the granules are reduced to one half to reduce the net volume of the granules to one half, the length L of the space in which the granules are present is reduced to one half, and a pressure loss $\Delta P_2$ is represented by $kL_2/(S \cdot R_2^2)=k(L/2) \cdot 1/(S(R/2)^2)=2\Delta P_1$.

That is, where the total weight of the spherical copper granules employed as the copper supply source is reduced to one half by reducing the radius of the granule to one half in order to achieve the weight reduction while maintaining the copper ion supplying capability, the pressure loss is doubled. Thus, the pressure loss is increased inversely proportionally to the weight of the copper granules. Therefore, where the spherical copper granules are employed as the copper supply source, the reduction of the weight and the reduction of the pressure loss cannot simultaneously be achieved.

Next, the case where the stacked copper mesh members 146 are employed as the copper supply source will be discussed. It is herein assumed that the copper wire (hereinafter referred to simply as "wire") has a cylindrical shape. Where the radius of the wire is reduced to one half with the mesh number unchanged, the volume of the wire is reduced to one fourth with virtually no change in the total length of the wire constituting the single copper mesh member 146. Therefore, the weight of the single copper mesh member 146 is reduced to about one fourth, and the thickness of the single copper mesh member 146 is reduced to about one half. Further, the total surface area of the wire of the single copper mesh member 146 is reduced to about one half. The end face areas of the wire are herein ignored.

It is herein assumed that the copper mesh members 146 are disposed in a space having a predetermined length extending along the plating liquid flow path in the annular space 145 of the copper dissolution tank 110a to 110c. As compared with the case where the wire has a radius $r_3$, the number of the copper mesh members 146 is doubled and the total weight of the copper mesh members 146 is reduced to one half where the wire has a radius of $r_4=r_3/2$. That is, if the radius of the wire is reduced to one half where the copper mesh members 146 are closely disposed in the space having the predetermined length extending along the plating liquid flow path, the total weight of the copper mesh members 146 can be reduced to one half with no change in the total surface area of the wire of the copper mesh members. This is just as in the case where the spherical copper granules are employed as the copper supply source.

Next, a pressure loss caused by the copper mesh members 146 when the copper mesh members 146 are present in the copper dissolution tank 110a to 110c will be discussed. In this case, even if the radius of the wire is reduced to one half with the mesh number unchanged, the total area of mesh openings of the copper mesh members 146 through which the plating liquid or the like flows is not reduced but increased correspondingly to the thinning of the wire. Since the length of the space extending along the flow path in which the copper mesh members 146 are present is unchanged, the pressure loss is unchanged or rather reduced. This is far different from the case where the spherical copper granules are employed.

As compared with the spherical copper granules, the mesh copper members provide a greater total volume of voids when they are closely arranged. Therefore, the absolute value of the pressure loss can be reduced. Particularly where the mesh openings of the copper mesh members 146 are aligned in the stacking direction, the pressure loss is further reduced. For the reduction of the pressure loss, the void ratio of the space in which the copper mesh members 146 are disposed is preferably not smaller than 30% (the ratio of the total volume of the copper mesh members 146 to the volume of the space is preferably not greater than 70%). By changing the mesh number of the copper mesh members 146, the void ratio can be changed for controlling the initial void ratio.

In the case of the copper granules, the pressure loss is increased, as the dissolution of the copper granules in the plating liquid proceeds. To avoid such an event, granules having a reduced size should be removed from the flow path in a certain manner. In the case of the copper mesh members 146, on the contrary, the woven wire structure thereof is unchanged with a smaller change in void ratio, even if the dissolution of the copper mesh members 146 in the plating liquid proceeds. Therefore, a change in pressure loss is small.

When the mesh structure is no longer maintained due to further dissolution of the copper mesh members 146 in the plating liquid, broken wire pieces may flow out. Such wire pieces are trapped by the filter 147.

The copper mesh members 146 may each be prepared by stamping a rectangular or square mesh sheet by a die having a predetermined configuration.

Figure 15:
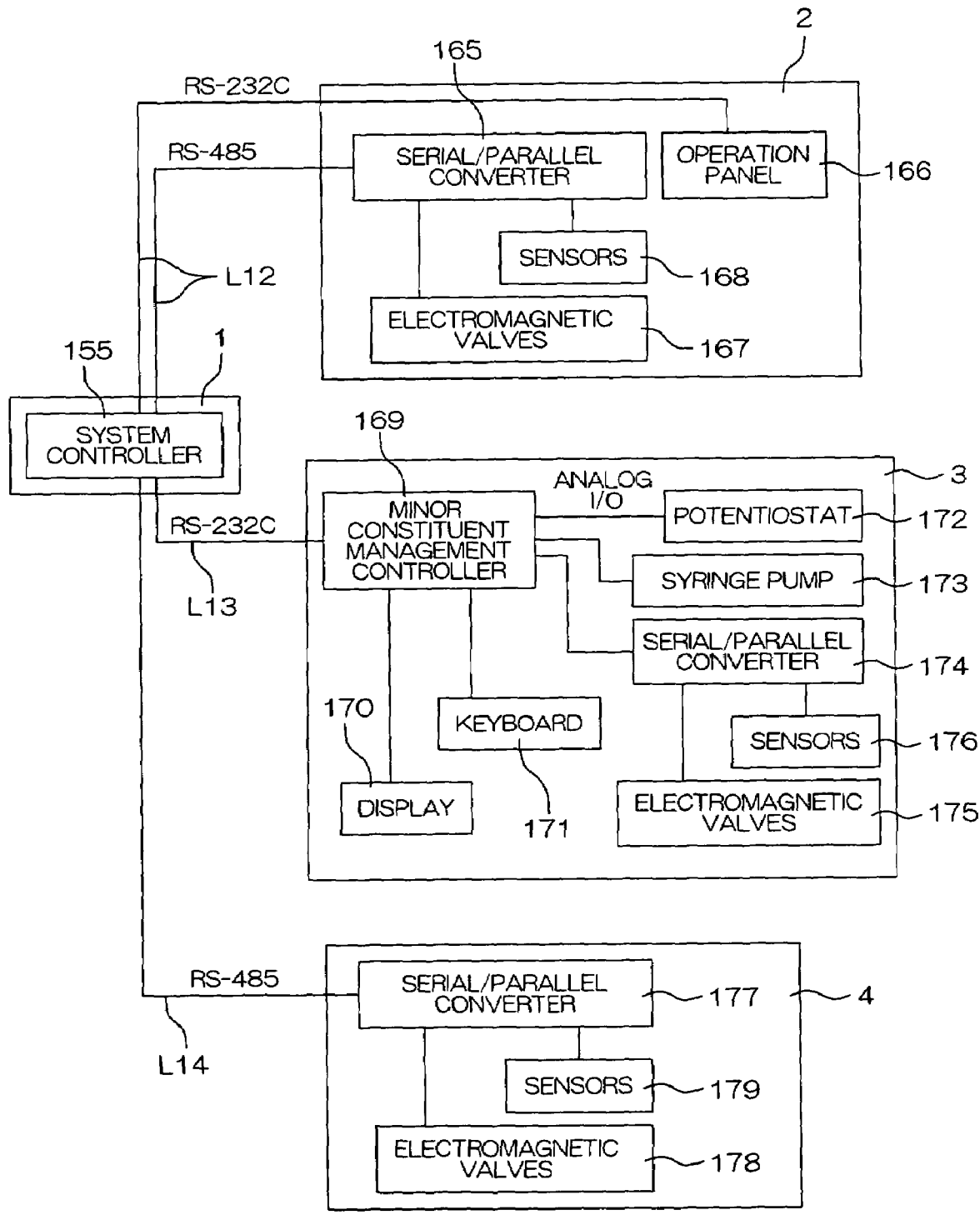
FIG. 15 is a block diagram illustrating the construction of control systems for the major constituent managing section, a minor constituent managing section and a post-treatment agent supplying section.

FIG. 15 is a block diagram illustrating the construction of control systems for the major constituent managing section 2, the minor constituent managing section 3 and the post-treatment agent supplying section 4.

The major constituent managing section 2 includes the serial/parallel converter 165 and an operation panel 166. The system controller 155 provided in the wafer treating section 1 is connected to the serial/parallel converter 165 via an RS-485 compatible cable, and connected to the operation panel 166 via an RS-232C compatible cable.

Electromagnetic valves 167 and sensors 168 (e.g., the constant volume check sensors 126, 133, the emptiness check sensors 127, 134 and the weight meters 154a to 154c) are connected in parallel to the serial/parallel converter 165. The electromagnetic valves 167 are capable of controlling, for example, air valves (e.g., the valve AV1-1 and the like). The operator can input and output information on the major constituent managing section 2 by means of the operation panel 166.

The minor constituent managing section 3 includes a minor constituent management controller 169, so that a control operation can be performed independently of the system controller 155 provided in the wafer treating section 1. The minor constituent management controller 169 is connected to the system controller 155 via an RS-232C compatible cable.

A display 170, a keyboard 171, a potentiostat (power source) 172, a syringe pump 173 and a serial/parallel converter 174 are connected to the minor constituent management controller 169. The display 170 and the keyboard 171 permit the operator to interact with the minor constituent management controller 169 for inputting and outputting information.

The syringe pump 173 is capable of adding an indicator and the like dropwise to a sampled plating liquid when the concentrations of the minor constituents of the plating liquid are measured. Further, the syringe pump 173 is capable of quantitatively dispensing replenishment liquids in required amounts.

Electromagnetic valves 175 and sensors 176 (e.g., surface level sensors) are connected to the serial/parallel converter 174 by parallel cables. The magnetic valves 175 are capable of controlling, for example, air valves.

The post-treatment agent supplying section 4 includes a serial/parallel converter 177. The system controller 155 provided in the wafer treating section 1 is connected to the serial/parallel converter 177 via an RS-485 compatible cable. Electromagnetic valves 178 and sensors 179 are connected to the serial/parallel converter 177 by parallel cables. The electromagnetic valves 178 are capable of controlling, for example, air valves (e.g., the valves 93V, 108V).

With reference to FIGS. 12 and 13, an explanation will hereinafter be given to the operation of the major constituent managing section 2 during the plating process performed in the plating section 12.

Prior to the plating process, the system controller 155 determines which of the copper dissolution tanks 110a to 110c is to be used. One of the copper dissolution tanks 110a to 110c which contains the lightest set of copper mesh members 146 is used. The other copper dissolution tanks are not used, but reserved as spares.

The memory of the system controller 155 stores data of the net weights of the respective copper dissolution tanks 110a to 110c and the weights of the respective copper dissolution tanks 110a to 110c measured when the plating liquid is filled therein. The system controller 155 calculates the weight of the copper mesh members 146 in each of the copper dissolution tanks 110a to 110c on the basis of the output signals of the weight meters 154a to 154c.

It is herein assumed that the weight of the copper mesh members 146 in the copper dissolution tank 110a is judged to be the lightest and sufficient to supply copper ions to the plating liquid for a predetermined period. In this case, a flow channel is established for circulating the plating liquid through the plating section 12 and the copper dissolution tank 110a under the control of the system controller 155. More specifically, the valves AV1-3, AV1-5, AV3-2, AV3-1, AV2-1 are opened, and the other valves are closed.

In this state, the pump P5 is actuated under the control of the system controller 155. Thus, the plating liquid is supplied into the copper dissolution tank 110a from the plating section 12, flows through the voids of the copper mesh members 146 in the copper dissolution tank 110a, and returned into the plating section 12.

In the copper dissolution tank 110a, the copper mesh members 146 are deprived of electrons by trivalent iron ions in the plating liquid, whereby the trivalent iron ions are reduced to divalent iron ions. Copper ions are leached into the plating liquid from the copper mesh members 146 deprived of the electrons. This reaction proceeds even if no black film is formed on the copper mesh members, unlike in the case where a dissolvable copper anode is employed.

Thus, the copper ions are supplied from the copper mesh members 146, while being consumed on the lower surface of the wafer W during the plating process. The trivalent iron ions are reduced to the divalent iron ions in the vicinity of the copper mesh members 146, while the divalent iron ions are oxidized into trivalent iron ions in the vicinity of the anode 76.

Where the concentrations of the copper ions and the divalent and trivalent iron ions in the plating liquid are not within the predetermined concentration ranges, the plating process cannot properly be performed with a poorer capability of filling the holes or grooves formed in the surface of the wafer W with copper. Therefore, the concentrations of the copper ions and the divalent and trivalent iron ions in the plating liquid should be kept at the predetermined concentration levels (within the predetermined concentration ranges). That is, the amount of the copper ions consumed on the lower surface of the wafer W should substantially be equalized with the amount of the copper ions leaching out of the copper mesh members 146, and the amount of the divalent iron ions occurring in the vicinity of the anode 76 should substantially be equalized with the amount of the trivalent iron ions occurring in the vicinity of the copper mesh members 146.

The copper ion consumption rate at which the copper ions are consumed in the plating liquid by the plating is determined by the operation statuses of the respective plating units 20a to 20d. The copper ion leaching rate at which the copper ions leach into the plating liquid from the copper mesh members 146 in the copper dissolution tank 110a to 110c is determined by the total surface area of the wires of the copper mesh members 146 in contact with the plating liquid (hereinafter referred to simply as "the total surface area of the copper mesh members 146"), the flow rate of the plating liquid flowing through the voids of the copper mesh members 146 and the concentration of the iron ions in the plating liquid.

The copper mesh members 146 each have a predetermined initial shape. It is considered that the wires of the copper mesh members 146 are dissolved to be reduced in size as having a shape conformable to the initial shape. Therefore, the total surface area of the copper mesh members 146 can be determined, if the total volume (total weight) of the copper mesh members 146 is known. The weight of the copper mesh members 146 can be determined on the basis of the output signal of the weight meter 154a to 154c as described above.

The flow rate of the plating liquid flowing into the copper dissolution tank 110a to 110c may be employed as the flow rate of the plating liquid flowing through the voids of the copper mesh members 146.

Therefore, the system controller 155 determines the pumping rate of the pump P5 on the basis of the operation statuses of the plating units 20a to 20d, the total surface area of the copper mesh members 146 determined on the basis of the output signal of the weight meter 154a to 154c, and the output signal of the absorptiometer 66B. The pumping rate of the pump P5 is regulated at a predetermined level on the basis of the feedback of the output signal of the flow meter 123 to the system controller 155. Under such control, the concentration of copper ions in the plating liquid can be kept virtually constant.

If the system controller 155 judges that the weight of the copper mesh members 146 in the copper dissolution tank 110a is reduced below a predetermined level (one half the weight of the copper mesh members 146 before the start of the dissolution), the plating liquid is caused to further flow into another of the copper dissolution tanks (herein assumed to be the copper dissolution tank 110b) containing the second lightest set of copper mesh members 146. More specifically, the valves AV4-1 and AV4-2 are opened in addition to the valves already opened under the control of the system controller 155.

Thus, the plating liquid is circulated through the plating liquid container 55 of the plating section 12 and the copper dissolution tanks 110a and 110b. As the dissolution of the copper mesh members 146 in the plating liquid proceeds, the total surface area of the copper mesh members 146 is reduced and, hence, the capability of supplying copper ions to the plating liquid is correspondingly reduced. Even in this case, the concentration of copper ions in the plating liquid can be kept virtually constant by controlling the pumping rate of the pump P5 and supplying copper ions to the plating liquid from the copper mesh members 146 of the copper dissolution tank (copper dissolution tank 110b) at which the circulation of the plating liquid has just started.

If the system controller 155 judges that the weight of the copper mesh members 146 in the copper dissolution tank 110b is reduced below one half the weight of the copper mesh members 146 measured before the start of the dissolution (below the predetermined level) by further dissolution of the copper mesh members 146, the plating liquid is caused to further flow into the copper dissolution tank 110c under the control of the system controller 155. At this time, almost all the copper mesh members 146 in the copper dissolution tank 110a are consumed. Therefore, the cartridge 140 of the copper dissolution tank 110a is replaced with a new cartridge 140 (which contains a set of copper mesh members 146 having the predetermined initial weight).

Since the three copper dissolution tanks 110a to 110c are provided in connection to the major constituent managing section 2, a sufficient amount of copper ions can constantly be supplied to the plating liquid even during the replacement of the cartridge 140.

Next, an explanation will be given to an operation to be performed by the major constituent managing section 2 when the plating process is not performed in the plating section 12. If the plating liquid is circulated through the plating liquid container 55 and any of the copper dissolution tanks 110a to 110c when the plating process is performed in none of the plating units 20a to 20d, the concentration of copper ions in the plating liquid is increased beyond the proper concentration range. This is because copper ions are continuously supplied to the plating liquid from the copper mesh members 146, though the copper ions are not consumed.

If the circulation of the plating liquid is stopped, the surfaces of the copper mesh members 146 in the copper dissolution tanks 110a to 110c are irreversibly deteriorated. Therefore, the surface of the wafer W cannot properly be copper-plated with a poorer capability of filling the fine holes or grooves thereof with copper, when the plating process is performed again in any of the plating units 20a to 20d by resuming the circulation of the plating liquid.

To cope with this, the plating liquid in the copper dissolution tanks 110a to 110c is replaced with the replacement liquid for prevention of the increase in the concentration of the copper ions in the plating liquid and the deterioration of the surfaces of the copper mesh members 146 when the plating process is not performed in the plating section 12. It is herein assumed that the plating liquid in the copper dissolution tank 110a is replaced with the replacement liquid.

The deterioration of the surfaces of the copper mesh members 146 may occur within several hours. On the other hand, the plating process is often resumed immediately after the completion of the plating process in the plating section 12 due to a change in a production plan. In this case, if the plating liquid in the copper dissolution tank 110a is already replaced with the replacement liquid, the replacement liquid in the copper dissolution tank 110a should be replaced again with the plating liquid. This may lead to reduction in productivity. Therefore, the plating liquid in the copper dissolution tank 110a is replaced with the replacement liquid after a lapse of a 2- to 3-hour standby period from the completion of the plating process in the plating section 12.

If the plating process is less likely to be resumed immediately after the completion of the plating process in the plating section 12, the plating liquid in the copper dissolution tank 110a may be replaced with the replacement liquid immediately after the completion of the plating process.

First, the pump P5 is stopped and all the valves in the major constituent managing section 2 are closed under the control of the system controller 155. In turn, the system controller 155 controls the pressure increasing/reducing section 164 to supply air into the buffer container 111. Thus, the internal pressure of the buffer container 111 is increased. Then, the valves AV2-2, AV3-1, AV3-2, AV1-5, AV1-2 are opened under the control of the system controller 155. Thus, the plating liquid is transported from the copper dissolution tank 110a into the plating liquid container 55 in the plating section 12.

The system controller 155 calculates the weight of the plating liquid in the copper dissolution tank 110a on the basis of the output signal of the weight meter 154a, and continues the aforesaid liquid transportation until it is judged that almost all the plating liquid is expelled from the copper dissolution tank 110a. When the system controller 155 judges that almost all the plating liquid is expelled from the copper dissolution tank 110a, the valve AV3-3 is opened for a predetermined period under the control of the system controller 155. Thus, the plating liquid remaining in the bottom portion of the copper dissolution tank 110a is virtually completely discharged through the liquid outlet pipe 149a.

Subsequently, the valve AV7-1 is opened under the control of the system controller 155 to introduce deionized water into the buffer container 111. When it is judged on the basis of the output signal of the constant volume check sensor 126 that the surface of deionized water rises to reach the predetermined level in the buffer container 111, the valve AV7-1 is closed under the control of the system controller 155. Thus, a predetermined amount of deionized water is introduced in the buffer container 111.

In turn, all the valves in the major constituent managing section 2 are closed, and air is exhausted from the buffer container 111 by the pressure increasing/reducing section 164 under the control of the system controller 155. Thus, the internal pressure of the buffer container 111 is reduced. Then, the valves AV6-1, AV6-3 are opened under the control of the system controller 155. Thus, the internal pressure of the measure cup 129 is also reduced, so that the undiluted replacement liquid is sucked into the measure cup 129 from the undiluted replacement liquid tank 128 through the undiluted replacement liquid transport pipe 130.

During this period, the system controller 155 monitors the output signal of the constant volume check sensor 133. If it is judged that the surface of the undiluted replacement liquid in the measure cup 129 reaches the predetermined level, the valves AV6-3, AV6-1 are closed under the control of the system controller 155. Thus, a predetermined volume of the undiluted replacement liquid is dispensed in the measure cup 129.

Then, the valves AV6-2, AV6-4 are opened under the control of the system controller 155. Thus, the internal pressure of the measure cup 129 is set at the atmospheric pressure, so that the undiluted replacement liquid is transported from the measure cup 129 into the buffer container 111 having a lower internal pressure through the undiluted replacement liquid transport pipe 131 and the undiluted replacement liquid supply pipe 124 and mixed with the deionized water in the buffer container 111. When it is judged on the basis of the output signal of the emptiness check sensor 134 that the measure cup 129 is empty, the valves AV6-2, AV6-4 are closed under the control of the system controller 155.

Thus, the replacement liquid which has a predetermined concentration (e.g., 10% sulfuric acid aqueous solution) is prepared in the buffer container 111.

In turn, the system controller 155 controls the valve AV8-3 to establish communication between the buffer container 111 and the atmosphere. Thus, the internal pressure of the buffer container 111 is set at the atmospheric pressure. Thereafter, the valves AV1-1, AV1-5, AV3-2, AV3-1, AV2-2 are opened and the pump P5 is actuated under the control of the system controller 155. At this time, the pump P5 is operated only for a predetermined period, or operated until it is judged on the basis of the output signal of the weight meter 154a that the copper dissolution tank 110a is filled with the replacement liquid. Thereafter, the pump P5 is stopped, and all the valves in the major constituent managing section 2 are closed under the control of the system controller 155.

Then, the valves AV1-1, AV1-4 are opened under the control of the system controller 155, whereby the replacement liquid remaining in the buffer container 111 is drained. At this time, the system controller 155 controls the pressure increasing/reducing section 164 to increase the internal pressure of the buffer container 111, whereby the replacement liquid is forced out. Thus, the plating liquid in the copper dissolution tank 110a is replaced with the replacement liquid. The copper dissolution tanks 110b, 110c which are not used in the plating process are filled with the replacement liquid in substantially the same manner as described above.

Thus, the increase in the concentration of copper ions in the plating liquid and the deterioration of the surfaces of the copper mesh members 146 can be prevented. Therefore, when the plating process is performed again in any of the plating units 20a to 20d by circulating the plating liquid through the plating section 12 and the copper dissolution tank 110a (110b, 110c), the surface of the wafer W can properly be copper-plated with the fine holes and grooves thereof properly filled with copper. Even if a small amount of the replacement liquid of the sulfuric acid aqueous solution is mixed in the plating liquid, the replacement liquid does not adversely affect the plating liquid because sulfuric acid is a supporting electrolyte of the plating liquid.

In the replacement of the plating liquid with the replacement liquid, deionized water may be introduced into and discharged from the copper dissolution tank 110a before the introduction of the replacement liquid after the plating liquid is discharged from the copper dissolution tank 110a. The introduction of the deionized water into the copper dissolution tank 110a can be achieved in substantially the same manner as the introduction of the replacement liquid into the copper dissolution tank 110a, except that only deionized water is introduced into the buffer container 111 from the deionized water supply source (but the undiluted replacement liquid is not introduced after the introduction of the deionized water). In this case, the amount of the plating liquid mixed in the replacement liquid can be reduced.

Next, an explanation will be given to how to replace the cartridge 140 of the copper dissolution tank 110a to 110c.

When the weight of the copper mesh members 146 remaining in the copper dissolution tank 110a to 110c is reduced to a predetermined level (e.g., virtually zero) by the dissolution of the copper mesh members 146, the cartridge 140 of the copper dissolution tank 110a to 110c should be replaced with a cartridge 140 which contains a set of copper mesh members 146 having the predetermined initial weight.

When the plating process is performed in any of the plating units 20a to 20d, as described above, the system controller 155 monitors the output signals of the weight meters 154a to 154c and calculates the weight of the copper mesh members 146 in each of the copper dissolution tanks 110a to 110c. When it is judged that the weight of the copper mesh members 146 in any of the copper dissolution tanks 110a to 110c (herein assumed to be the copper dissolution tank 110*a*) is reduced below the predetermined weight, the system controller 155 controls the audible alarm generator 158 (see FIG. 11) to generate an audible alarm, and controls the display 156 to display information on the alarm.

A command is applied to the system controller 155 automatically or by the operator by means of the keyboard 157 or the pointing device 156*p* to stop the pump P5 under the control of the system controller 155. Thus, the circulation of the plating liquid is stopped. Then, the plating liquid is expelled from the copper dissolution tank 110*a* and deionized water is introduced into and drained from the copper dissolution tank 110*a* in the same manner as when the plating liquid is replaced with the replacement liquid in the copper dissolution tank 110*a*. Thus, the inside of the copper dissolution tank 110*a* is cleaned.

In turn, one of the other two available copper dissolution tanks 110*b*, 110*c* which contains a lighter set of copper mesh members (herein assumed to be the copper dissolution tank 110*b*) is selected. Then, the replacement liquid is expelled from the copper dissolution tank 110*b* under the control of the system controller 155 in the same manner as when the plating liquid is expelled. When this operation is performed, however, the valve AV1-2 is closed and the valve AV1-4 is opened under the control of the system controller 155 to drain the expelled replacement liquid.

Subsequently, the plating liquid is circulated through the copper dissolution tank 110*b* and the plating liquid container 55 of the plating section 12 under the control of the system controller 155 in the same manner as when the copper dissolution tank 110*a* is used.

In the aforesaid operation, copper ions are not supplied to the plating liquid during a period from the stop of the circulation of the plating liquid to the resumption of the circulation. Even if the plating process is continuously performed on the wafer W during this period, the concentration of copper ions and the ratio of the divalent and trivalent iron ions in the plating liquid are not steeply changed. This is because the plating liquid container 55 (see FIG. 6) is capable of containing the plating liquid in a great amount. Therefore, the characteristics of the copper film formed by the plating are virtually unchanged, even if the plating process is continuously performed on the wafer W during the aforesaid period. However, the plating liquid should continuously be circulated through the plating liquid container 55 and the plating cup 56*a* to 56*d*.

When the operator replaces the old cartridge 140 (currently attached to the copper dissolution tank 110*a*) with a new cartridge 140 (containing a set of copper mesh members 146 having the predetermined initial weight), the circulation of the plating liquid is stopped for safety. Therefore, the operator applies a command to the system controller 155 by means of the display 156 and the pointing device 156*p* to stop the circulation of the plating liquid. In response thereto, the pump P5 is stopped under the control of the system controller 155. Thus, the circulation of the plating liquid through the plating section 12 and the respective copper dissolution tanks 110*a* to 110*c* is stopped.

Then, the operator removes the fixture 142 of the copper dissolution tank 110*a*, and replaces the old cartridge 140 with the new cartridge 140. After the replacement is completed, the operator gives information on the completion of the replacement to the system controller 155 by means of the display 156 and the pointing device 156*p*. In response thereto, the pump P5 is actuated under the control of the system controller 155. Thus, the circulation of the plating liquid through the plating section 12 and the copper dissolution tank 110*b* is resumed.

Even in this case, the plating process can be performed in any of the plating units 20*a* to 20*d* during the halt of the circulation of the plating liquid. That is, the cartridge 140 can be replaced even when the plating process is performed in any of the plating units 20*a* to 20*d*. This ensures excellent operation efficiency.

Even when the copper dissolution tank 110*a* is in use, the spare copper dissolution tanks 110*b*, 110*c* are kept connected to the major constituent managing section 2. Therefore, when the copper dissolution tank 110*a* requires the replacement of the cartridge 140, the copper dissolution tank 110*a* can immediately be switched to the copper dissolution tank 110*b* (110*c*), which is in turn ready for use. Since the weight of the copper mesh members 146 accommodated in each of the spare copper dissolution tanks 110*b*, 110*c* is sufficiently great, ample time is given for the replacement of the cartridge 140 of the copper dissolution tank 110*a*.

Thus, the replacement of the copper mesh members 146 (copper supply source) can be achieved by replacing the cartridge 140 containing the consumed copper mesh members 146 with the cartridge 140 containing new copper mesh members 146. This obviates the need for directly handling the copper mesh members 146 in the clean room. That is, the copper supply source (the copper mesh members 146, the cartridge 140) can easily be replaced without contamination of the surroundings (the inside of the clean room and the substrate treating apparatus 10).

Since there is no need to form the black film prior to the plating process as described above, the need for warming up the apparatus after the replacement of the cartridge 140 can be obviated. Therefore, the capacity utilization rate of the substrate treating apparatus 10 (plating apparatus) can be increased.

Figure 16:
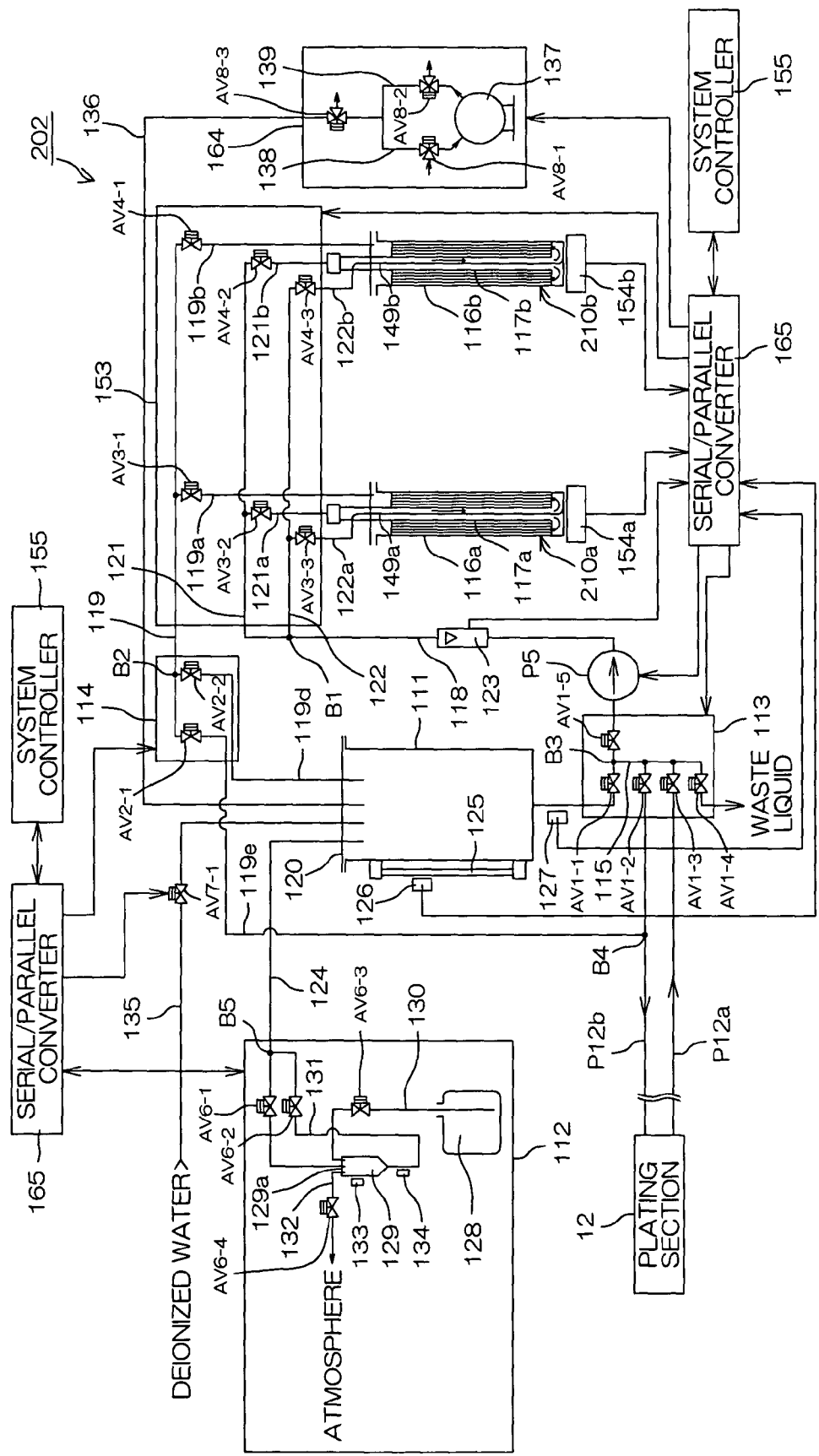
FIG. 16 is a schematic diagram illustrating a major constituent managing section provided in a substrate treating apparatus according to a second embodiment of the present invention.

FIG. 16 is a schematic diagram illustrating a major constituent managing section 202 provided in a substrate treating apparatus according to a second embodiment of the present invention. The substrate treating apparatus according to the second embodiment has substantially the same construction as the substrate treating apparatus 10 according to the first embodiment except for the major constituent managing section 202. The major constituent managing section 202 is employed instead of the major constituent managing section 2 in the substrate treating apparatus 10 having the construction shown in FIG. 1. In FIG. 16, components of the major constituent managing section 202 corresponding to those of the major constituent managing section 2 shown in FIG. 12 are denoted by the same reference characters, and no explanation will be given thereto.

The major constituent managing section 202 includes at least one copper dissolution tank (two copper dissolution tanks 210*a*, 210*b* in this embodiment) which contains a copper supply source. While the plating liquid is circulated through the plating liquid container 55 and the copper dissolution tank 210*a* or the copper dissolution tank 210*b*, copper ions can be supplied to the plating liquid.

When the plating process is not performed in the plating section 12, the plating liquid in the copper dissolution tanks 210*a*, 210*b* is replaced with the replacement liquid by means of the undiluted replacement liquid supplying section 112, the buffer container 111 and the like in the major constituent managing section 202, as in the major constituent managing section 2. Thus, the deterioration of the surfaces of the copper supply sources contained in the copper dissolution tanks can be prevented.

Figure 17:
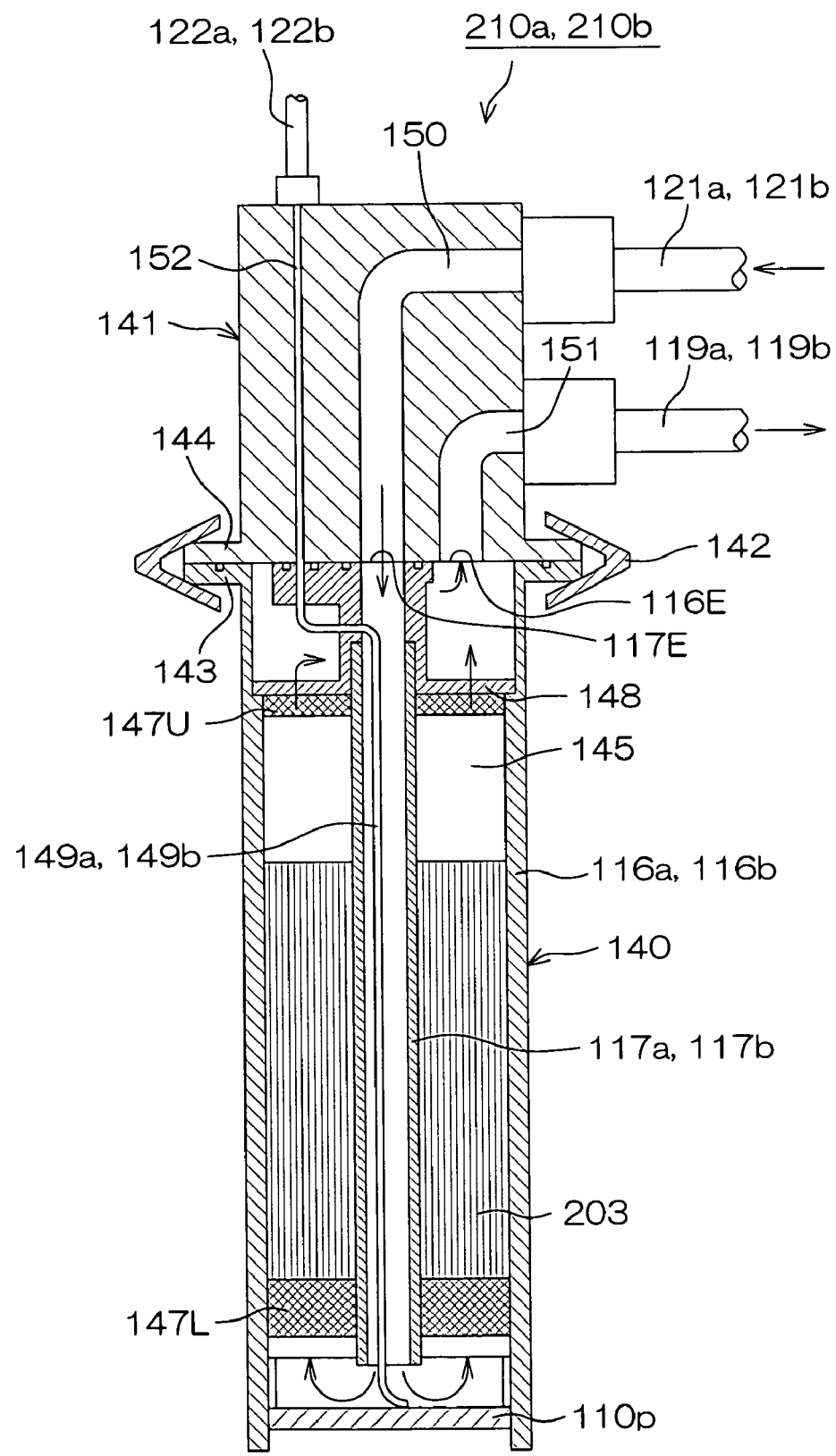
FIG. 17 is a schematic sectional view taken along a center axis of a copper dissolution tank provided in the major constituent managing section shown in FIG. 16.

FIG. 17 is a sectional view taken along a center axis of the copper dissolution tank 210*a*, 210*b*. In FIG. 17, components of the copper dissolution tank 210a, 210b corresponding to those of the copper dissolution tank 110a to 110c are denoted by the same reference characters, and no explanation will be given thereto.

Like the copper dissolution tank 110a to 110c, the copper dissolution tank 210a, 210b includes a cartridge 140 and a connection member 141. Instead of the copper mesh members 146 of the copper dissolution tank 110a to 110c, straight copper pipes 203 each having an interior wall surface and an exterior wall surface are contained as the copper supply source in the cartridge 140. The copper pipes 203 each have a length which is slightly greater than one half the length of the cartridge 140, and are disposed longitudinally of the cartridge 140. Therefore, the interior and exterior wall surfaces of the copper pipes 203 extend along the flow path of the plating liquid.

Annular filters 147L and 147U are provided at an inlet (lower end) and an outlet (upper end) of an annular space 145. The copper pipes 203 are disposed between the filters 147L and 147U. The filters 147L, 147U each include, for example, fluororesin mesh members stacked one on another. The lower filter 147L has a greater thickness than the upper filter 147U, and is capable of diffusing the plating liquid introduced into the annular space 145. The lower filter 147L may have a coarse mesh (for example, having a mesh opening size of about 5 mm). The upper filter 147U has a finer mesh so that contaminants can be removed from the liquid flowing through the annular space 145.

Figure 18:
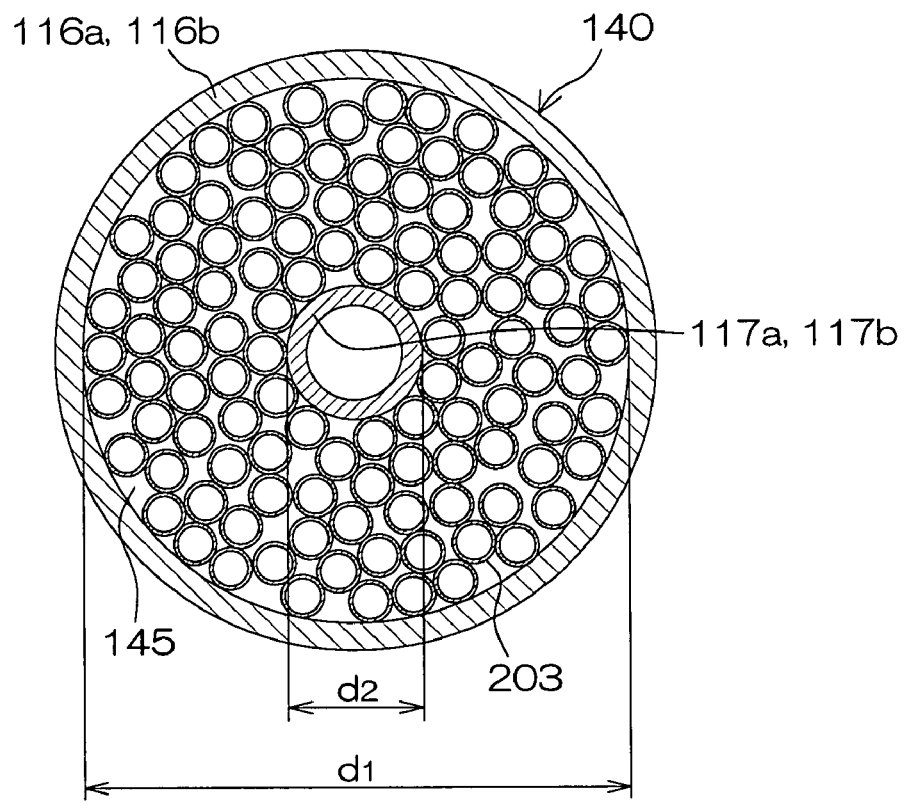
FIG. 18 is a schematic sectional view taken perpendicularly to the length of a cartridge of the copper dissolution tank shown in FIG. 17.

FIG. 18 is a schematic sectional view taken perpendicularly to the length of the cartridge 140.

Usable as the copper pipes 203 are copper pipes of JIS-8A-L type, for example. In this case, the copper pipes 203 each have an outer diameter of about 9.52 mm, a uniform wall thickness of about 0.76 mm, and a length of about 300 mm before use (before the dissolution of the copper pipes 203 in the plating liquid is started). Therefore, the copper pipes 203 each have a surface area of about 165 cm$^2$, and a weight of about 56.4 g before use.

An outer pipe 116a, 116b of the cartridge 140 has, for example, an inner diameter $d_1$ of about 120 mm. An inner pipe 117a, 117b of the cartridge 140 has, for example, an outer diameter $d_2$ of about 30 mm. Where the annular space 145 of the cartridge 140 has such dimensions, 110 copper pipes 203 can closely be arranged in the annular space 145 of the cartridge 140. In this case, the copper pipes 203 totally have a weight of about 6.2 kg and a surface area of about 18150 cm$^2$, for example, before use.

Therefore, the surface area of the copper pipes 203 per unit weight is about 2900 cm$^2$/kg. Since the plurality of copper pipes 203 are provided in the cartridge, the copper pipes 203 totally have an increased surface area and, hence, an increased copper ion supplying capability.

The copper pipes 203 may be composed of 99.9% to 99.9999% pure copper, for example.

Where the copper mesh members 146 (see FIG. 14) are each prepared by stamping a greater-size copper mesh sheet, some of wires constituting the copper mesh member 146 are cut obliquely with respect to the length thereof, thereby having sharp edges. Therefore, the copper mesh members 146 should carefully be handled and, in addition, there is a possibility that the interior wall surface of the cartridge 140 is damaged by the sharp edges. On the contrary, the copper pipes 203 have no sharp edge to be brought into opposed relation to the interior wall surface. Therefore, the copper pipes 203 can easily be handled, and there is no possibility that the interior wall surface of the cartridge 140 is damaged by the copper pipes 203. Since the copper pipes 203 are prepared by rolling or the like, no stamping chip is generated.

Next, an explanation will be given to the feature of the copper pipes 203 in comparison with the aggregate of the spherical copper granules employed as the copper ion supply source.

The single copper pipe 203 having the aforesaid dimensions is equivalent in weight to a spherical copper granule (hereinafter referred to simply as "granule") having a diameter of 8 mm, and has a surface area which is three times that of the granule. Where the copper pipes 203 are equivalent in total surface area to the granules, the total weight of the copper pipes 203 is not greater than one third the total weight of the granules. That is, the use of the copper pipes 203 allows for weight reduction to facilitate the replacement of the cartridge 140.

The copper pipes 203 having the afore said dimensions each have an inner diameter of about 8 mm. The annular space 145 in which the copper pipes 203 are closely arranged has a much greater void ratio than the annular space 145 in which the 8-mm diameter granules are closely arranged.

In the annular space 145 in which the copper pipes 203 are closely arranged, the plating liquid flows through inside spaces of the copper pipes 203 and spaces defined between the copper pipes 203 disposed in adjacent relation. These spaces extend longitudinally of the cartridge 140 (the copper dissolution tank 210a, 210b), i.e., along a plating liquid flow path defined where the copper pipes 203 are not present in the annular space. Therefore, the plating liquid can linearly flow without deflection. In the annular space 145 in which the 8-mm diameter granules are closely arranged, on the other hand, the plating liquid cannot flow linearly, but is frequently deflected.

In view of this, a pressure loss occurring when the plating liquid flows through the annular space 145 in which the copper pipes are closely arranged is much smaller than a pressure loss occurring when the plating liquid flows through the annular space 145 in which the 8-mm diameter granules are closely arranged. Therefore, the plating liquid can be fed without exerting a load on the pump P5. Since the plating liquid flows longitudinally of the copper pipes 203, the copper pipes 203 can generally uniformly be dissolved in the plating liquid.

Further, the pressure loss occurring due to the copper pipes 203 is reduced, as the thicknesses of the copper pipes 203 are reduced by the dissolution of the copper pipes 203. Therefore, there is no possibility that the load exerted on the pump P5 is increased by the dissolution of the copper pipes 203. In addition, an initial pressure loss is sufficiently small, so that a change in pressure loss due to the dissolution of the copper pipes 203 is negligible.

Next, an explanation will be given to a change in the surface area of the copper pipe 203 during the dissolution of the copper pipe 203. The end face areas of the copper pipe 203 having the aforesaid dimensions account for only a small percentage (about 0.3%) of the total surface area of the copper pipe 203. Further, the copper pipe 203 has a length sufficiently great as compared with the thickness thereof, and the percentage of a change in the length of the copper pipe due to the dissolution of the copper pipe is sufficiently small. Therefore, a change in the interior and exterior wall surface areas due to the change in the length is negligible. As the wall thickness is reduced by the dissolution, the area of the exterior wall surface is reduced, but the area of the interior wall surface is increased. As a result, the total area of the interior and exterior wall surfaces is virtually unchanged.

In view of this, the total surface area of the copper pipe 203 is virtually unchanged as long as the dissolution of the entire surface of the copper pipe uniformly proceeds. When the copper pipe 203 is dissolved to the extreme to have a shape which is no longer conformable to an initial shape thereof (e.g., a through-hole is formed in the wall of the copper pipe 203 due to slight variations in dissolution rate or variations in the initial thickness of the copper pipe 203), the total surface area of the copper pipe 203 is steeply reduced.

In other words, the copper pipe 203 is generally uniformly dissolvable over the entire surface thereof at a constant dissolution rate in the plating liquid, and the surface area of the copper pipe 203 is virtually unchanged from the start of the dissolution of the copper pipe 203 in the plating liquid till the copper pipe 203 is dissolved to have a shape which is no longer conformable to the initial shape thereof. The percentage of a change in the surface area of the copper pipe during this period is not greater than 25%. Therefore, the copper pipes 203 are capable of supplying copper ions to the plating liquid at a virtually constant rate until the copper pipes are completely dissolved. Thus, the plating process can properly be performed in the plating section 12.

With reference to FIG. 16, an explanation will be given to an operation to be performed by the major constituent managing section 202 when the plating process is performed in the plating section 12.

First, the plating liquid is circulated, under the control of the system controller 155, through the plating section 12 and one of the copper dissolution tanks judged to contain a set of copper pipes 203 having the lightest weight (herein assumed to be the copper dissolution tank 210a). More specifically, the pump P5 is actuated with the valves AV1-3, AV1-5, AV3-2, AV3-1, AV2-1 being opened and with the other valves being closed.

Thus, copper ions are supplied from the copper pipes 203, while copper ions are consumed on the lower surface of the wafer W in the plating unit 20a to 20d. Further, trivalent iron ions are reduced to divalent iron ions in the vicinity of the copper pipes 203, while divalent iron ions are oxidized to trivalent ion ions in the vicinity of the anode 76.

As described above, the total surface area of the copper pipes 203 is regarded virtually constant until the complete dissolution of the copper pipes 203, so that the capability of supplying copper ions to the plating liquid is virtually constant. Therefore, the plating liquid can be circulated through the copper dissolution tank 210a and the plating section 12 until almost all the copper pipes 203 in the copper dissolution tank 210a are consumed.

When it is judged on the basis of the output of the weight meter 154a that the weight of the copper pipes 203 in the copper dissolution tank 210a is reduced below a predetermined level (e.g., 10 to 20% of the initial weight), the flow channel of the copper dissolution tank 210a is closed under the control of the system controller 155. Subsequently, the plating liquid is circulated through the copper dissolution tank 210b and the plating section 12 under the control of the system controller 155. More specifically, the valves AV3-2, AV3-1 are closed and the valves AV4-2, AV4-1 are opened under the control of the system controller 155.

Thus, copper ions are supplied to the plating liquid from the copper pipes 203 in the copper dissolution tank 210b instead of the copper pipes 203 in the copper dissolution tank 210a. That is, there is no need to simultaneously use the two copper dissolution tanks (two of the copper dissolution tanks 210a to 210c) as in the main constituent managing section 2.

When the plating process is not performed in the plating section 12, the plating liquid in the copper dissolution tanks 210a, 210b are replaced with the replacement liquid in the same manner as in the major constituent managing section 2. Thus, the copper ion concentration of the plating liquid is prevented from increasing beyond the proper concentration range, while the surfaces of the copper pipes 203 are prevented from being irreversibly deteriorated. Therefore, copper ions can properly be supplied to the plating liquid from the copper pipes 203, when the plating process is resumed.

The cartridge 140 of the copper dissolution tank 210a (210b) containing the copper pipes 203 having a total weight lower than the predetermined level can be replaced with a new cartridge 140 containing a set of copper pipes 203 having the predetermined initial weight in the same manner as in the major constituent managing section 2. Therefore, the replacement of the copper supply source (copper pipes 203) can easily be achieved without contamination of the surroundings. Further, there is no need to form a black film prior to the plating process, thereby obviating the need for worming up after the replacement of the cartridge 140. Therefore, the capacity utilization rate of the substrate treating apparatus 10 (plating apparatus) can be increased.

While the embodiments of the present invention have thus been described, the invention may be embodied in any other way. In the first embodiment, for example, copper wires configured in a cord form, a wool-like crimped form (wires three-dimensionally entangled in a structure-sustainable form), a helical spring form or a spiral form (like a Japanese mosquito-repellent incense) may be employed as the copper supply source instead of the copper mesh members 146. Alternatively, a multiplicity of three-dimensionally bent copper strips may be filled as the copper supply source in the annular space 145.

Even in such a case, the copper supply source has a reduced weight and an increased void ratio, while the surface area thereof is kept at a predetermined level. In this case, a change in void ratio due to the dissolution of the copper supply source is reduced as compared with the case where the copper granules are employed. Unlike the copper mesh members 146, these copper supply sources can be prepared without generation of stamping chips and, hence, with no waste.

In the second embodiment, the copper pipes 203 have the same size (diameter, thickness and length), but may have different sizes.

Figure 19:
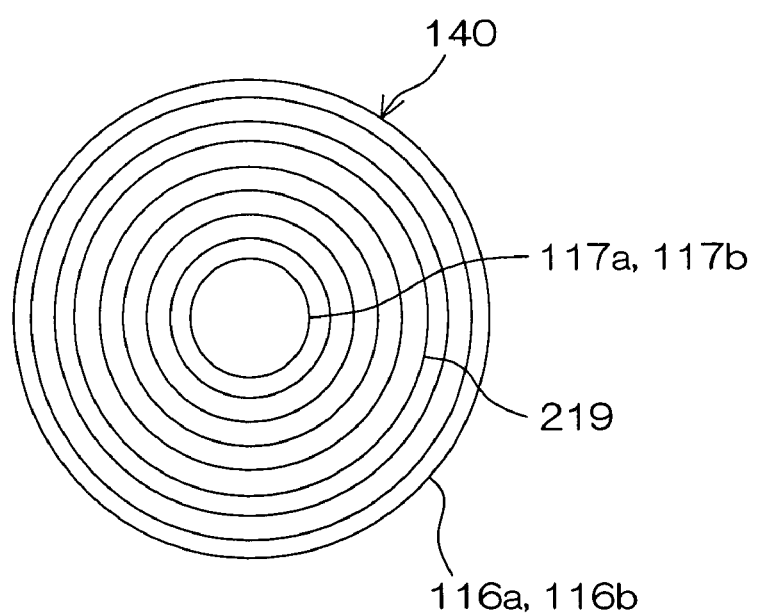
FIG. 19 is a schematic sectional view taken perpendicularly to the length of a cartridge in which copper pipes having different diameters are accommodated.

FIG. 19 is a schematic sectional view taken perpendicularly to the length of a cartridge 140 in which copper pipes having different diameters are contained. In this embodiment, a plurality of copper pipes 219 having different diameters are disposed coaxially about the center axis of the cartridge 140 in the cartridge 140. The copper pipes 219 have substantially the same thickness and length, and are dimensioned (have inner and outer diameters) so that opposed surfaces of the copper pipes 219 are generally equidistantly spaced. That is, the copper pipes 219 are each regarded as a parallel plate portion which is parallel to an inwardly or outwardly adjacent copper pipe.

In this embodiment, the plating liquid evenly flows through spaces defined between the copper pipes 219 longitudinally of the copper pipes 219, so that the copper pipes 219 are uniformly dissolved in the plating liquid. Therefore, the copper pipes 219 are each kept generally conformable to an initial shape thereof and the total surface area of the copper pipes 219 is virtually unchanged, until the complete dissolution of the copper pipes 219. Thus, the copper pipes 219 are capable of supplying copper ions to the plating liquid at a constant rate until the complete dissolution of the copper pipes 219. Spacers each having a small size such as not to hinder the flow of the plating liquid may be provided between the copper pipes 219 to hold the copper pipes 219 in the aforesaid spaced relation.

In the second embodiment, planar copper plates may be employed as the copper supply source instead of the copper pipes 203. In the case of the copper plates, the length and width thereof are each changed by a smaller percentage than the thickness thereof by the dissolution of the copper supply source in the plating liquid, and the end face areas thereof account for a small percentage of the total surface area thereof, as in the case of the tubular copper supply source (copper pipes 203). Accordingly, even if the thicknesses of the copper plates are reduced by the dissolution of the copper plates in the plating liquid, the total surface area is virtually unchanged. Therefore, the copper plates are capable of supplying copper ions to the plating liquid at a virtually constant rate until the copper plates are dissolved to have a shape which is no longer conformable to an initial shape thereof (e.g., a through-hole is formed therein).

By arranging the copper plates parallel to each other longitudinally of the cartridge 140 (the copper dissolution tank 210a, 210b) in the cartridge 140, a pressure loss of the plating liquid can be reduced, and the copper plates can uniformly be dissolved in the plating liquid.

FIGS. 20(*a*) to 20(*d*) are schematic sectional views each taken perpendicularly to the length of a cartridge 140 in which copper plates are contained.

A cartridge 140 shown in FIG. 20(*a*) contains a plurality of planar copper plates 220a. The copper plates 220a have substantially the same and uniform thickness, and are generally equidistantly arranged with opposed surfaces thereof spaced a predetermined distance. Some of the copper plates 220a disposed in non-interfering relation with the inner pipe 117a, 117b each have a length extending between interior surface portions of the outer pipe 116a, 116b. The other of the copper plates 220a disposed in interfering relation with the inner pipe 117a, 117b each have a length extending between an interior surface portion of the outer pipe 116a, 116b and an exterior surface portion of the inner pipe 117a, 117b.

Since the plating liquid evenly flows through spaces defined between the respective copper plates 220a arranged in the aforesaid relation, the copper plates 220a are uniformly dissolved in the plating liquid. Therefore, the copper plates 220a are each kept conformable to an initial shape thereof and the total surface area thereof is kept virtually constant, until the copper plates are completely dissolved in the plating liquid. Thus, the copper plates 220a are capable of supplying copper ions to the plating liquid at a constant rate.

Spacers each having a small size such as not to hinder the flow of the plating liquid may be provided between the copper plates 220a to hold the copper plates 220a in the aforesaid spaced relation.

A cartridge 140 shown in FIG. 20(*b*) contains two copper plates 220b each configured in a meander shape by alternately folding a copper plate along a plurality of bent portions 220h. The copper plates 220b have substantially the same and uniform thickness, and are disposed along the flow path of the plating liquid (perpendicularly to a paper face of FIG. 20(*b*)). The bent portions 220h each have a ridge extending generally parallel to the flow path of the plating liquid.

The copper plates 220b each include parallel plate portions 220f having generally planar surfaces and generally equidistantly arranged with opposed surfaces thereof spaced a predetermined distance in addition to the bent portions 220h. The copper plates 220b are each bent in the vicinity of the interior surface of the outer pipe 116a, 116b, the exterior surface of the inner pipe 117a, 117b and the other copper plate 220b.

Since the copper plates 220b have the bent portions 220h, the copper plates 220b totally have a greater surface area in the copper dissolution tank 210a, 210b having a predetermined volume. This increases the copper ion supply capability. In this embodiment, the plating liquid evenly flows through spaces defined between the copper plates 220b, so that the copper plates 220b are uniformly dissolved in the plating liquid. Therefore, the copper plates 220b are each kept conformable to an initial shape thereof and the total surface area thereof is kept virtually constant, until the copper plates 220b are completely dissolved in the plating liquid. Thus, the copper plates 220b are capable of supplying copper ions to the plating liquid at a constant rate.

A cartridge 140 shown in FIG. 20(*c*) contains planar copper plates 220a as shown in FIG. 20(*a*), and corrugated copper plates 220d provided between the copper plates 220a and having a cross section as shown in FIG. 20(*c*). The copper plates 220d are each waved in a predetermined cycle, and ridges thereof extend parallel to the flow path of the plating liquid (perpendicularly to a paper face of FIG. 20(*c*)). The copper plates 220d are disposed across spaces each defined between two adjacent copper plates 220a. The copper plates 220a, 220d have substantially the same and uniform thickness. Since the corrugated copper plates 220d are disposed between the copper plates 220a, the copper plates 220a, 220d totally have a greater surface area in the copper dissolution tank 210a, 210b having a predetermined volume. This increases the copper ion supplying capability.

With the aforesaid arrangement, spaces defined between the copper plates 220a and the copper plates 220d have substantially the same shape and cross sectional area. In this embodiment, the plating liquid evenly flows through the spaces defined between the copper plates 220a and 220d, so that the copper plates 220a, 220d are uniformly dissolved in the plating liquid. Therefore, the copper plates 220a, 220d are each kept conformable to an initial shape thereof and the total surface area thereof is kept virtually constant, until the copper plates are completely dissolved in the plating liquid. Thus, the copper plates 220a, 220d are capable of supplying copper ions to the plating liquid at a constant rate.

A cartridge 140 shown in FIG. 20(*d*) contains a copper plate 220e configured spirally about the center axis of the cartridge 140. The copper plate 220e has a generally uniform thickness, and opposed surfaces thereof are spaced a predetermined distance. That is, the copper plate 220e is regarded as the continuation of parallel plate portions 220g which are each generally parallel to an inwardly or outwardly adjacent plate portion 220e. The innermost portion of the copper plate 220e is adjacent to the inner pipe 117a, 117b, and the outermost portion of the copper plate 220e is adjacent to the outer pipe 116a, 116.

In this embodiment, the plating liquid generally evenly flows through a space defined between opposed surfaces of the copper plate 220e, so that the copper plate 220e is generally uniformly dissolved in the plating liquid. Therefore, the copper plate 220e is kept conformable to an initial shape thereof and the total surface area thereof is kept virtually constant, until the copper plate 220e is completely dissolved in the plating liquid. Thus, the copper plate 220e is capable of supplying copper ions to the plating liquid at a constant rate.

While the present invention has been described in detail by way of the embodiments thereof, it should be understood that the foregoing disclosure is merely illustrative of the technical principles of the present invention but not limitative of the same. The spirit and scope of the present invention are to be limited only by the appended claims.

This application corresponds to Japanese Patent Applications No. 2002-208774 and No. 2002-374790 respectively filed with the Japanese Patent Office on Jul. 17, 2002 and Dec. 25, 2002, the disclosure of which is incorporated herein by reference.

What is claimed is:

1. A plating apparatus comprising:
    a plating section for performing a plating process with the use of a plating liquid for plating a substrate with copper, the plating section having an insoluble anode;
    a copper dissolution tank connected to the plating section for communication of the plating liquid with the plating section and accommodating therein a copper supply source;
    a circulation mechanism for circulating the plating liquid through the plating section and the copper dissolution tank;
    a replacement liquid supplying section for supplying a replacement liquid into the copper dissolution tank, for prevention of deterioration of a surface of the copper supply source; and
    a control section which performs a control operation to circulate the plating liquid through the plating section and the copper dissolution tank when the plating process is performed in the plating section and to stop the circulation of the plating liquid and replace the plating liquid in the copper dissolution tank with the replacement liquid supplied from the replacement liquid supplying section after completion of the plating process in the plating section;
    wherein the control section performs a control operation to replace the plating liquid in the copper dissolution tank with the replacement liquid so as to prevent the concentration of copper ions in the plating liquid from increasing.

2. A plating apparatus as set forth in claim 1, further comprising a deionized water supplying section for supplying deionized water into the copper dissolution tank, wherein the control section performs a control operation so as to replace the plating liquid in the copper dissolution tank with deionized water and then replace the deionized water with the replacement liquid after the completion of the plating process in the plating section.

3. A plating apparatus as set forth in claim 1, wherein the copper supply source comprises a plurality of mesh members each prepared by weaving a copper wire, the mesh members being stacked one on another along a flow path of the plating liquid in the copper dissolution tank.

4. A plating apparatus as set forth in claim 1, wherein the copper dissolution tank comprises a cartridge accommodating therein the copper supply source, and having a plating liquid inlet port for introducing the plating liquid and a plating liquid outlet port for discharging the plating liquid, the cartridge being detachable from the plating apparatus.

5. A plating apparatus as set forth in claim 1 comprising:
    wherein the copper supply source is generally uniformly dissolvable over the entire surface thereof at a constant dissolution rate in the plating liquid, and is configured so that the surface area thereof is changed by a percentage of not greater than 25% as observed from the start of the dissolution of the copper supply source in the plating liquid till the copper supply source is dissolved to have a shape which is no longer generally conformable to an initial shape thereof.

6. A plating apparatus as set forth in claim 1 comprising:
    wherein the copper supply source comprises a copper supply source pipe disposed generally parallel to a predetermined flow path in the copper dissolution tank and having a pipe interior wall surface and a pipe exterior wall surface generally parallel to the flow path.

7. A plating apparatus as set forth in claim 1 comprising:
    wherein the copper supply source comprises a copper supply source plate disposed generally parallel to a predetermined flow path in the copper dissolution tank and having a pair of surfaces generally parallel to the flow path.

8. A planting apparatus as set forth in claim 1, wherein the replacement liquid prevents contact between the supply source and the planting liquid for prevention of deterioration of a surface of the copper supply source.

9. A planting apparatus as set forth in claim 1 comprising:
    wherein the copper dissolution tank comprises a cartridge accommodating therein the copper supply source, and having a planting liquid inlet port for introducing the plating liquid, and a plating liquid outlet port for discharging the liquid, the cartridge being detachable from the planting apparatus, and
    wherein the cartridge includes an outer pipe comprising a side wall thereof, one end of the outer pipe being closed, and a connection member for connecting pipes to the plating liquid inlet port and plating liquid outlet port being connected to an end opposite from the one end of the outer pipe.

* * * * *